(12) United States Patent
Xu et al.

(10) Patent No.: US 12,713,775 B2
(45) Date of Patent: Aug. 18, 2026

(54) DISPLAY PANEL AND DISPLAY APPARATUS

(71) Applicants: Beijing BOE Technology Development Co., Ltd., Beijing (CN); BOE Technology Group Co., Ltd., Beijing (CN)

(72) Inventors: Cheng Xu, Beijing (CN); Pan Li, Beijing (CN); Hongli Wang, Beijing (CN)

(73) Assignees: Beijing BOE Technology Development Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 768 days.

(21) Appl. No.: 18/012,648

(22) PCT Filed: Nov. 15, 2022

(86) PCT No.: PCT/CN2022/132037

§ 371 (c)(1),
(2) Date: Dec. 22, 2022

(87) PCT Pub. No.: WO2024/060383

PCT Pub. Date: Mar. 28, 2024

(65) Prior Publication Data

US 2024/0251602 A1 Jul. 25, 2024

(30) Foreign Application Priority Data

Sep. 23, 2022 (CN) .......................... 202211161157.3

(51) Int. Cl.

| | |
|---|---|
| ***H10K 59/122*** | (2023.01) |
| ***G09G 3/3225*** | (2016.01) |
| ***H10K 59/80*** | (2023.01) |

(52) U.S. Cl.
CPC ......... *H10K 59/122* (2023.02); *G09G 3/3225* (2013.01); *H10K 59/873* (2023.02);
(Continued)

(58) Field of Classification Search
None
See application file for complete search history.

(56) References Cited

U.S. PATENT DOCUMENTS 11,233,217 B2 * 1/2022 Wang ................. H10K 59/8731
2013/0320388 A1 12/2013 Sekimoto
(Continued)

FOREIGN PATENT DOCUMENTS

CN 103583084 A 2/2014
CN 103592710 A 2/2014
(Continued)

OTHER PUBLICATIONS

Notice of Allowance dated Dec. 23, 2022 for Chinese Patent Application No. 202211161157.3 and English Translation.
(Continued)

*Primary Examiner* — Michelle Mandala

(57) ABSTRACT

A display panel and a display apparatus, including a light emitting structure layer (12), the light emitting structure layer (12) includes a pixel define layer (122). The pixel define layer (122) includes a first dam portion (201) and a second dam portion (202). The first dam portion (201) and the second dam portion (202) are formed a plurality of pixel openings, a distance between a surface of a side of the first dam portion (201) away from the base substrate (10) and a surface of a side of the planarization layer away from the base substrate (10) is smaller than a distance between a surface of a side of the second dam portion (202) away from the base substrate (10) and a surface of a side of the planarization layer away from the base substrate (10).

34 Claims, 28 Drawing Sheets

(52) U.S. Cl.
CPC ............... *G09G 2300/0819* (2013.01); *G09G 2300/0842* (2013.01)

(56) References Cited

U.S. PATENT DOCUMENTS

| | | | |
|---|---|---|---|
| 2015/0194629 A1 | 7/2015 | Liu et al. | |
| 2016/0329388 A1 | 11/2016 | Yokota et al. | |
| 2017/0133442 A1 | 5/2017 | Hosono et al. | |
| 2017/0162638 A1 | 6/2017 | Nendai et al. | |
| 2018/0012945 A1 | 1/2018 | Sakamoto | |
| 2018/0047792 A1 | 2/2018 | Yen et al. | |
| 2020/0058719 A1 | 2/2020 | Yeon et al. | |
| 2020/0119113 A1 | 4/2020 | Lee et al. | |
| 2020/0144350 A1 | 5/2020 | Han et al. | |
| 2020/0357868 A1 | 11/2020 | Cui | |
| 2021/0202609 A1 | 7/2021 | Park et al. | |
| 2021/0366888 A1 | 11/2021 | Kim et al. | |
| 2022/0140288 A1 | 5/2022 | Ji et al. | |
| 2023/0157079 A1 | 5/2023 | Du et al. | |
| 2023/0247866 A1 | 8/2023 | Zhao et al. | |
| 2025/0081732 A1* | 3/2025 | Xu | H10K 59/00 |
| 2025/0081762 A1* | 3/2025 | Shang | H10K 59/40 |

FOREIGN PATENT DOCUMENTS

| | | | |
|---|---|---|---|
| CN | 108598110 | A | 9/2018 |
| CN | 109103349 | A | 12/2018 |
| CN | 109873089 | A | 6/2019 |
| CN | 110137225 | A | 8/2019 |
| CN | 111653683 | A | 9/2020 |
| CN | 113130585 | A | 7/2021 |
| CN | 113284933 | A | 8/2021 |
| CN | 113363407 | A | 9/2021 |
| CN | 215578569 | U | 1/2022 |
| CN | 114038897 | A | 2/2022 |
| CN | 114613812 | A | 6/2022 |
| CN | 115036435 | A | 9/2022 |
| CN | 115268157 | A | 11/2022 |
| EP | 3016166 | A1 | 5/2016 |
| EP | 3806160 | A1 | 4/2021 |
| KR | 20180083020 | A | 7/2018 |
| WO | 2021235689 | A1 | 11/2021 |
| WO | 2022021020 | A1 | 2/2022 |
| WO | 2022267556 | A1 | 12/2022 |

OTHER PUBLICATIONS

Second Office Action dated Dec. 12, 2022 for Chinese Patent Application No. 202211161157.3 and English Translation.
First Office Action dated Nov. 9, 2022 for Chinese Patent Application No. 202211161157.3 and English Translation.
Office Action dated Feb. 21, 2024 for AU Patent Application No. 2022309241.
European Search Report for 22835199.5 Mailed Aug. 2, 2024.
Office Action dated Apr. 25, 2026 for CN 202310009168.8 and English Translation.
Office Action dated May 8, 2026 for IN 202317003807.
Request for the Submission of an Opinion mailed on Jun. 11, 2026 in corresponding Korean Patent Application No. 10-2023-7001425.

* cited by examiner

Z
X
203
K1
11
1011
10
111
121
123
124
122
13
14
15
16
12

ISL

DISPLAY PANEL AND DISPLAY APPARATUS

CROSS-REFERENCE TO RELATED APPLICATIONS

The present application is a U.S. National Phase Entry of International Application No. PCT/CN2022/132037 having an international filing date of Nov. 15, 2022, which claims priority of Chinese Patent Application No. 202211161157.3, filed to the CNIPA on Sep. 23, 2022 and entitled "Display Panel and Display Apparatus". The above-identified applications are hereby incorporated by reference.

TECHNICAL FIELD

Embodiments of the present disclosure relate to, but are not limited to, the field of display technologies, and particularly to a display panel and a display apparatus.

BACKGROUND

In preparation of an organic light emitting diode (OLED) display panel, compared with vacuum evaporation process, inkjet printing process has attracted more and more attention because of its simple process and low cost. In the ink-jet printing process, solvent is used to dissolve the organic materials of OLED and make ink, and the inks of different color sub-pixels are sprayed and printed on the corresponding positions of the base substrate. In some technologies, ink overflow is easy to occur in the process of inkjet printing, which will cause color mixing among different color sub-pixels and affect the display effect.

SUMMARY

The following is a summary of subject matter described herein in detail. The summary is not intended to limit the protection scope of claims.

An embodiment of the present disclosure provide a display panel, including a base substrate, and a driving structure layer, a light emitting structure layer and an encapsulation structure layer sequentially disposed on the base substrate. the light emitting structure layer includes a first electrode layer, a pixel define layer, a light emitting function layer and a second electrode layer, the first electrode layer includes a first electrode and the second electrode layer includes a second electrode; the display panel further includes a plurality of pixel units, each of the plurality of pixel units includes at least one sub-pixel, wherein the sub-pixel is configured with a pixel driving circuit, at least one data line, at least one power line and at least one control line, the pixel driving circuit is coupled with the first electrode and/or the second electrode; the pixel driving circuit includes at least one transistor, the transistor includes at least a channel area, a gate electrode, a source electrode, and a drain electrode, and the control line is configured to output a control signal to control the gate electrode to turn on and communicate with the source electrode and the drain electrode, or to control the gate electrode to turn off and disconnect the source electrode and the drain electrode;

the driving structure layer includes a planarization layer, the planarization layer is located at a side of the pixel driving circuit away from the base substrate, the planarization layer is provided with a first via hole, and the first electrode is connected with the pixel driving circuit through the first via hole;

the pixel define layer is located on a side of the planarization layer away from the base substrate; the pixel define layer includes at least a first dam portion and a second dam portion, the first dam portion extends along a first direction, the second dam portion extends in a second direction, the first direction intersects with the second direction, the first dam portion and the second dam portion form a plurality of pixel openings, an orthographic projection of the first dam portion on the base substrate including an orthographic projection of the first via hole of the planarization layer on the base substrate; or the orthographic projection of the first dam portion on the base substrate partially overlaps the orthographic projection of the first via hole on the base substrate;

a distance between a surface of a side of the first dam portion away from the base substrate and a surface of a side of the planarization layer away from the base substrate is smaller than a distance between a surface of a side of the second dam portion away from the base substrate and a surface of a side of the planarization layer away from the base substrate;

the second dam portion include a first surface of a side away from the base substrate and a second surface of a side close to the base substrate, the first dam portion includes a third surface of a side away from the base substrate and a fourth surface of a side close to the base substrate, and a distance between the first surface and the second surface is greater than a distance between the third surface and the fourth surface.

Optionally, the second dam portion includes a first side surface facing the pixel opening, the first side surface of the second dam portion includes a first functional area and a second functional area sequentially disposed in a direction away from the base substrate, and the second functional area includes a first sub-area and a second sub-area in a direction away from the base substrate; the first sub-area is connected with the first functional area and the second sub-area, and at least one cross section in a direction perpendicular to the base substrate exists, so that the first functional area, the first sub-area and the second sub-area are all inclined surfaces; a slope angle of the first sub-area is greater than a slope angle of the second sub-area; a slope angle of the second sub-area is greater than a slope angle of the first functional area.

Optionally, the slope angle of the first sub-area is between 50° and 60°;

Optionally, the slope angle of the second sub-area is between 30° and 40°;

Optionally, the slope angle of the first functional area is between 10° and 20°.

Optionally, an intersection line of the first sub-area and the second sub-area is a first intersection line, and an intersection line of the first sub-area and the first functional area is a second intersection line; an intersecting line between the second sub-area and the first surface of the second dam portion is a third intersecting line, and an intersecting line between the first functional region and a surface of the first electrode facing away from the base substrate is a fourth intersecting line; an intersection point of the first intersection line and an reference surface is a first intersection point, an intersection point of the second intersection line and the reference surface is a second intersection point, an intersection point of the third intersecting line and the reference surface is a third intersection point, an intersection point of the fourth intersecting line and the reference surface is a fourth intersection point, and the reference surface is a cross section parallel to the first direction and perpendicular to the base substrate; in the reference surface, a straight line passing through the second intersection point and the third intersection point is a first reference line, a straight line passing through the second intersection point and parallel to the base substrate is a second reference line, and an acute angle between the first reference line and the second reference line is between 38° and 42°.

Optionally, a distance d from the first intersection point to the first reference line satisfies: $0<d\leq D<AB/S$, $0<D<\Delta/2-HL/S$; wherein D is a real number greater than 0, and A is the length of a line segment between the first intersection point and the third intersection point; B is the length of the line segment between the first intersection point and the second intersection point; S is the length of the line segment between the second intersection point and the third intersection point; H is the length of a line segment between the third intersection point and a reference point, wherein the reference point is an intersection point between the second reference line and an third reference line, and the third reference line is a straight line passing through the third intersection point and perpendicular to the base substrate; L is a length of a line segment between the second intersection point and the reference point; Δ is a width of the first side surface of the second dam portion in the first direction.

Optionally, in the reference surface, a distance between the first intersection point and a surface of the first electrode facing away the base substrate is h1, a distance between the third intersection point and a surface of the first electrode facing away the base substrate is h3; a ratio of h1 to h3 is between 0.494 and 0.742.

Optionally, the ratio of h1 to h3 is 0.618.

Optionally, the display panel further includes a color filter layer disposed on a side of the encapsulation structure layer away from the base substrate, wherein the color filter layer includes a plurality of filter units for transparently transmitting light of set colors, and at least two adjacent filter units for transparently transmitting light of different colors overlap each other.

Optionally, the display panel further includes a color resistance layer disposed on a side of the encapsulation structure layer away from the base substrate; the color resistance layer includes a plurality of first color resistance parts extending along the first direction, the plurality of the first color resistance parts are sequentially arranged in the second direction, the color resistance layer also includes a plurality of groups of second color resistance parts, each group of the second color resistance parts includes a plurality of the second color resistance parts which are located between two adjacent first color resistance parts respectively and are disposed at intervals along the first direction, and each of the second color resistance parts extends along the second direction.

Optionally, the second color resistance part is formed by an overlapping part of two adjacent filter units for transparently transmitting light of different colors in the first direction; or a material of the second color resistance part includes at least one of the following: metallic chrome, chrome oxide or black resin.

Optionally, a slope angle β of the first sub-area and a slope angle α of the second sub-area satisfy the following relationship: $\beta<\arctan(n^*\times HW/(LBM-L3))$; $\alpha<\arctan(n^*\times HW/LBM)$; where $n^*$ is a film equivalent refractive index, $1<n^*<2$; HW is a distance between the light emitting function layer of the first functional area and the second color resistance portion in the direction perpendicular to the base substrate; LBM is a width of the second color resistance portion in the first direction; L3 is a width of the light emitting function layer of the first functional area in the first direction.

Optionally, the orthographic projection of the first color resistance portion on the base substrate includes an orthographic projection of a first via hole of a planarization layer on the base substrate; or the orthographic projection of the first color resistance portion on the base substrate partially overlap the orthographic projection of the first via hole on the base substrate.

Optionally, the first electrode layer includes a first sub-region and a second sub-region, the second sub-region has at least a part of the first electrode, and an average thickness of the at least the part of the first electrodes in a direction perpendicular to the base substrate is greater than an average thickness of the first electrode of the first sub-region in the direction perpendicular to the base substrate.

Optionally, the second sub-region is located on a circumferential sidewall of the first via hole and covers a surface of the circumferential sidewall of the first via hole close to one end of the base substrate.

Optionally, the second sub-region has an annular structure, and a ratio of a width of an orthographic projection of the first electrode of the second sub-region on the base substrate in the first direction to a width of an orthographic projection of the first electrode on the base substrate in the first direction is between ¼ and ½.

Optionally, a width of an orthographic projection of the first electrode of the second sub-region on the base substrate in the first direction is between 1 μm and 2 μm.

Optionally, an orthographic projection of the second dam portion on the base substrate dose not overlap an orthographic projection of the first via hole on the base substrate.

Optionally, the material of the first dam portion includes at least one of silicon nitride, silicon oxide and silicon oxynitride, the material of the second dam portion includes at least one of silicon nitride, silicon oxide and silicon oxynitride, the material of the first dam portion further includes a lyophilic material, and the material of the second dam portion further includes a lyophobic material.

Optionally, the second dam portion includes a first side surface facing the pixel opening, the first side surface of the second dam portion includes a first functional area and a second functional area sequentially disposed in a direction away from the base substrate, and the second functional area includes a first sub-area and a second sub-area in a direction away from the base substrate; the first sub-area is connected with the first functional area and the second sub-area, and at least one cross section in a direction perpendicular to the base substrate exists, so that shapes of the first functional area, the first sub-area and the second sub-area are all continuous curved surfaces.

Optionally, in at least one cross section perpendicular to the direction of the base substrate, the first functional area forms a concave surface toward a direction close to the base substrate, the first sub-area forms a concave surface toward a direction close to the base substrate, and the second sub-area forms a convex surface in a direction away from the base substrate.

Optionally, an intersection line of the first sub-area and the second sub-area is a first intersection line, and an intersection line of the first sub-area and the first functional area is a second intersection line; an intersecting line between the second sub-area and the first surface of the second dam portion is a third intersecting line, and an intersecting line between the first functional region and a surface of the first electrode facing away from the base substrate is a fourth intersecting line; an intersection point of the first intersection line and an reference surface is a first intersection point, an intersection point of the second intersection line and the reference surface is a second intersection point, an intersection point of the third intersecting line and the reference surface is a third intersection point, an intersection point of the fourth intersecting line and the reference surface is a fourth intersection point, and the reference surface is a cross section parallel to the first direction and perpendicular to the base substrate; in the reference surface, an intersection line between the first functional area and the reference surface is a curve connecting line between the second intersection point and the fourth intersection point; an intersection line between the first sub-area and the reference surface is a first arc line connecting the first intersection point and the second intersection point, an intersection line between the second sub-area and the reference surface is a second arc connecting the first intersection point and the third intersection point, and a curve line formed by the first arc line and the second arc line is an S-shaped curve line.

Optionally, a straight line passing through the second intersection point and the third intersection point is a first reference line, a radius of curvature of the first sub-area is equal to a radius of curvature of the second sub-area, and the first intersection point is located on the first reference line.

Optionally, a straight line passing through the second intersection point and the third intersection point is a first reference line, a radius of curvature of the first sub-area is smaller than a radius of curvature of the second sub-area, and the first intersection point is located on a side of the first reference line away from the base substrate.

Optionally, a straight line passing through the second intersection point and the third intersection point is a first reference line, a radius of curvature of the first sub-area is greater than a radius of curvature of the second sub-area, and the first intersection point is located on a side of the first reference line close to the base substrate.

Optionally, the radius of curvature Rb of the first sub-area and the radius of curvature Ra of the second sub-area satisfy: $0 \le |1/Ra - 1/Rb|/|\cos\alpha - \cos\beta| < G/\sigma$; wherein $\beta$ is a gradient angle of the first sub-area, $\alpha$ is a gradient angle of the second sub-area, and G is a gravity constant of material; $\sigma$ is a surface tension constant of ink of the light emitting structure layer.

Optionally, at least a part of an intersection line of the second functional area and the reference surface satisfies the following relationship:

$$Z = (Z2 - Z1) \times \arctan(X - X0)/a \times \prod + (Z2 + Z1)/2;$$

wherein (X, Z) is a coordinate of at least a part of points on an intersection line of the second functional area and the reference surface; a is the design parameter; Π is pi; Z1 is a thickness of the first functional area in a direction perpendicular to the base substrate; Z2 is a height of the first side surface of the second dam portion in a direction perpendicular to the base substrate; X0 is a distance between a center of the second functional area and a coordinate origin, and the coordinate origin is an orthographic projection of a geometric center of a surface of the first electrode exposed by the pixel opening on the reference surface.

Optionally, at least a part of an intersection line of the first functional area and the reference surface satisfies the following relationship:

$$Z = (1/a)\hat{}(X \pm X0 + L/2) + Z1 - 1;$$

wherein (X, Z) is a coordinate of at least a part of points on an intersection line of the first functional area and the reference surface; a is the design parameter; Π is pi; Z1 is a thickness of the first functional area in a direction perpendicular to the base substrate; L is a width of the second functional area in the first direction; X0 is a distance between a center of the second functional area and a coordinate origin, and the coordinate origin is an orthographic projection of a geometric center of a surface of the first electrode exposed by the pixel opening on the reference surface.

Optionally, the display panel further includes a dimming layer disposed on a surface of a side of the encapsulation structure layer facing away from the base substrate, and a color filter layer and a color resistance layer disposed on a surface of a side of the dimming layer facing away from the base substrate; a surface of a side of the encapsulation structure layer facing away from the base substrate is provided with a flat portion and a curved portion, the curved portion includes at least a partial region protruding in a direction away from the base substrate.

Optionally, the color resistance layer includes a plurality of first color resistance portions extending along the first direction, the plurality of the first color resistance portions are sequentially arranged in the second direction, the color resistance layer also includes a plurality of groups of second color resistance portions, each group of the second color resistance portions includes a plurality of the second color resistance portions which are located between two adjacent first color resistance portions respectively and are disposed at intervals along the first direction, and each of the second color resistance portions extends along the second direction; there is an overlapping portion between an orthographic projection of the curved portion on the base substrate and an orthographic projection of the second color resistance portion on the base substrate; the second dam portion includes a first side surface facing the pixel opening, the first side surface of the second dam portion includes a first functional area and a second functional area sequentially disposed in a direction away from the base substrate, and there is an overlapping portion between an orthographic projection of the curved portion on the base substrate and an orthographic projection of the first functional area on the base substrate.

Optionally, a cross section of a partial region of the curved portion protruding toward a direction away from the base substrate taken by a plane parallel to the first direction and perpendicular to the base substrate is at least one of the following:

being a partial region of a first ellipse, wherein a length of a short half axis of the first ellipse is a1, a length of a long half axis is b1, a1=H1/2, b1=L4/2;

being a partial region of a second ellipse, wherein a length of a short half axis of the second ellipse is a2, a length of a long half axis of the second ellipse is b2, a2≥H2/2, b2=L4/2;

locating between a surface of a side of the first ellipse away from the base substrate and a surface of a side of the second ellipse away from the base substrate; wherein H1 is a thickness of the encapsulation structure layer at the flat portion; H2 is a maximum thickness of the encapsulation structure layer in a direction perpendicular to the base substrate; L4 is a width of the curved portion in the first direction.

Optionally, in a cross section parallel to the first direction and perpendicular to the base substrate, an area S of a cross section of the curved portion includes an area S0 of a partial region protruding toward a direction away from the base substrate and an area S1 of a partial region not protruding toward an direction away from the base substrate, a cross section area S of the curved portion and an area S0 of a partial region of the curved portion protruding toward a direction away from the base substrate meet the following requirements: $S=S0+S1$, $\pi a1b1<S<\pi a2b2$, $\pi a1b1+S0<\pi a2b2$.

Optionally, the curved portion includes a first curved portion, a transition portion and a second curved portion connected in sequence in the first direction, the first curved portion and the second curved portion each includes at least a partial region protruding from the transition portion in a direction perpendicular to the base substrate, a surface of a side of the curved portion away from the base substrate is located between a surface of a side of the first ellipse away from the base substrate and a surface of a side of the second ellipse away from the base substrate.

Optionally, the curved portion includes a first ramp portion, a first curved portion, a transition portion, a second curved portion and a second ramp portion connected in sequence in the first direction, and the first curved portion and the second curved portion each protrude from the transition portion in a direction perpendicular to the base substrate.

Optionally, there is an overlapping portion between an orthographic projection of the transition portion on the base substrate and an orthographic projection of the second color resistance portion on the base substrate.

Optionally, a refractive index of the color filter layer is greater than a refractive index of the dimming layer.

Optionally, a refractive index of the encapsulation structure layer is greater than a refractive index of the dimming layer, and a refractive index of the second color resistance portion is greater than a refractive index of the dimming layer.

Optionally, an area of a surface of the dimming layer in contact with the encapsulation structure layer is greater than an area of a surface of the dimming layer in contact with the color filter layer and the color resistance layer.

Optionally, the color filter layer includes a plurality of filter units with different colors, the second color resistance portion is formed at an overlapping part of filter units of two adjacent sub-pixels of different colors in the first direction, and a slope angle of an interface of filter units of two adjacent sub-pixels of different colors in the first direction gradually becomes larger in a direction away from the base substrate.

Optionally, the slope angle of the interface of the filter units of two sub-pixels of different colors adjacent in the first direction is between 10° and 75°.

Optionally, the interface of the filter units of two sub-pixels of different colors adjacent in the first direction includes a first interface and a second interface connected in sequence in a direction away from the base substrate, a slope angle of the first interface is between 28° and 32°, a slope angle of the second interface is between 55° and 65°, and the first interface and the second interface are curved surfaces or inclined surfaces.

Optionally, a material of the encapsulation structure layer includes a nitrogen element and a silicon element.

Optionally, a material of the dimming layer includes a carbon element, an oxygen element, and a silicon element.

Optionally, a material of the color filter layer includes a carbon element and an aluminum element.

Optionally, the dimming layer has adhesiveness.

Optionally, a material of the planarization layer includes a carbon element, a fluorine element, an oxygen element, and a nitrogen element.

Optionally, the first electrode layer has a multilayer structure, the first electrode layer includes a first sub-first electrode layer and a second sub-first electrode layer disposed on a side of the first sub-first electrode layer away from the base substrate, wherein material of the first sub-first electrode layer includes an aluminum element, and the material of the second sub-first electrode layer includes a ytterbium element, a silicon element and an oxygen element.

Optionally, an average thickness of the first sub-first electrode layer is greater than an average thickness of the second sub-first electrode layer.

Optionally, at least one of the pixel units includes a first sub-pixel emitting a first color light, a second sub-pixel emitting a second color light, and a third sub-pixel emitting a third color light; a thickness of the light emitting function layer of the first sub-pixel emitting the first color light is greater than a thickness of the light emitting function layer of the second sub-pixel emitting the second color light, and the thickness of the light emitting function layer of the second sub-pixel emitting the second color light is greater than a thickness of the light emitting function layer of the third sub-pixel emitting the third color light.

Optionally, the second electrode layer has a multilayer structure, the second electrode layer includes a first sub-second electrode layer and a second sub-second electrode layer disposed at a side of the first sub-second electrode layer away from the base substrate, wherein a material of the first sub-second electrode layer includes an indium element, a zinc element and oxygen element, and the material of the second sub-second electrode layer includes silver elements.

Optionally, an average thickness of the first sub-second electrode layer is greater than an average thickness of the second sub-second electrode layer.

Optionally, the pixel driving circuit includes a first transistor, a second transistor, a third transistor, a fourth transistor, and a storage capacitor, and the sub-pixel includes a first gate line, a second gate line, and a third gate line, wherein: the gate electrode of the first transistor is connected with the first gate line, a first electrode of the first transistor is connected with a data line, a second electrode of the first transistor is connected with a second electrode of the second transistor, a gate electrode of the third transistor and a first electrode plate of the storage capacitor, a gate electrode of the second transistor is connected with the second gate line, a first electrode of the second transistor is connected with a second initialization signal line, a second electrode of the third transistor is connected with a first power line, a second electrode plate of the storage capacitor is connected to a first electrode of the third transistor and a second electrode of the fourth transistor, a gate electrode of the fourth transistor is connected to a third gate line, a first electrode of the fourth transistor is connected to a first initialization signal line, and the second electrode is connected to a second power line; an orthographic projection of the second electrode plate of the storage capacitor on the base substrate partially covers an orthographic projection of the first via hole on the base substrate, and the second electrode plate of the storage capacitor is connected to the first electrode through the first via hole.

Optionally, the first transistor, the second transistor, the third transistor and the fourth transistor are all N-type transistors.

Optionally, at least one transistor among the first transistor, the second transistor, the third transistor, and the fourth transistor is a P-type transistor.

Optionally, the driving structure layer includes an active semiconductor layer, a gate insulating layer located on a side of the active semiconductor layer away from the base substrate, a first conductive pattern layer located on a side of the gate insulating layer away from the base substrate, an interlayer insulating layer located on a side of the first conductive pattern layer away from the base substrate, a second conductive pattern layer located on a side of the interlayer insulating layer away from the base substrate, an insulating layer located on a side of the second conductive pattern layer away from the base substrate, the first electrode is located on a side of the insulating layer away from the base substrate.

Optionally, the first conductive pattern layer includes a first electrode plate of the storage capacitor and a plurality of connection electrodes, the plurality of connection electrodes includes a first connection electrode, a third connection electrode, and a fourth connection electrode; the second conductive pattern layer includes a second electrode plate of the storage capacitor, the first gate line, the second gate line, and the third gate line.

Optionally, the first connection electrode is connected to the third gate line through a via hole, and the first connection electrode serves as a gate electrode of the fourth transistor; the third connection electrode is connected to the first gate line through a via hole, and the third connection electrode serves as a gate electrode of the first transistor; the fourth connection electrode is connected to the second gate line through a via hole, and the fourth connection electrode serves as a gate electrode of the second transistor.

Optionally, the first power line includes a first power supply signal line extending along the first direction and a first power supply connection line extending along the second direction, the first power supply signal line and the first power supply connection line are connected.

Optionally, the first power supply connection line includes a first part, a second part and a third part connected in sequence, the first power supply signal line and the second part of the first power supply connection line are located in the second conductive pattern layer, and the first part and the third part of the first power supply connection line are located in the first conductive pattern layer.

Optionally, the first power supply signal line and a second part of the first power supply connection line are directly connected, the first part and second part of the first power supply connection line are connected through a via hole, and the second part and third part of the first power supply connection line are connected through a via hole.

Optionally, the first initial signal line includes a first sub-initial signal line extending along the first direction and a first initialization connection line extending along the second direction, the first sub-initial signal line and the first initialization connection line are connected.

Optionally, the first initialization connection line includes a first part, a second part and a third part connected in sequence, The first sub-initial signal line and a second part of the first initialization connection line are located in the second conductive pattern layer, and the first and third parts of the first initialization connection line are located in the first conductive pattern layer.

Optionally, the first sub-initial signal line and the first part of the first initialization connection line are connected through a via hole, the first part and the second part of the first initialization connection line are connected through a via hole, and the second part and the third part of the first initialization connection line are connected through a via hole.

Optionally, the second initial signal line includes a second sub-initial signal line extending along the first direction and a second initialization connection line extending along the second direction, the second sub-initial signal line and the second initialization connection line are connected.

Optionally, the second initialization connection line includes a first part, a second part and a third part connected in sequence, the second sub-initial signal line and a second part of the second initialization connection line are located in the second conductive pattern layer, and the first and third parts of the second initialization connection line are located in the first conductive pattern layer.

Optionally, the second sub-initial signal line and a third part of the second initialization connection line are connected through a via hole, the first part and the second part of the second initialization connection line are connected through a via hole, and the second part and the third part of the second initialization connection line are connected through a via hole.

Optionally, the storage capacitor is a parallel capacitor, the storage capacitor includes the first electrode plate, the second electrode plate and a third electrode plate, the second electrode plate and the third electrode plate are respectively located at two sides of the first electrode plate in the direction perpendicular to the base substrate, and the second electrode plate and the third electrode plate are connected through a via hole.

Optionally, there is an overlapping portion between orthographic projections of the second electrode plate and the first electrode plate on the base substrate, and there is an overlapping portion between orthographic projections of the third electrode plate and the first electrode plate on the base substrate.

Optionally, the pixel driving circuit includes a first transistor, a second transistor, a third transistor, a fourth transistor, a fifth transistor, a storage capacitor, and a light emitting device, and the sub-pixel includes a first gate line, a second gate line, and a third gate line, wherein: the gate electrode of the first transistor is connected with the first gate line, the first electrode of the first transistor is connected with the data line, the second electrode of the first transistor is connected with the second electrode of the second transistor, the gate electrode of the third transistor, the gate electrode of the fifth transistor and the first electrode plate of the storage capacitor, the gate electrode of the second transistor is connected with the second gate line, the first electrode of the second transistor is connected with an initialization signal line, the gate electrode of the fourth transistor is connected with the light emitting signal line, the first electrode of the fourth transistor is connected with the first power line, a second electrode of the fourth transistor is connected to a first electrode of the third transistor, a second electrode of the third transistor is connected to a first electrode of the fifth transistor, a second electrode of the fifth transistor is connected to a second electrode plate of the storage capacitor and a first electrode of the light emitting device, and the second electrode of the light emitting device is connected to a second power line.

Optionally, the first transistor, the second transistor, the third transistor and the fifth transistor are all N-type transistors, and the fourth transistor is a P-type transistor or an N-type transistor.

An embodiment of the present disclosure further provides a display apparatus, which includes the display panel of any one of the aforementioned embodiments.

Other aspects may be understood upon reading and understanding the drawings and the detailed description.

BRIEF DESCRIPTION OF DRAWINGS

The drawings are intended to provide a further understanding of technical solutions of the present disclosure and form a part of the specification, and are used to explain the technical solutions of the present disclosure together with embodiments of the present disclosure, and not intended to form limitations on the technical solutions of the present disclosure. Shapes and sizes of various components in the drawings do not reflect actual scales, and are only intended to schematically illustrate the contents of the present disclosure.

FIGS. 13A to 13G are each a schematic diagram of a plan of a single layer of the display panel in FIG. 11;

DETAILED DESCRIPTION

Figures 1, 2A:
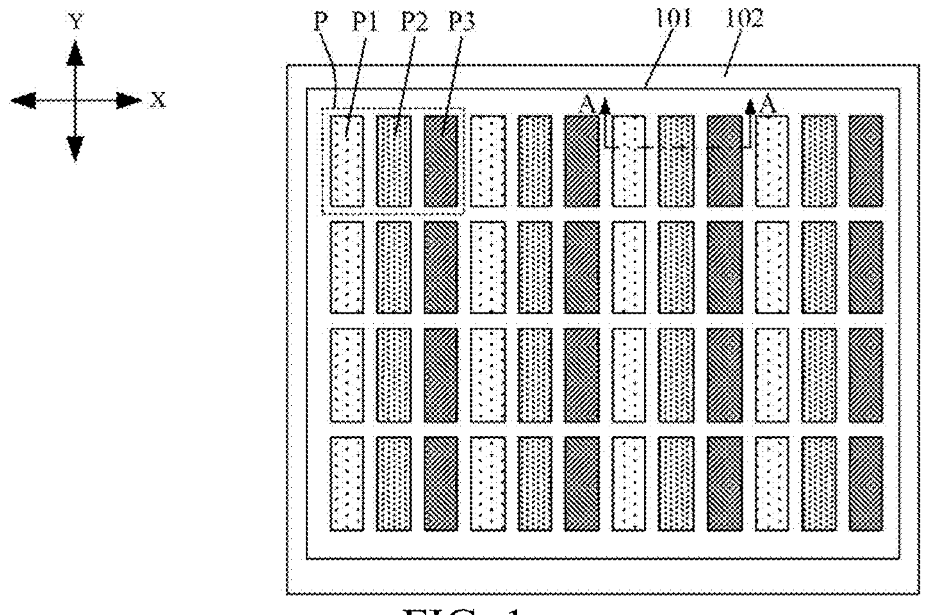
FIG. 1 is a structure schematic diagram of a pixel arrangement of a display panel according to some exemplary embodiments.
FIG. 2A is a structure schematic diagram of a sectional view of an A-A region in FIG. 1.

To make objectives, technical solutions, and advantages of the present disclosure clearer, the embodiments of the present disclosure will be described in detail with reference to the accompanying drawings. It is to be noted that implementation modes may be implemented in multiple different forms. Those of ordinary skills in the art may easily understand such a fact that implementations and contents may be transformed into various forms without departing from the purpose and scope of the present disclosure. Therefore, the present disclosure should not be explained as being limited to contents described in following implementation modes only. The embodiments in the present disclosure and features in the embodiments may be combined randomly with each other if there is no conflict. In order to keep following description of the embodiments of the present disclosure clear and concise, detailed descriptions about part of known functions and known components are omitted in the present disclosure. The drawings of the embodiments of the present disclosure only involve structures involved in the embodiments of the present disclosure, and other structures may refer to conventional designs.

In the drawings, a size of each constituent element, a thickness of a layer, or a region is exaggerated sometimes for clarity. Therefore, one implementation mode of the present disclosure is not necessarily limited to the sizes, and shapes and sizes of various components in the drawings do not reflect actual scales. In addition, the drawings schematically illustrate ideal examples, and one implementation of the present disclosure is not limited to the shapes, numerical values, or the like shown in the drawings.

Ordinal numerals such as "first", "second", and "third" in the specification are set to avoid confusion of constituent elements, but not to set a limit in quantity.

In the specification, for convenience, wordings indicating orientation or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The positional relationships between the constituent elements may be changed as appropriate according to directions for describing the various constituent elements. Therefore, appropriate replacements may be made according to situations without being limited to the wordings described in the specification.

In the specification, unless otherwise specified and defined explicitly, terms "mount", "mutually connect", and "connect" should be understood in a broad sense. For example, a connection may be a fixed connection, or a detachable connection, or an integrated connection. It may be a mechanical connection or an electrical connection. It may be a direct mutual connection, or an indirect connection through middleware, or internal communication between two components. Those of ordinary skill in the art may understand specific meanings of these terms in the present disclosure according to specific situations.

In the specification, a transistor refers to a component which includes at least three terminals, i.e., a gate electrode, a drain electrode and a source electrode. The transistor has a channel area between the drain electrode (drain electrode terminal, drain region, or drain) and the source electrode (source electrode terminal, source region, or source), and a current may flow through the drain electrode, the channel area, and the source electrode. It is to be noted that, in the specification, the channel area refers to a region through which the current mainly flows.

In the specification, a first electrode may be a drain electrode, and a second electrode may be a source electrode. Or, the first electrode may be the source electrode, and the second electrode may be the drain electrode. In cases that transistors with opposite polarities are used, a current direction changes during operation of a circuit, or the like, functions of the "source electrode" and the "drain electrode" are sometimes interchangeable. Therefore, the "source electrode" and the "drain electrode" are interchangeable in the specification.

In the specification, "electrical connection" includes a case that constituent elements are connected together through an element with a certain electrical effect. The "element with the certain electrical effect" is not particularly limited as long as electrical signals may be sent and received between the connected constituent elements. Examples of the "element with the certain electrical effect" not only include electrodes and wirings, but also include switch elements such as transistors, resistors, inductors, capacitors, other elements with various functions, etc.

In the specification, "parallel" refers to a state in which an angle formed by two straight lines is above −10° and below 10°, and thus also includes a state in which the angle is above −5° and below 5°. In addition, "perpendicular" refers to a state in which an angle formed by two straight lines is above 80° and below 100°, and thus also includes a state in which the angle is above 85° and below 95°.

In the specification, a "film" and a "layer" are interchangeable. For example, a "conductive layer" may be replaced with a "conductive film" sometimes. Similarly, an "insulating film" may be replaced with an "insulation layer" sometimes.

"A and B are disposed in a same layer" mentioned in this description, means that A and B are simultaneously formed through a same patterning process. The "An orthographic projection of A including an orthographic projection of B" means that a boundary of the orthographic projection of B falls within a range of boundary of the orthographic projection of A, or the boundary of the orthographic projection of A overlaps with the boundary of the orthographic projection of B.

In the present disclosure, "about" refers to that a boundary is defined not so strictly and numerical values within process and measurement error ranges are allowed.

In the usual Organic light-emitting Diode (OLED) display, the organic light-emitting layer needs evaporation process to manufacture, which requires harsh process conditions and is difficult to achieve large area.

Ink-jet printing is the best way to achieve low-cost OLED production and enable OLED to participate in mid-to-high end market competition. Ink-jet printing is an efficient process. Compared with evaporation, ink-jet printing has less material waste and is very fast.

When using ink-jet printing to form a light-emitting functional layer of an organic light-emitting diode, mainly an organic material is dissolved with a solvent to form a solution (ink), and then the solution (ink) is directly jet-printed on the surface of a base substrate to form a light-emitting functional layer of sub-pixels such as red (R), green (G), blue (B), etc. Compared with evaporation technology, inkjet printing OLED technology has obvious advantages in manufacturing process, yield and cost. For example, the light emitting function layer may include an organic light emitting layer (light emitting material layer), and the light emitting function layer may further include at least one of a hole injection layer, a hole transport layer, an electron transport layer, an electron injection layer, and the like, which can be selected in the light emitting function layer according to needs. At least one film layer of the light emitting function layer can be fabricated by an ink jet printing process.

However, in the process of inkjet printing, ink overflow is easy to occur, which will cause color mixing among different color sub-pixels and affect the display effect.

FIG. 1 is a schematic diagram of a pixel arrangement structure of a display panel according to an embodiment of the present disclosure. In some exemplary embodiments, as shown in FIG. 1, the display panel includes a display area 101 and a non-display area 102 located around the display area 101. The display area 101 includes a plurality of pixel units P arranged in an array on the base substrate, and each pixel unit P includes a plurality of sub-pixels. Exemplary, each pixel unit P may include three sub-pixels arranged side by side in a first direction X (which may be referred to as a row direction), respectively a first sub-pixel P1 emitting a first color light (e.g. red light), a second sub-pixel P2 emitting a second color light (e.g. green light), and a third sub-pixel P3 emitting a third color light (e.g. blue light). A plurality of pixel units P are sequentially arranged in the first direction X, and a plurality of sub-pixels located in the same column in the second direction Y (which may be referred to as the column direction) can emit light of the same color. The first direction X intersects the second direction Y, for example, the first direction X and the second direction Y may be perpendicular to each other. A plurality of sub-pixels emitting light of the same color can be called sub-pixels of the same color. In other embodiments each pixel unit P may include sub-pixels that emit light of other colors. Embodiments of the present disclosure do not limit the arrangement of pixels of the display panel and the types and numbers of sub-pixels contained in each pixel unit.

FIG. 2A is a structure schematic diagram of a sectional view of an A-A region in FIG. 1. In some exemplary embodiments, as shown in FIG. 2A, the display panel includes a driving structure layer 11, a light emitting structure layer 12 and an encapsulation structure layer 13 sequentially stacked on the base substrate.

The driving structure layer 11 may include a pixel driving circuit 1011 (a transistor and a capacitor are schematically shown in the figure) disposed on a base substrate 10 and a planarization layer 111 provided on a side of the pixel drive circuit 1011 away from the base substrate 10. The planarization layer 111 is provided with a first via hole K1, and the first via hole K1 is arranged so that the first electrode 121 formed subsequently is connected to the pixel driving circuit 1011 through the first via hole K1. The pixel driving circuit 1011 may include a plurality of thin film transistors (T) and a storage capacitor (C), and may have a configuration of 3T1C, 4T1C, 5T1C, 5T2C, 6T1C, 7T1C, etc. The embodiment of the present disclosure is not limited thereto. The driving structure layer 11 also includes a plurality of data lines and a plurality of gate lines, as well as other signal lines.

The light emitting structure layer 12 may include a first electrode layer, a pixel define layer 122, a light emitting function layer 123 and a second electrode layer. The first electrode layer may include a plurality of first electrodes 121 provided on the driving structure layer 11, the first electrode 121 is connected to the pixel driving circuit 1011 through a first via hole K1 provided in the planarization layer 111, and the second electrode layer includes a second electrode 124. Exemplary, the pixel driving circuit 1011 may include a connection electrode configured to be connected to a first electrode 121, the first via hole K1 provided in the planarization layer 111 exposes the connection electrode, and the first electrode 121 is provided on a surface of the planarization layer 111 away from the base substrate 10 and connected to the connection electrode through the first via hole K1. The first electrode 121 is partially formed on a circumferential sidewall of the first via hole K1, and a part of the first electrode 121 located on the circumferential sidewall of the first via hole K1 may be thickened at an end of the first via hole close to the base substrate 10.

The pixel define layer 122 is provided on a side of the plurality of first electrodes 121 away from the base substrate 10 and is provided with a plurality of pixel openings 203, each of pixel openings 203 exposes a surface of a corresponding first electrode 121 away from the base substrate 10. The light emitting function layer 123 may be disposed within the pixel opening 203, the light emitting function layer 123 may include an organic light emitting layer (i.e., a light emitting material layer), and the light emitting function layer 123 may include any one or more film layers of a hole injection layer, a hole transport layer, an electron transport layer, and an electron injection layer. At least one film layer (e.g. a hole injection layer, a hole transport layer and an organic light emitting layer) of the light emitting function layer 123 may be fabricated using an ink jet printing process. The second electrode layer 124 is provided on a side of the light emitting function layer 123 away from the base substrate 10. The first electrode 121, the light emitting function layer 123 and the second electrode layer 124 are stacked sequentially to form a light emitting device, and the light emitting device may be an OLED device. Each sub-pixel includes a light emitting device and a pixel driving circuit 1011 connected to the light emitting device and the light emitting device emits light under the drive of the pixel driving circuit 1011. In some exemplary embodiments, the first electrode 121 may be an anode of the light emitting device and the second electrode 124 may be a cathode of the light emitting device. The light emitting device may be a top emitting device.

The encapsulation structure layer 13 may include a plurality of layers of inorganic material stacked, or may include a first inorganic material layer, an organic material layer, and a second inorganic material layer stacked sequentially in a direction away from the base substrate 10. The materials of the first inorganic material layer and the second inorganic material layer may include any one or more of silicon nitride, silicon oxide, and silicon oxynitride. The material of the organic material layer may be resin.

Figure 2B:
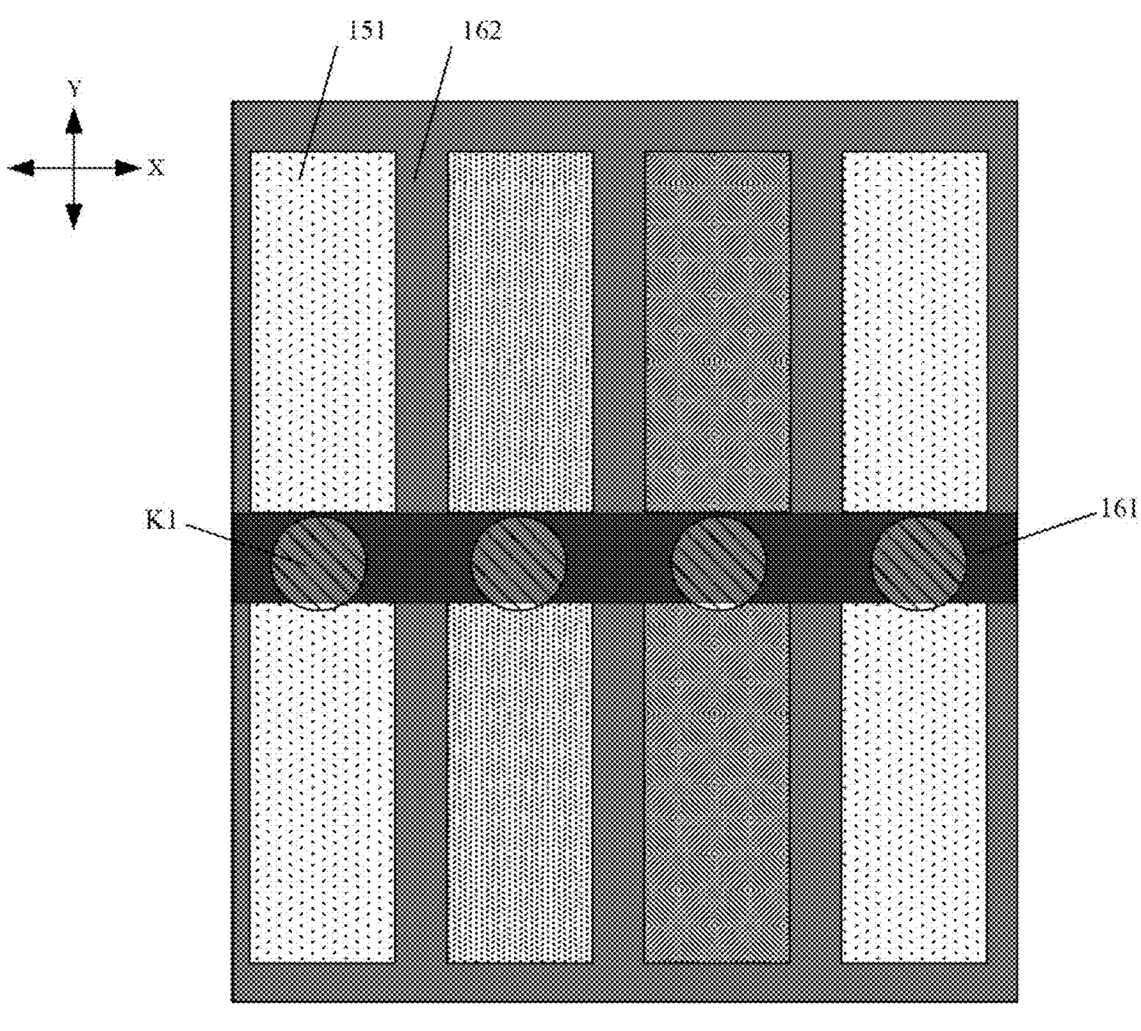
FIG. 2B is a structure schematic diagram of a plan view of a color filter layer and a color resistance layer of a display area of a display panel according to an embodiment of the present disclosure.

FIG. 2B is a structure schematic diagram of a plan view of a color filter layer and a color resistance layer of a display area of a display panel according to an embodiment of the present disclosure. In some exemplary embodiments, as shown in FIGS. 2A and 2B, the display panel may further include a color filter layer 15 and a color resistance layer 16 disposed on a side of the encapsulation structure layer 13 away from the base substrate 10.

The color filter layer 15 includes a plurality of filter units 151 capable of transmitting set color light, such as, a red filter unit transmitting red light, a green filter unit transmitting green light and a blue filter unit transmitting blue light. The light emitted by each light emitting device passes through a corresponding one of the filter units 151 and then emits light of a corresponding color.

In some exemplary embodiments, as shown in FIG. 2B, the color resistance layer 16 may be mesh-shaped and have a plurality of color resistance layer openings, and each filter unit 151 may be located within a corresponding one of the color resistance layer openings.

In some exemplary embodiments, the color resistance layer 16 may include a plurality of first color resistance portions 161 extending along the first direction X, the plurality of the first color resistance portions 161 are sequentially arranged in the second direction Y, the color resistance layer 16 further includes a plurality of groups of second color resistance portions 162, each group of second color resistance portions 162 includes a plurality of the second color resistance portions 162 which are located between two adjacent first color resistance portions 161 and disposed at intervals along the first direction X, and each second color resistance portion 162 extends along the second direction Y. The second color resistance portion 162 may be formed by an overlapping part of two adjacent filter units 151 for transmitting light of different colors in the first direction X; or the second color resistance portion 162 may be formed without the aid of the filter unit 151 and the material of the second color resistance portion 162 may include metal chromium (Cr), chromium oxide (CrOx), black resin or the like. The material of the first color resistance portion 161 may include metal chromium (Cr), chromium oxide (CrOx), black resin or the like. The material of the first color resistance portion 161 and the material of the second color resistance portion 162 may be the same or different.

In some exemplary embodiments, as shown in FIG. 2B, the orthographic projection of the first color resistance portion 161 on the base substrate 101 may include an orthographic projection of a first via hole K1 of a planarization layer on the base substrate 10; or the orthographic projection of the first color resistance portion 161 on the base substrate 10 partially overlaps the orthographic projection of the first via hole K1 on the base substrate 10.

In some exemplary embodiments, as shown in FIG. 2B, an orthographic projection of the second color resistance portion 162 on the base substrate 10 dose not overlap an orthographic projection of the first via hole K1 on the base substrate 10.

Figure 2C:
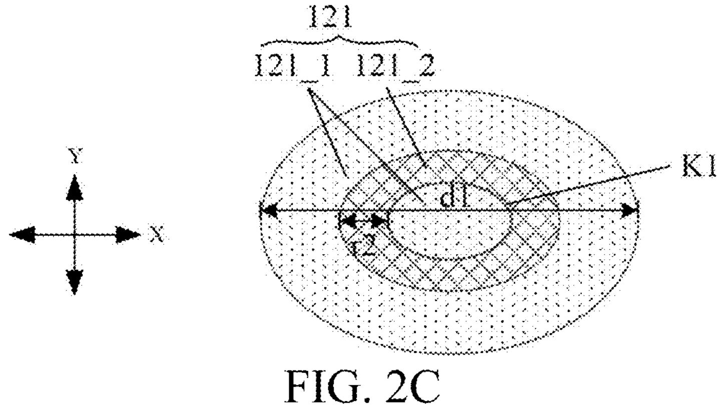
FIG. 2C is a structure schematic diagram of a top view of a first electrode according to an embodiment of the present disclosure.

In some exemplary embodiments, as shown in FIG. 2C, the first electrode layer includes a first sub-region 121_1 and a second sub-region 121_2, the second sub-region 121_2 has at least a part of the first electrode 121, and an average thickness of the at least a part of the first electrodes 121 in a direction perpendicular to the base substrate is greater than an average thickness of the first electrode 121 of the first sub-region 121_1 in a direction perpendicular to the base substrate.

In some exemplary embodiments, the second sub-region 121_2 is located on a circumferential sidewall of the first via hole K1 and covers a surface of the circumferential sidewall of the first via hole K1 close to one end of the base substrate.

In some exemplary embodiments, the second sub-region 121_2 has an annular structure, and a ratio of a width r2 of an orthographic projection of the first electrode 121 of the second sub-region 121_2 on the base substrate in the first direction to a width d1 of an orthographic projection of the first electrode 121 on the base substrate in the first direction is between ¼ and ½.

In some exemplary embodiments, a width r2 of an orthographic projection of the first electrode 121 of the second sub-region 121_2 on the base substrate in the first direction is between 1 um and 2 um.

The structure of the first electrode designed by the embodiment of the present disclosure can reduce the risk of disconnection between the first electrode and the pixel driving circuit. The contact area between the first electrode and the pixel driving circuit is increased, and the contact resistance between the first electrode and the pixel driving circuit is reduced.

Figure 3A:
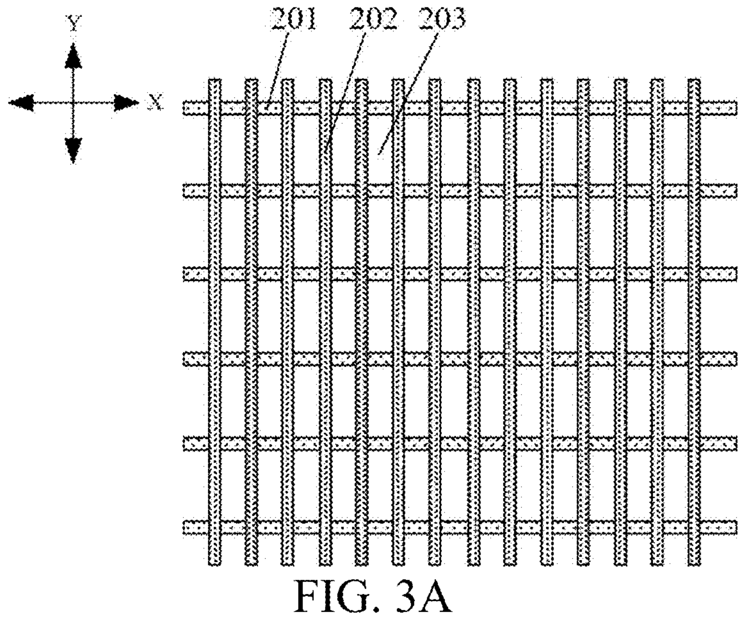
FIG. 3A is a structure schematic diagram of a plan view of a pixel define layer of a display area of a display panel according to an embodiment of the present disclosure.
Figure 3B:
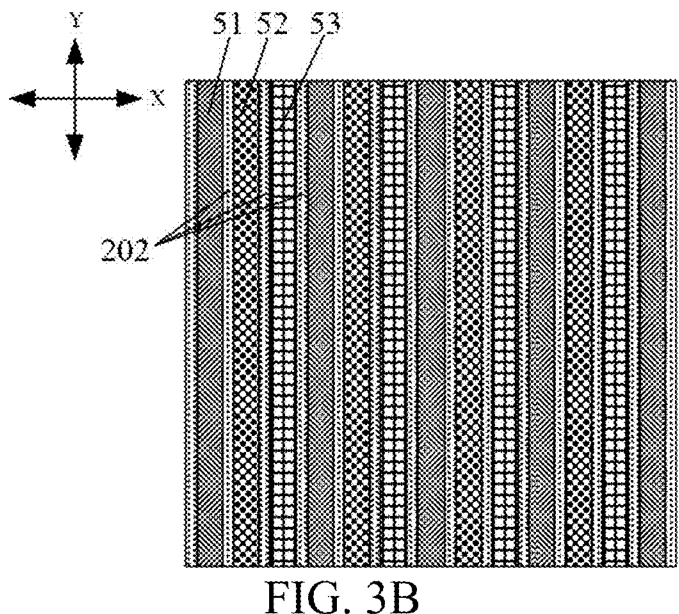
FIG. 3B is a structural schematic diagram of an organic light emitting layer formed by ink jet printing according to an embodiment of the present disclosure.

FIG. 3A is a structure schematic diagram of a plan view of a pixel define layer of a display area of a display panel according to an embodiment of the present disclosure. In some exemplary embodiments, as shown in FIG. 3A, the pixel define layer 122 may include a plurality of first dam portions 201 extending in the first direction X and a plurality of second dam portions 202 extending in the second direction Y, the plurality of first dam portions 201 and the plurality of second dam portions 202 intersect each other and form a plurality of pixel openings 203. The thickness of the second dam portion 202 in the third direction may be greater than the thickness of the first dam portion 201 in a third direction, and the third direction may be a direction perpendicular to the display panel. Because the sub-pixels in a same column in the second direction Y are sub-pixels of the same color, sub-pixels of adjacent columns are sub-pixels of different colors. Therefore, as shown in FIG. 3B, when the organic light emitting layer of the light emitting function layer 123 is formed by ink jet printing, the light-emitting layer ink can flow between the pixel openings 203 of the same column of sub-pixels, and the second dam portion 202 can block the light-emitting layer ink of the same column of sub-pixels from climbing to the adjacent column of sub-pixels, wherein reference numbers of 51, 52 and 53 represent the light-emitting layer ink of the first sub-pixel, the light-emitting layer ink of the second sub-pixel and the light-emitting layer ink of the third sub-pixel, respectively.

In some exemplary embodiments, the pixel define layer 122 may include a plurality of second dam portions 202 extending in the second direction Y, the plurality of second dam portions 202 are sequentially arranged in the first direction X, the pixel define layer 122 may further include a plurality of groups of first dam portions 201, each group of first dam portions 201 includes a plurality of first dam portions 201 disposed between two adjacent second dam portions 202 and disposed at intervals along the second direction Y, and each first dam portion 201 extends along the first direction X; a plurality of second dam portions 202 and a plurality of groups of first dam portions 201 form a plurality of pixel openings 203. In this embodiment, the first dam portion 201 and the second dam portion 202 do not overlap.

In some exemplary embodiments, a distance between a surface of a side of the first dam portion 201 away from the base substrate 10 and a surface of a side of the planarization layer away from the base substrate 10 is smaller than a distance between a surface of a side of the second dam portion 202 away from the base substrate 10 and a surface of a side of the planarization layer away from the base substrate 10.

In some exemplary embodiments, the second dam portion 202 includes a first surface of a side away from the base substrate 10 and a second surface of a side close to the base substrate 10. The first dam portion 201 includes a third surface of a side away from the base substrate and a fourth surface of a side close to the base substrate, and a distance between the first surface and the second surface (i.e., the thickness of the second dam portion 202 in the third direction) is greater than a distance between the third surface and the fourth surface (i.e., the maximum thickness of the first dam portion 201 in the third direction).

In some exemplary embodiments, the thickness of the first dam portion 201 in the third direction may be between 0 nm and 300 nm.

Figure 3C:
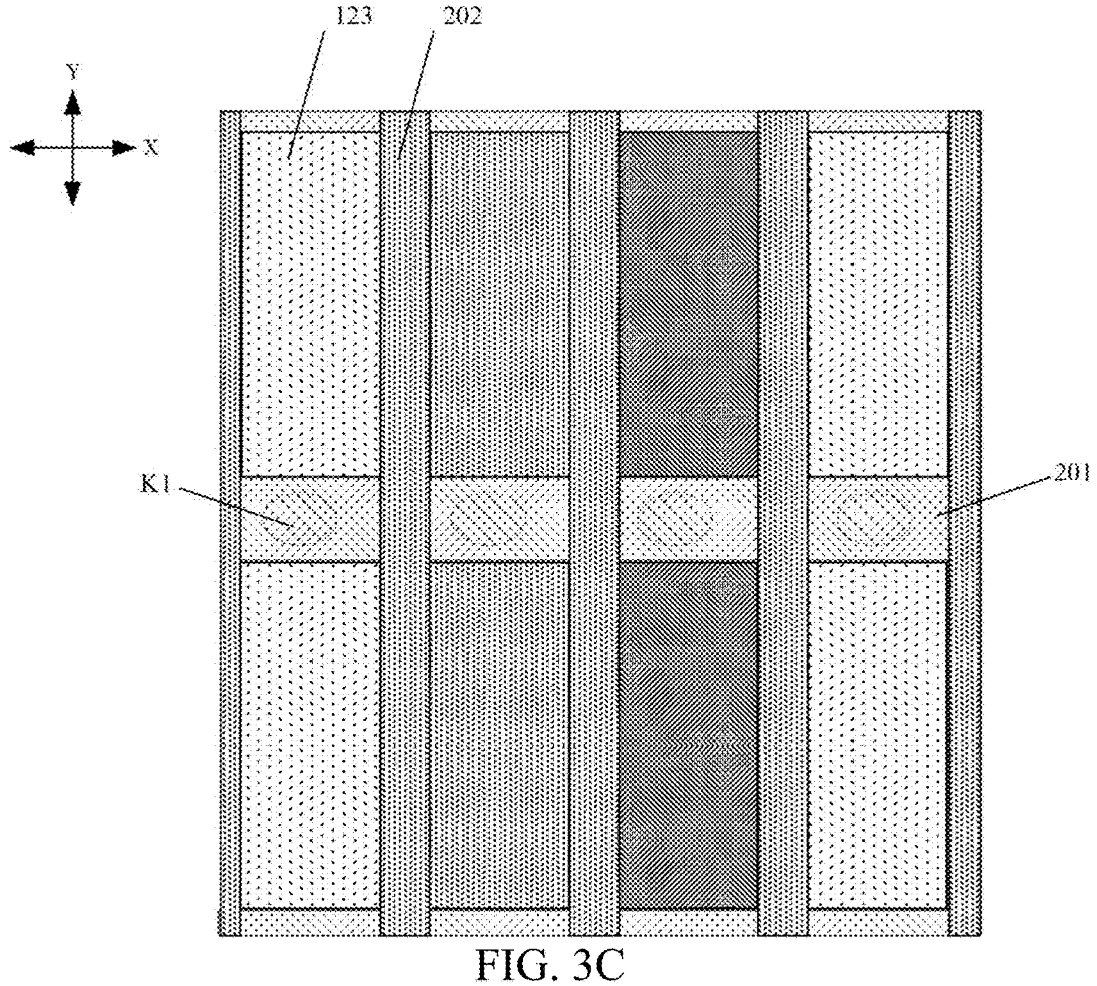
FIG. 3C is a structure schematic diagram of a plan view of a pixel define layer and a light emitting function layer of a display area of a display panel according to an embodiment of the present disclosure.

FIG. 3C is a structure schematic diagram of a plan view of a pixel define layer and a light emitting function layer of a display area of a display panel according to an embodiment of the present disclosure. In some exemplary implementations, as shown in FIG. 3C, the orthographic projection of the first dam portion 201 on the base substrate 10 may include an orthographic projection of a first via hole K1 of a planarization layer on the base substrate 10; or the orthographic projection of the first dam portion 201 on the base substrate 10 partially overlaps the orthographic projection of the first via hole K1 on the base substrate 10.

In some exemplary embodiments, as shown in FIG. 3C, the orthographic projection of the second dam portion 202 on the base substrate 10 does not overlap the orthographic projection of the first via hole K1 on the base substrate 10.

In some exemplary embodiments, the thickness of the second dam portion 202 in the third direction may be between 0.8 um and 1.2 um, and, for example, the thickness of the second dam portion 202 in the third direction may be 1 um.

In some exemplary embodiments, the width of the second dam portion 202 in the first direction X may be between 12 um and 18 um. The width of the second dam portion 202 in the first direction X may be about 15 um.

In some exemplary embodiments, the material of the first dam portion 201 and the second dam portion 202 may each include at least one of silicon nitride, silicon oxide, and silicon oxynitride, the material of the first dam portion 201 may further include a lyophilic material, and the material of the second dam portion 202 may further include a lyophobic material.

In some exemplary embodiments, in the process of forming the pixel define layer 122, a pixel define thin film may be formed first, and then, the first dam portion 201 and the second dam portion 202 with different thicknesses may be finally formed through the processes of coating photoresist, exposing with a half tone mask, developing, etching and other processes. Alternatively, the first dam portion 201 may be formed first and then the second dam portion 202 may be formed.

Figure 4:
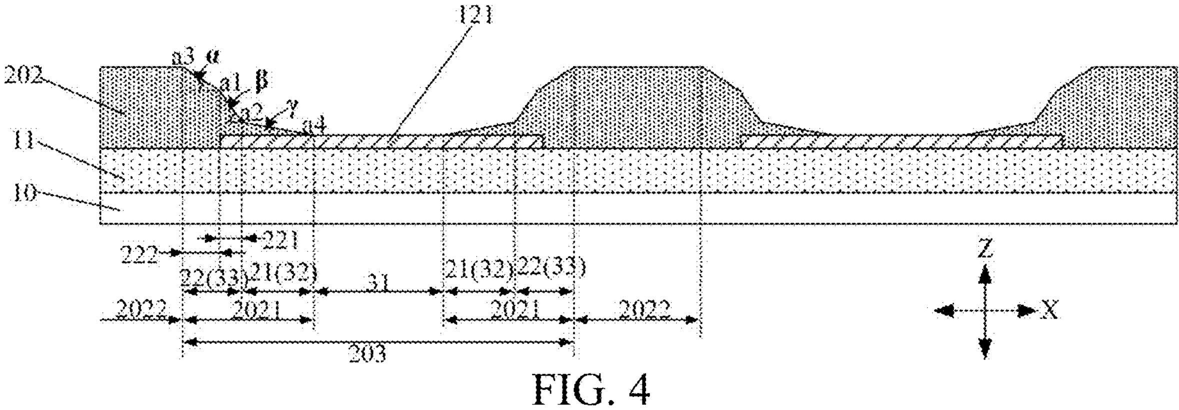
FIG. 4 is a structure schematic diagram of a partial-sectional view of a display panel according to an exemplary embodiment of the present disclosure.

FIG. 4 is a structure schematic diagram of a partial-sectional view of a display panel according to an exemplary embodiment of the present disclosure. In some exemplary embodiments, as shown in FIG. 4, the second dam portion 202 may include a first side surface 2021 facing the pixel opening 203 and a first surface 2022 facing away from the base substrate 10. The first side surface 2021 of the second dam portion 202 includes a first functional area 21 and a second functional area 22 sequentially disposed in a direction away from the base substrate 10, the second functional area 22 includes a first sub-area 221 and a second sub-area 222, the first sub-area 221 is connected to the first functional area 21 and the second sub-area 222, and the second sub-area 222 is connected to the first sub-area 221 and the first surface 2022 of the second dam portion 202; an edge of the first functional area 21 away from the second functional area 22 may be located on a surface of the first electrode 121 facing away from the base substrate 10. An orthographic projection region of a part of the first electrode 121 exposed by the pixel opening 203 on the base substrate 10 is taken as an effective light emitting area 31 of the display panel; an orthographic projection area of the first functional area 21 on the base substrate 10 is used as a stray light area 32 of the display panel, and the stray light area 32 is provided so as to be capable of emitting stray light; an orthographic projection area of the second functional area 22 on the base substrate 10 is used as a photoinhibition area 33 of the display panel, and the photoinhibition area 33 is set so as not to emit light.

Figure 5:
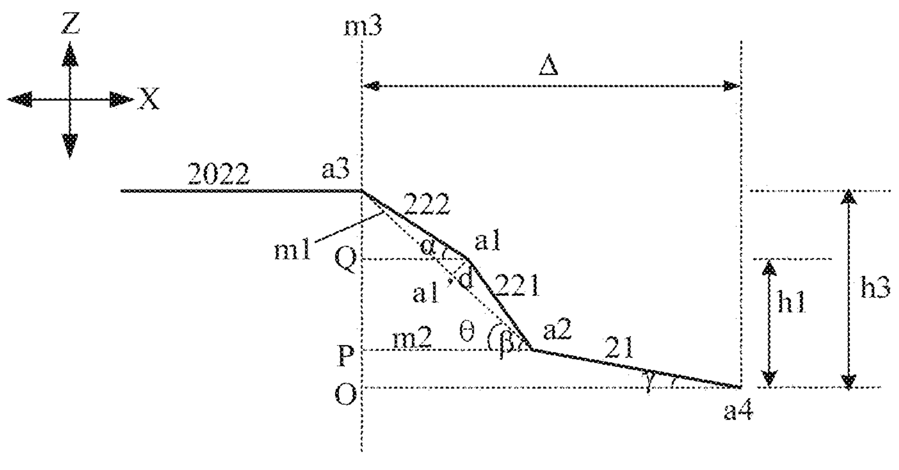
FIG. 5 is a schematic diagram of a partial line outline of a second dam portion of a pixel define layer in FIG. 4.

FIG. 5 is a schematic diagram of a partial line outline of a second dam portion 202 of a pixel define layer 122 in FIG. 4. In some exemplary embodiments, the first functional area 21, the first sub-area 221, and the second sub-area 222 may all be inclined surfaces; In the embodiment of the present disclosure, when the line outline of a cross section of a certain region is a roughly straight line instead of an obvious arc, the region can be approximately regarded as an inclined surface. The slope angle β of the first sub-area 221 is greater than the slope angle α of the second sub-area 222, the slope angle α of the second sub-area 222 is greater than the slope angle γ of the first functional region 21, wherein the slope angle α of the second sub-area 222 is an acute angle between the second sub-area 222 and a plane parallel to the base substrate 10, the slope angle β of the first sub-area 221 is an acute angle between the first sub-area 221 and a plane parallel to the base substrate 10, and the slope angle γ of the first functional region 21 is an acute angle between the first functional region 21 and a plane parallel to the base substrate 10.

In some exemplary embodiments, the slope angle β of the first sub-area 221 is between 50° and 60°.

In some exemplary embodiments, the slope angle α of the second sub-area 222 is between 30° and 40°.

In some exemplary embodiment, the slope angle γ of the first functional area 21 is between 10° and 20°.

In the embodiment of the present disclosure, the second functional area 22 of the second dam portion 202 is configured to include a first sub-area 221 and a second sub-area 222 having different slope gradients in a direction away from the base substrate 10, and the slope angle β of the first sub-area 221 is greater than the slope angle α of the second sub-area 222, that is, a second sub-area 222 with a smaller slope angle is provided between the first sub-area 221 with a larger slope angle and the first surface 2022 of the second dam portion 202 for transition. In this way, it is possible to avoid the first sub-area 221 being directly connected to the first surface 2022 of the second dam portion 202 and forming a sharp topography at the junction of the first side surface 2021 and the first surface 2022 of the second dam portion 202 (which is not conducive to the stability of the surface topography of the second dam portion 202, and is easy to cause a peeling problem between the film layer formed on the surface of the second dam portion 202 and the second dam portion 202). This facilitates the stabilization of the surface morphology of the second dam portion 202, the problem of peeling between the film layer formed on the surface of the second dam portion 202 and the second dam portion 202 is prevented, and the lateral propagation path of the light in the stray light area in the panel is ensured to be minimal. In addition, the second functional region 22 can still effectively block ink climbing when the film layer in the light emitting function layer 123 is formed by ink jet printing.

In some exemplary embodiments, as shown in FIGS. 4 and 5, the intersection line between the first sub-area 221 and the second sub-area 222 is used as the first intersection line, an intersection line between the first sub-area 221 and the first functional region 21 is used as a second intersection line, an intersection line between the second sub-area 222 and the first surface 2022 of the second dam portion 202 is used as a third intersecting line, and an intersection line between the first functional region 21 and the surface of the first electrode 121 facing away from the base substrate 10 is used as a fourth intersecting line (i.e., an edge of the first functional region 21 away from the second functional region 22). A plane parallel to the first direction X and perpendicular to the base substrate 10 is used as a reference surface, the intersection point of the first intersection line and the reference surface is a first intersection point a1, the intersection point of the second intersection line and the reference surface is a second intersection point a2, the intersection point of the third intersecting line and the reference surface is a third intersection point a3, and the intersection point of the fourth intersecting line and the reference surface is a fourth intersection point a4. The intersecting line between the first functional area 21 and the reference surface may be approximately a straight line connecting the second intersecting point a2 and the fourth intersecting point a4, the intersecting line between the first sub-area 221 and the reference surface may be approximately a straight line connecting the first intersecting point a1 and the second intersecting point a2, and the intersecting line between the second sub-area 222 and the reference surface may be approximately a straight line connecting the first intersecting point a1 and the third intersecting point a3.

In some exemplary embodiments, as shown in FIG. 5, in the reference surface, a straight line passing through the second intersection point a2 and the third intersection point a3 is taken as the first reference line m1, a straight line passing through the second intersection point a2 and parallel to the base substrate 10 is taken as the second reference line m2, and a straight line passing through the third intersection point a3 and perpendicular to the base substrate 10 is taken as the third reference line m3. The intersection of the second reference line m2 and the third reference line m3 is the reference point P, the acute angle between the first reference line m1 and the second reference line m2 is θ, and the distance from the first intersection point a1 to the first reference line m1 (i.e., the length of the line segment between the pedal a1' and the first intersection point a1 by drawing a perpendicular line from the first intersection point a1 to the first reference line m1) is d.

In some exemplary embodiments, the acute angle θ between the first reference line m1 and the second reference line m2 is between 38° and 42°. In this way, the film structure of the display panel is stable, and the lateral propagation path of light in the stray light area in the display panel is minimized.

In some exemplary embodiments, a distance d from the first intersection point a1 to the first reference line m1 satisfies: $0<d\leq D<AB/S$, $0<D<\Delta/2-HL/S$;

- A is the length of a straight line connecting between the first intersection point a1 and the third intersection point a3;
- B is the length of a straight line connecting between the first intersection point a1 and the second intersection point a2;
- S is the length of a straight line connecting between the second intersection point a2 and the third intersection point a3;
- H is the length of the straight line connecting the third intersection point a3 and the reference point P;
- L is the length of a straight line connecting the second intersection point a2 and the reference point P;
- Δ is the width of the first side surface 2021 of the second dam portion 202 in the first direction X.

In the embodiment of the present disclosure, the distance d from the first intersection point a1 to the first reference line m1 satisfies the above relation, that is, the position of the first intersection line between the first sub-area 221 and the second sub-area 222 in the second functional area 22 is correspondingly constrained, in this way, the surface morphology of the second functional area 22 can be stabilized (i.e., the mechanical structural stability can be ensured), the problem of peeling between the film layer formed on the surface of the second dam portion 202 and the second functional area 22 can be prevented, and the second functional area 22 can effectively block ink climbing.

In some exemplary embodiments, as shown in FIG. 5, in the reference surface, a straight line passing through a third intersection point a3 and perpendicular to the base substrate 10 is taken as the third reference line m3, a perpendicular line is drawn through the fourth intersection point a4 to the third reference line m3 with a foot point of O, and a perpendicular line is drawn through the first intersection point a1 to the third reference line m3 with a foot point of Q. The length of the line segment between the foot point O and the foot point Q is h1, and the length of the line segment between the vertical foot O and the third intersection point a3 is h3, then the ratio of h1 to h3 can be between 0.494 and 0.742. Exemplary, the ratio of h1 to h3 may be 0.618, i.e. the ratio of h1 to h3 satisfies the golden section ratio.

In the embodiment of the present disclosure, the ratio of h1 to h3 is set in the range of 0.494 to 0.742, that is, the position of the first intersection line between the first sub-area 221 and the second sub-area 222 in the second functional area 22 is correspondingly constrained, In this way, the surface morphology of the second functional area 22 can be stabilized (i.e., the mechanical structural stability can be ensured), the problem of peeling between the film layer formed on the surface of the second dam portion 202 and the second functional area 22 can be prevented, and it is guaranteed that the second functional area 22 can effectively block ink climbing. When the ratio of h1 to h3 is 0.618, that is $(\sqrt{5}-1)/2$, the ratio of h1 to h3 satisfies the ratio of golden section, and the mechanical structure is the most stable.

Figure 6:
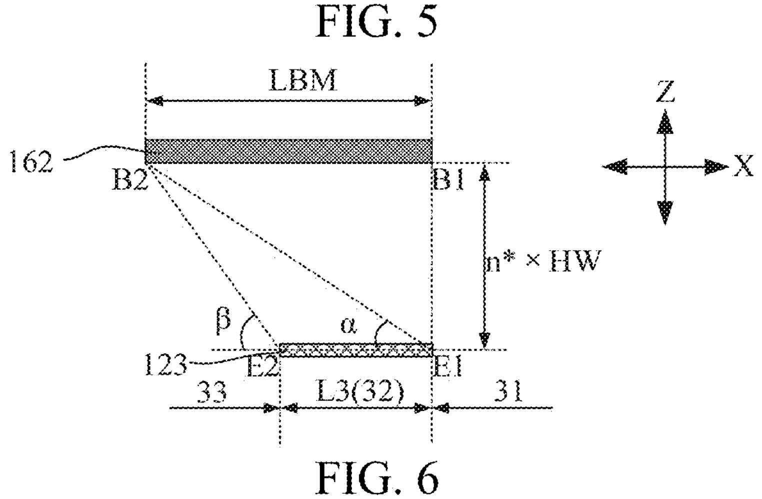
FIG. 6 is a schematic diagram showing a positional relationship between a color resistance layer and an organic light emitting layer in a stray light area of a display panel according to an embodiment of the present disclosure.

FIG. 6 is a schematic diagram showing a positional relationship between a color resistance layer 16 and an organic light emitting layer 32 in a stray light area of a display panel according to an embodiment of the present disclosure. FIG. 6 shows only the organic light emitting layer of the stray light area 32. In some exemplary embodiments, as shown in FIGS. 4 and 6, taking any sub-pixel as a reference sub-pixel, a plane parallel to the first direction X and perpendicular to the base substrate 10 is used as a reference surface, the organic light emitting layer has a first interface at the boundary between the stray light area 32 and the effective light emitting area 31 of the reference sub-pixel, the organic light emitting layer has a second interface at the boundary between the stray light area 32 and the photoinhibition area 33 of the reference sub-pixel, the midpoint of the intersecting line between the first interface and the reference surface in the direction perpendicular to the base substrate 10 is E1, and the midpoint of the intersecting line between the second interface and the reference surface in the direction perpendicular to the base substrate 10 is E2. The surface of the second color resistance portion 162 facing the base substrate 10 has a first edge and a second edge in the first direction X, the first edge is closer to the center of the effective light emitting area 31 of the reference sub-pixel than the second edge, the intersection point of the first edge and the reference surface is B1, and the intersection point of the second edge and the reference surface is B2. In the reference surface, an acute angle between a straight line passing through an intersection point B2 and an intersection point E1 and a plane parallel to the base substrate 10 is used as a first angle, and an acute angle between a straight line passing through an intersection point B2 and an intersection point E2 and a plane parallel to the base substrate 10 is used as a second angle. The first angle may be equal to the slope angle α of the second sub-area 222 and the second angle may be equal to the slope angle β of the first sub-area 221.

In some exemplary embodiments, the slope angle β of the first sub-area 221 and the slope angle α of the second sub-area 222 may satisfy the following relationship: $\beta<\arctan(n^*\times HW/(LBM-L3))$; $\alpha<\arctan(n^*\times HW/LBM)$, or the second color resistance portion 162 may satisfy the following relationship: $LBM<(n^*\times HW+L3\times\tan\beta)/\tan\beta$; $LBM<n^*\times HW\times\cot\alpha$.

Herein, $n^*$ is the equivalent refractive index of the film, $1<n^*<2$;

- HW is a distance from the center position of the organic light emitting layer of the stray light area 32 in the third direction Z to the second color resistance portion 162 in a direction perpendicular to the base substrate 10;
- LBM is the width of the second color resistance portion 162 in the first direction X;
- L3 is the width of the stray light area 32 in the first direction X.

In the embodiment of the present disclosure, the slope angle β of the first sub-area 221 and the slope angle α of the second sub-area 222 satisfy the above relationship, or the second color blocking section 162 satisfies the above relationship, so that stray light emitted from the organic light emitting layer located in the stray light area 32 can be absorbed by the second functional area 22 and the second color blocking section 162, thereby reducing the emission of the stray light, improving the light emission quality of the display panel and reducing the color shift phenomenon.

Figure 7A:
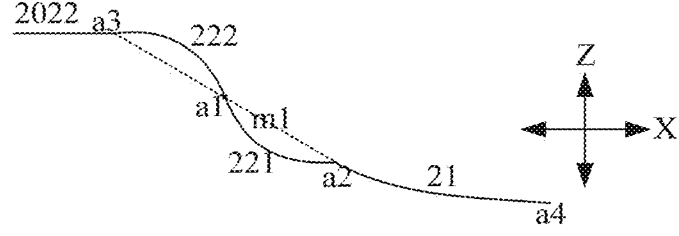
FIGS. 7A to 7C are schematic diagrams of three kinds of partial line outlines of a second dam portion of a pixel define layer in other exemplary embodiments.
Figure 7B:
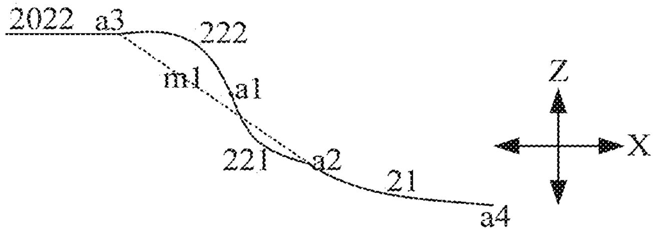
Figure 7C:
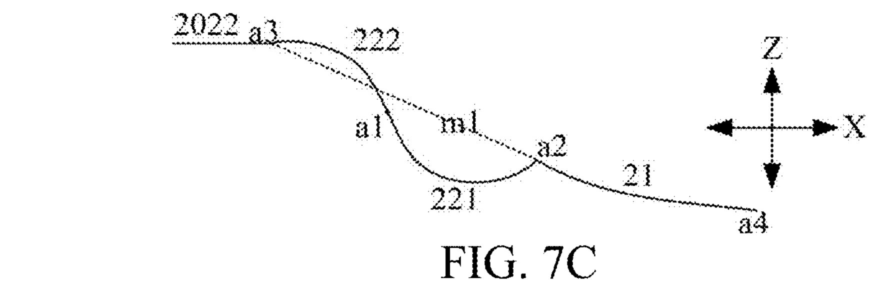

FIG. 7A is a schematic diagram of the first kind of a partial line outline of a second dam portion 202 of a pixel define layer 122 in other exemplary embodiments, FIG. 7B is a schematic diagram of the second kind of a partial line outline of a second dam portion 202 of a pixel define layer 122 in other exemplary embodiments, FIG. 7C is a schematic diagram of the third kind of a partial line outline of a second dam portion 202 of a pixel define layer 122 in other exemplary embodiments. In other examples of this embodiment, as shown in FIG. 7A, FIG. 7B and FIG. 7C, the shapes of the first functional area 21 and the first sub-area 221 and the second sub-area 222 of the second functional area 22 may both be curved surfaces. The first functional area 21 may be in the shape of an arc sunken toward the direction of the second dam portion 202 where the first functional area 21 is located. The first sub-area 221 may be in the shape of an arc sunken toward the direction of the second dam portion 202 where the first sub-area 221 is located. The second sub-region 222 may be in the shape of an arc protruding away from the second dam portion 202 where the second sub-region 222 is located. The radius of curvature of the first sub-area 221 is Rb, and the radius of curvature of the second sub-area 222 is Ra, which may be set to Ra≤Rb or Ra≥Rb.

Mathematically, a curved surface can be regarded as a trajectory formed by the continuous motion of a moving line (straight line or curve) in space. The term "curved surface" as used herein includes deviations from an ideal curved surface due to manufacturing process errors. Specifically, the "curved surface" described in this paper includes not only the continuous film surface made by one-step process, but also the protruding or concave structure of the film surface caused by morphology inheritance. Furthermore, the "curved surface" described in this paper can also include a locally complex film structure formed by semi-exposure process or stacking of the same process for many times, and its surface does not appear fracture or obvious breakage.

In some exemplary embodiments, the intersection line between the first sub-area 221 and the second sub-area 222 is used as the first intersection line, an intersection line between the first sub-area 221 and the first functional region 21 is used as a second intersection line, an intersection line between the second sub-area 222 and the first surface 2022 of the second dam portion 202 is used as a third intersecting line, and an intersection line between the first functional region 21 and the surface of the first electrode 121 facing away from the base substrate 10 is used as a fourth intersecting line (i.e., an edge of the first functional region 21 away from the second functional region 22). A plane parallel to the first direction X and perpendicular to the base substrate 10 is used as a reference surface, the intersection point of the first intersection line and the reference surface is a first intersection point a1, the intersection point of the second intersection line and the reference surface is a second intersection point a2, the intersection point of the third intersecting line and the reference surface is a third intersection point a3, and the intersection point of the fourth intersecting line and the reference surface is a fourth intersection point a4. The intersection line of the first functional area 21 and the reference surface may be approximately a curve connecting the second intersection point a2 and the fourth intersection point a4. The intersection line of the first sub-area 221 and the reference surface may be approximately a first arc connecting the first intersection point a1 and the second intersection point a2, and the intersection line of the second sub-area 222 and the reference surface may be approximately a second arc connecting the first intersection point a1 and the third intersection point a3.

In the reference surface, a straight line passing through the second intersection point a2 and the third intersection point a3 is taken as the first reference line m1. In some exemplary embodiments, as shown in FIG. 7A, the radius of curvature Rb of the first sub-area 221 may be equal to the radius of curvature Ra of the second sub-area 222, and the first intersection point a1 may be located on the first reference line m1, with the first arc line and the second arc line respectively located on both sides of the first reference line m1. In other exemplary embodiments, as shown in FIG. 7B, the radius of curvature Rb of the first sub-area 221 may be smaller than the radius of curvature Ra of the second sub-area 222, and the first intersection point a1 may be located on the side of the first reference line m1 away from the base substrate 10. In still other exemplary embodiments, as shown in FIG. 7C, the radius of curvature Rb of the first sub-area 221 may be greater than the radius of curvature Ra of the second sub-area 222 and the first intersection point a1 may be located on the side of the first reference line m1 close to the base substrate 10.

Figure 7D:
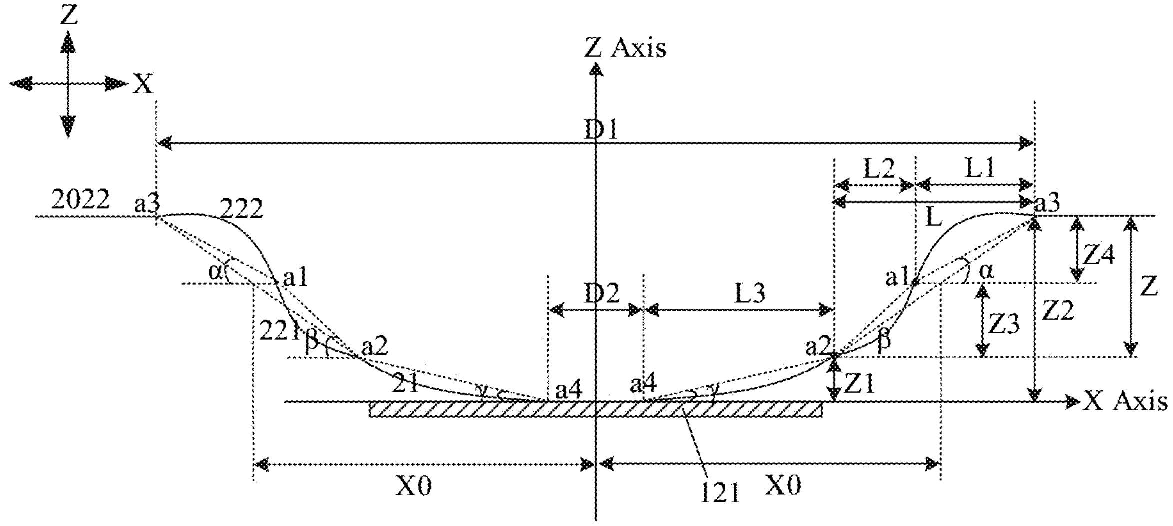
FIG. 7D is a schematic diagram of a method for defining gradient angles of a first functional area, a first sub-area and a second sub-area of a second functional area according to an embodiment of the present disclosure.

As shown in FIG. 7D, when the shapes of the first functional region 21 and the first sub-area 221 and the second sub-area 222 of the second functional region 22 are all curved surfaces. The slope angle α of the second sub-area 222 is defined as an acute angle between a straight line connecting the first intersection point a1 and the third intersection point a3 and a plane parallel to the base substrate 10. The slope angle β of the first sub-area 221 is defined as an acute angle between a straight line connecting the first intersection point a1 and the second intersection point a2 and a plane parallel to the base substrate 10, and the slope angle γ of the first functional region 21 is defined as an acute angle between a straight line connecting the second intersection point a2 and the fourth intersection point a4 and a plane parallel to the base substrate 10. FIG. 7D illustrates that the first intersection point a1 is located on the side of the first reference line m1 away from the base substrate 10. However, when the first intersection point a1 is located on the side of the first reference line m1 close to the base substrate 10, or in a case that the first intersection point a1 is located on the first reference line m1, the definitions of the slope angle α of the second sub-area 222, the slope angle β of the first sub-area 221, and the slope angle γ of the first functional region 21 are equally applicable.

In some exemplary embodiments, as shown in FIG. 7D, the radius of curvature Rb of the first sub-area 221 and the radius of curvature Ra of the second sub-area 222 may satisfy:

$$0 \leq \left|1/Ra - 1/Rb\right| / \left|\cos\alpha - \cos\beta\right| < G/\sigma = K;$$

G represents the constant related to the gravity of the material.

σ represents the surface tension constant of ink.

K represents the engineering standard parameters under specific conditions.

In this embodiment, the area element covering the nearest neighbor of the adjacent points of the first sub-area surface and the second sub-area surface is taken, and the force analysis is carried out on the two curved surfaces respectively to obtain:

$$p1 - p2 = \sigma * (1/Ra - 1/R),\ p1' - p2 = \sigma * (1/Rb - 1/R)$$

Ra and Rb are the radius of curvature of the area element at the contact point of two curved surfaces respectively, p is the pressure received by the droplet, and p1−p2 and p1'−p2 are the pressure differences received by the area element on two curved surfaces respectively.

After finishing, p1−p1'=σ*|1/Ra−1/Rb| can be obtained.

Through the design of local curvature, in order to achieve better mechanical conditions, so that the droplets are completely and continuously confined in the high bank interval (that is, between the adjacent second dam portions), we use the component of gravity in the design, which needs to meet the following requirements:

$$p1 - p1' = \sigma * |1/Ra - 1/Rb| < G * |\cos\alpha - \cos\beta|$$

$$0 \le |1/Ra - 1/Rb| / |\cos\alpha - \cos\beta| < G/\sigma = K;$$

G is the value related to the gravity of ink droplets, σ is the surface tension constant of ink droplets, K is the actual parameter selected by the account product when achieving better technical results, and it is advisable to choose 1.03<K<4.54 here. When the K value is close to the upper limit, the second sub-area can be fully used to block the climbing of ink droplets, and the blocking effect is good. When the value of K is close to the lower limit, the joint area of the two sub-areas is not easy to break, and the structure is more stable.

In the embodiment of the present disclosure, the radius of curvature of the first sub-area 221 and the second sub-area 222 satisfies the above relationship, which is beneficial to keep the shape of the first side surface 2021 of the second dam portion 202 stable in structure. In addition, when the film layer in the light emitting function layer 123 is formed by ink jet printing, the second functional region 22 can still effectively block ink climbing.

In some exemplary embodiments, the radius of curvature Rb of the first sub-area 221 may be between 2.10 microns and 3.14 microns such as 2.62 microns. The radius of curvature Ra of the second sub-area 222 may be between 1.14 microns and 1.71 microns such as 1.43 microns.

In some exemplary embodiments, the intersection line of the second functional area 22 with the reference surface may serve as a fitting curve of the second functional area 22 (i.e., a curve formed by the first arc and second arc may be considered an S-shaped curve). As shown in FIG. 7D the second functional area 22 is a continuously changing curve within the reference surface.

Optionally, when a plane rectangular coordinate system is established, a coordinate origin is the orthographic projection of the geometric center of the surface of the first electrode 121 exposed by the pixel opening 203 on the reference surface, the first direction X is the X-axis direction, and the third direction Z (i.e., the direction perpendicular to the base substrate 10) is the Z-axis direction. Then the second functional area 22 is formed into a curve represented by the following directions by a half exposure process:

$$Z = (Z2 - Z1) \times \arctan(X - X0)/a \times \prod + (Z2 + Z1)/2;$$

where a is a design parameter which satisfies the condition that the first functional area 21 and the second functional area 22 can be continuously changed, the second functional area 22 and the first surface 2022 of the second dam portion 202 (a flat portion of the second dam portion 202) which are facing away the base substrate 10 can be continuously changed;

Π is pi, which can be taken as 3.14;

Z1 is a thickness of the first functional area 21 in a direction perpendicular to the base substrate 10;

Z2 is a height of the first side surface 2021 of the second dam portion 202 in a direction perpendicular to the base substrate 10;

X0 is the distance between the center of the second functional area 22 and the origin of coordinates.

In some exemplary embodiments, the intersection line of the first functional area 21 with the reference surface may serve as a fitting curve of the first functional area 21. As shown in FIG. 7D, the first functional area 21 is a continuously changing curve within the reference surface.

Optionally, when a plane rectangular coordinate system is established, a coordinate origin is the orthographic projection of the geometric center of the surface of the first electrode 121 exposed by the pixel opening 203 on the reference surface, the first direction X is the X-axis direction, and the third direction Z (i.e., the direction perpendicular to the base substrate 10) is the Z-axis direction. Then the first functional area 21 is formed into a curve represented by the following directions by a half exposure process:

$$Z = (1/a)^\wedge(X \pm X0 + L/2) + Z1 - 1;$$

wherein a is a design parameter that satisfies the condition that the first functional area 21 and the second functional area 22 can be continuously changed, and the first functional area 21 and the first electrode layer can be continuously changed;

Z1 is a thickness of the first functional area 21 in a direction perpendicular to the base substrate 10;

L is the width of the second functional area 22 in the first direction X;

X0 is the distance between the center of the second functional area 22 and the origin of coordinates.

In some exemplary embodiments, as shown in FIG. 7D, the width D1 of the pixel opening 203 in the first direction X is between 29.2 um and 30 um.

In some exemplary embodiments, as shown in FIG. 7D, the width D2 of the effective light emitting area 31 in the first direction X is between 26.7 um and 27.5 um.

In some exemplary embodiments, as shown in FIG. 7D, the width L of the second functional area 22 in the first direction X is between 0.95 m and 1.05 um.

In some exemplary embodiments as shown in FIG. 7D the width L1 of the second sub-area 222 in the first direction X is between 0.52 um and 0.57 um.

In some exemplary embodiments, as shown in FIG. 7D, the width L2 of the first sub-area 221 in the first direction X is between 0.43 m and 0.48 um.

In some exemplary embodiments, as shown in FIG. 7D, the width L3 of the first functional area 21 in the first direction X is between 0.76 m and 0.81 um.

In some exemplary embodiments, as shown in FIG. 7D, the distance X0 between the center of the second functional area 22 of the second dam portion 202 and the coordinate origin is between 10.5 um and 10.9 um.

In some exemplary embodiments, as shown in FIG. 7D, the thickness Z2 of the second dam portion 202 in a direction perpendicular to the base substrate 10 is between 0.83 um and 1 um.

In some exemplary embodiments, as shown in FIG. 7D, the thickness Z1 of the first functional area 21 in the direction perpendicular to the base substrate 10 is between 0.14 um and 0.19 um.

In some exemplary embodiments, as shown in FIG. 7D, the thickness Z of the second functional area 22 in a direction perpendicular to the base substrate 10 is between 0.71 um and 0.81 um.

In some exemplary embodiments, as shown in FIG. 7D, the thickness Z3 of the first sub-area 221 in a direction perpendicular to the base substrate 10 is between 0.33 um and 0.38 um.

In some exemplary embodiments, as shown in FIG. 7D, the thickness Z4 of the second sub-area 222 in a direction perpendicular to the base substrate 10 is between 0.38 um and 0.43 um.

In some exemplary embodiments, the thickness of the planarization layer in a direction perpendicular to the base substrate 10 is between 4 um and 4.4 um.

FIGS. 8A to 8D are schematic diagram of sectional structure of four partial film layers of a display panel according to an embodiment of that present disclosure. In some exemplary embodiments, as shown in FIGS. 2, 8A through 8D, the display panel may further include a dimming layer 14 disposed on a surface of the encapsulation structure layer 13 on a side away from the base substrate 10, and a color filter layer 15 and a color resistance layer 16 disposed on a surface of the dimming layer 14 on a side away from the base substrate 10. The refractive index of the encapsulation structure layer 13 is greater than that of the dimming layer 14, and the refractive index of the second color resistance portion 162 is greater than that of the dimming layer 14. The surface of the encapsulation structure layer 13 on the side away from the base substrate 10 is provided with a flat portion and a curved portion 40. The curved portion 40 includes at least a partial region protruding in a direction away from the base substrate. There is an overlapping portion between an orthographic projection of the curved portion 40 on the base substrate 10 and an orthographic projection of the second color resistance portion 162 on the base substrate 10, and there is an overlapping portion between an orthographic projection of the curved portion 40 on the base substrate 10 and an orthographic projection of the first functional area 21 on the base substrate 10.

In the embodiment of the present disclosure, because the encapsulation structure layer 13 is provided with a curved portion 40, the surface of the dimming layer 14 in contact with the encapsulation structure layer 13 is correspondingly formed with a recess at a position corresponding to the curved portion 40, the dimming layer 14 forms a concave lens at the recessed portion, and the refractive index of the encapsulation structure layer 13 is greater than that of the dimming layer 14. Thus, light emitted from the curved portion 40 of the encapsulation structure layer 13 can converge after being emitted through the dimming layer 14. The stray light emitted from the stray light area 32 can be more absorbed by the second color blocking portion 162, thereby reducing the emission of the stray light and reducing crosstalk between different sub-pixels, and the light emitted from the effective light emitting area 31 can be more converged in a direction closer to the positive viewing angle of the display panel.

In some exemplary embodiments, a surface of the encapsulation structure layer 13 on a side away from the base substrate 10 may be provided with a plurality of curved portions 40 each of which may extend in a second direction Y.

Figure 8A:
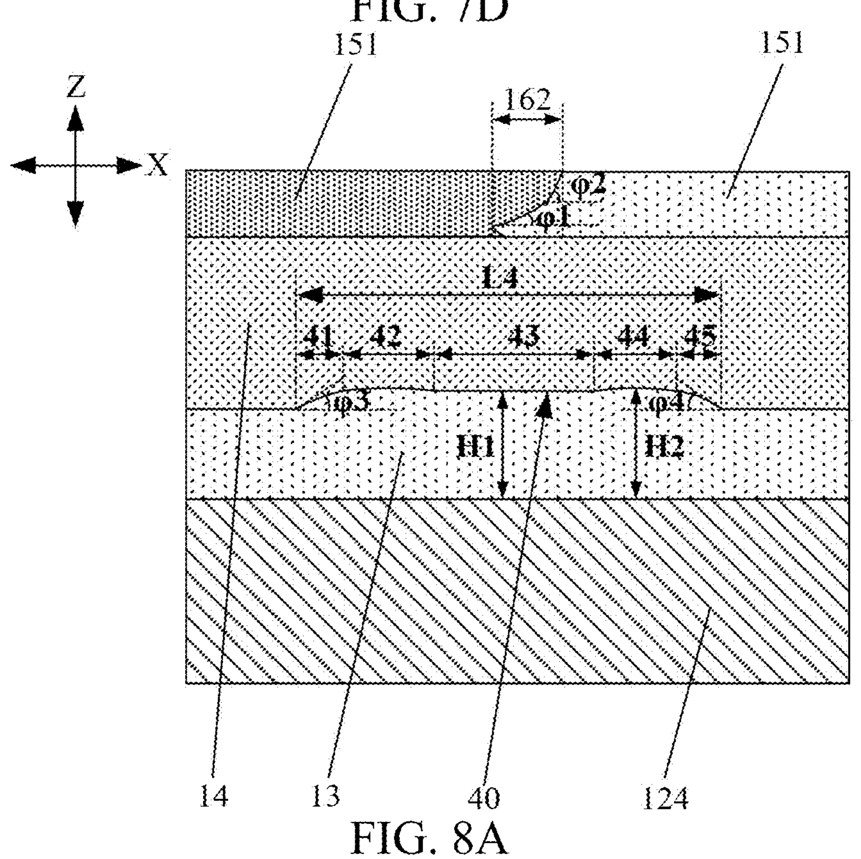
FIGS. 8A-8F are schematic diagrams of cross-sectional structures of several partial film layers of a display panel in some exemplary embodiments of the present disclosure.
Figure 8B:
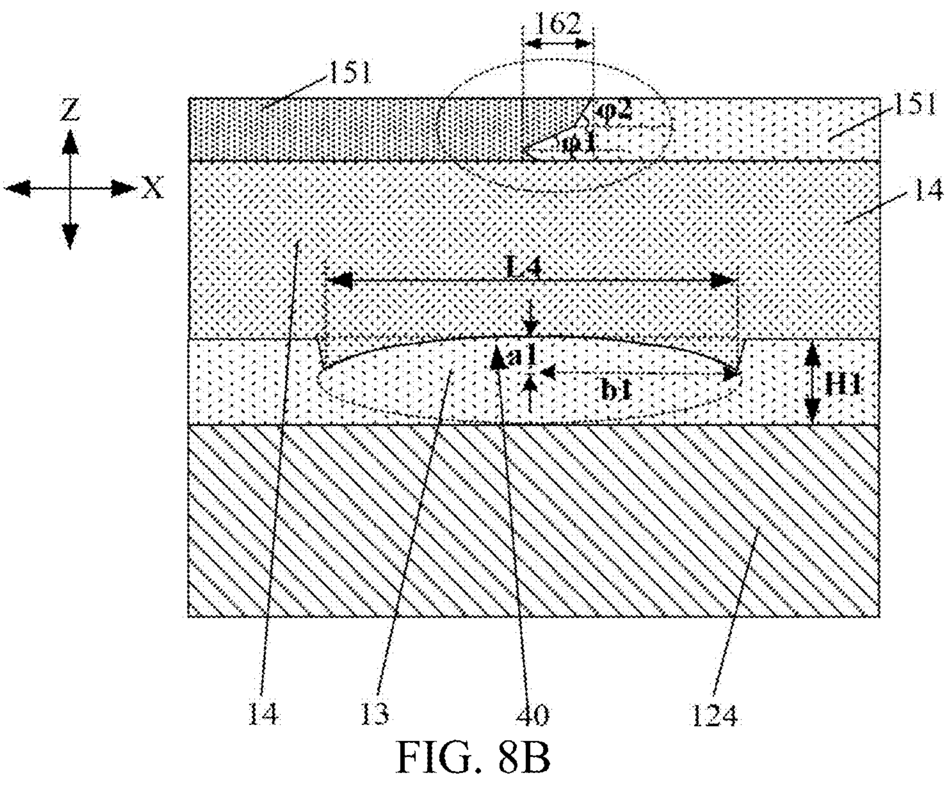

In some exemplary embodiments, as shown in FIG. 8B, a cross section of a partial region of the curved portion 40 protruding in a direction away from the base substrate is cut by a plane parallel to the first direction X and perpendicular to the base substrate 10, the cross section is a partial region of a first ellipse having a short half-axis length a1, a long half-axis length b1, a1=H1/2, b1=L4/2, where H1 is the thickness of the encapsulation structure layer 13 at the flat portion; L4 is the width of the curved portion 40 in the first direction X.

Figure 8C:
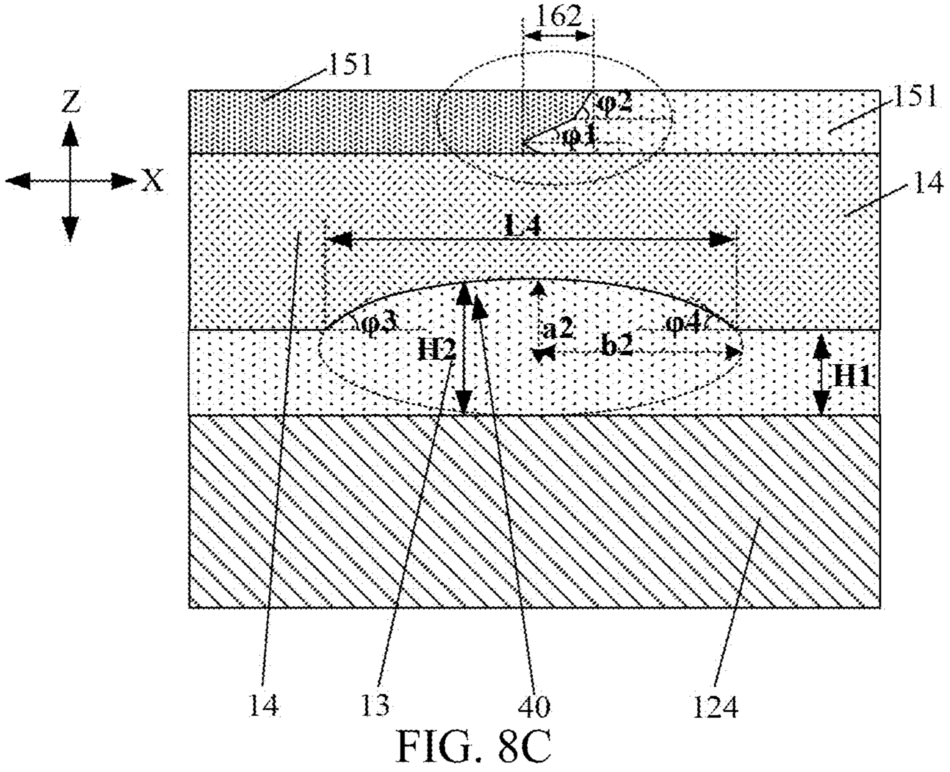

In some exemplary embodiments, as shown in FIG. 8C, a cross section of a partial region of the curved portion 40 protruding in a direction away from the base substrate is cut by a plane parallel to the first direction X and perpendicular to the base substrate 10, and this cross section is a partial region of a second ellipse having a short half-axis length a2, a long half-axis length b2, a2=H2/2, b2=L4/2, where H2 is the maximum thickness of the encapsulation structure layer 13 in a direction perpendicular to the base substrate; L4 is the width of the curved portion 40 in the first direction X.

Figure 8D:
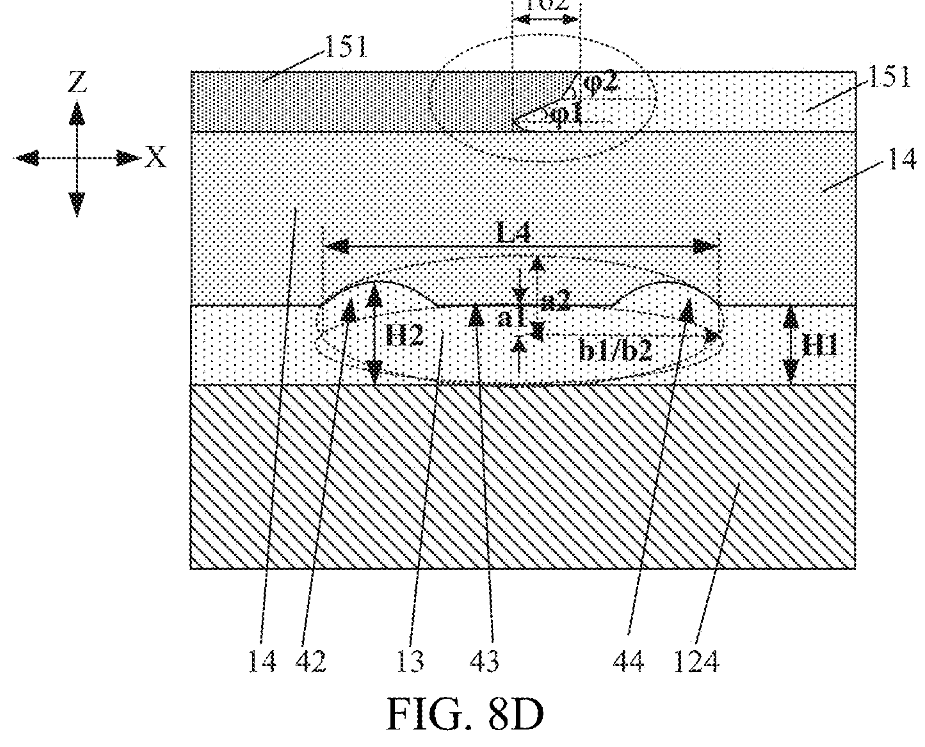

In some exemplary embodiments, as shown in FIG. 8D, the curved portion 40 may include a first curved portion 42, a transition portion 43, and a second curved portion 44 connected in sequence in a first direction X, the first curved portion 42 and the second curved portion 44 each have at least a partial region projecting from the transition portion 43 in the third direction Z. The surface of the curved portion 40 on the side away from the base substrate is located between the surface of the first ellipse on the side away from the base substrate and the surface of the second ellipse on the side away from the base substrate.

In some exemplary embodiments, as shown in FIG. 8A, the curved portion 40 may include a first ramp portion 41, a first curved portion 42, a transition portion 43, a second curved portion 44, and a second ramp portion 45 connected in sequence in a first direction X, and each of the first curved portion 42 and the second curved portion 44 protrudes from the transition portion 43 in a third direction Z.

In some exemplary embodiments, the transition portion 43 may be substantially a plane and the first ramp portion 41 and the second ramp portion 45 may be a curved surface or an inclined plane.

In some exemplary embodiments, as shown in FIG. 8A, the slope angle φ3 of the first ramp portion 41 may be between 15° and 25°, and the slope angle φ4 of the second ramp portion 45 may be between 15° and 25°.

In this paper, the gradient angle of a point on the curved surface refers to the angle between the tangent plane at the point on the curved surface and the plane parallel to the base substrate 10, and the gradient angle of the curved surface can be understood as the gradient angle range formed by the gradient angles of each point on the curved surface.

In some exemplary embodiments, as shown in FIG. 8A, the average thickness H1 of the curved portion 40 at the transition portion 43 may be between 221.3 nm and 252.9 nm.

In some exemplary embodiments, as shown in FIG. 8A, the maximum thickness H2 of the curved portion 40 at the first curved portion 42 and the second curved portion 44 may be between 276.6 nm and 316.1 nm.

In some exemplary embodiments, as shown in FIG. 8A, there is an overlapping region between the orthographic projection of the transition portion 43 on the base substrate 10 and the orthographic projection of the second color resistance portion 162 on the base substrate 10. Exemplarily, the orthographic projection of the transition portion 43 on the base substrate 10 may include the orthographic projection of the second color resistance portion 162 on the base substrate 10.

Figure 8E:
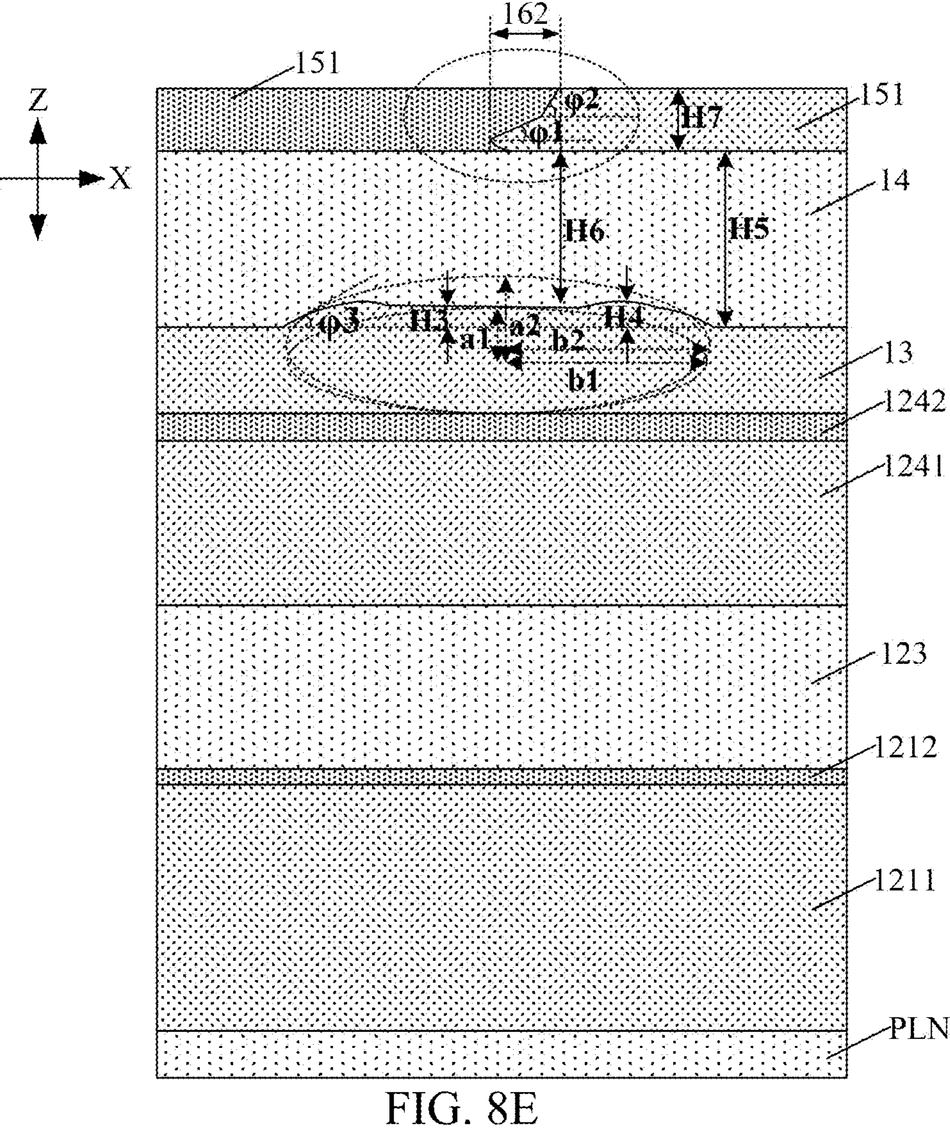
Figure 8F:
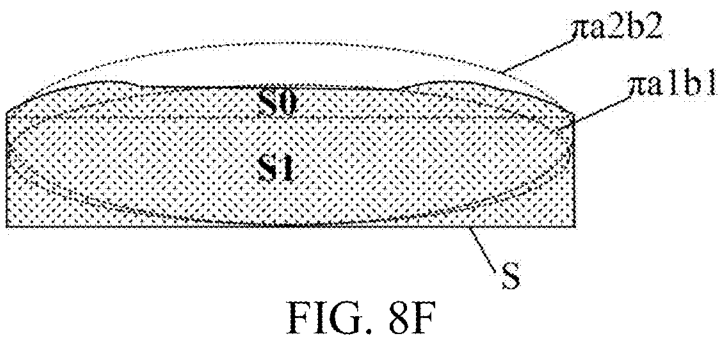

In some exemplary embodiments, as shown in FIG. 8F, in a cross section parallel to the first direction X and perpendicular to the base substrate 10, if the cross section area S of the curved portion 40 of the encapsulation structure layer 13 includes an area S0 of a partial region protruding in the direction away from the base substrate and an area S1 of a partial region not protruding in the direction away from the base substrate, the cross section area S of the curved portion 40 and an area S0 of a partial region protruding in the direction away from the base substrate satisfy the following requirements: $S=S0+S1$, $\pi a1b1<S<\pi a2b2$, $\pi a1b1+S0<\pi a2b2$;

where $a1=H1/2$, $a2>H2/2$, $b1=b2=L4/2$;

H1 is the thickness of the encapsulation structure layer 13 at the flat portion;

H2 is the maximum thickness of the encapsulation structure layer 13 in the third direction;

L4 is the width of the curved portion 40 in the first direction X;

a1 and b1 are short half-axis length and long half-axis length of the first ellipse (i.e., the largest inscribed ellipse of the curved portion 40), respectively;

a2 and b2 are the short half-axis length and the long half-axis length of the second ellipse (i.e. the smallest circumscribed ellipse of the curved portion 40) respectively.

In some exemplary embodiments, the refractive index of the color filter layer 15 may be greater than the refractive index of the dimming layer 14.

In some exemplary embodiments, the area of the surface of the dimming layer 14 in contact with the encapsulation structure layer 13 is greater than the area of the surface of the dimming layer 14 in contact with the color filter layer 15 and the color resistance layer 16.

In some exemplary embodiments, as shown in FIGS. 8A and 8E, the second color resistance portion 162 is formed at the overlapping part of the filter units 151 of two adjacent sub-pixels of different colors in the first direction X, and a slope angle φ of the interface surface of the filter units 151 of two adjacent sub-pixels of different colors in the first direction X may gradually become larger in a direction away from the base substrate 10.

In some exemplary embodiments, the interface of the filter units 151 of two sub-pixels of different colors adjacent in the first direction X may be a curved surface or may include a plurality of connected ramps.

In some exemplary embodiments, the slope angle φ of the interface of the filter units 151 of two adjacent sub-pixels of different colors in the first direction X may be between 10° and 75°.

In the embodiment of the present disclosure, the interface of the filter units 151 of two adjacent sub-pixels of different colors in the first direction X has a certain gradient, this ensures that the second color resistance portion 162 has a certain width in the first direction X, and the slope angle φ gradually increases in the direction away from the base substrate 10, so that it is advantageous for the filter unit 151 of two adjacent sub-pixels of different colors in the first direction X to maintain structural stability at the interface position.

In some exemplary embodiments, As shown in FIGS. 8A and 8E, the interface of the filter units 151 of two sub-pixels of different colors adjacent in the first direction X may include a first interface and a second interface connected in sequence in a direction away from the base substrate 10, the slope angle φ1 of the first interface may be between 28° and 32°, and the slope angle φ2 of the second interface may be between 55° and 65°. In some exemplary embodiments, the first interface and the second interface may be inclined planes. In other exemplary embodiments, the first interface and the second interface may be curved surfaces.

In some exemplary embodiments, the encapsulation structure layer 13 may be a single film layer formed using a chemical vapor deposition (CVD) process, and the material of the encapsulation structure layer 13 may include nitrogen (N) and silicon (Si) elements.

In some exemplary embodiments, the average thickness of the encapsulation structure layer 13 may be between 4.24 um and 6.36 um. Exemplarily the average thickness of the encapsulation structure layer 13 may be about 5.3 um.

In some exemplary embodiments, the material of the dimming layer 14 may include carbon (C), oxygen (O) and silicon (Si) elements.

In some exemplary embodiments, the average thickness of the dimming layer 14 may be 6.72 um to 10.08 um. Exemplarily the average thickness of the dimming layer 14 may be about 8.4 um.

In some exemplary embodiments the material of the color filter layer 15 may include carbon (C) and aluminum (Al) elements.

In some exemplary embodiments the average thickness of the color filter layer 15 may be between 1.84 um and 2.76 um. Exemplarily the average thickness of the color filter layer 15 may be about 2.3 um.

In some exemplary embodiments the dimming layer 14 may be an adhesive layer such as an optically transparent adhesive (such as Optically Clear Resin (OCR)).

In some exemplary embodiments, the display panel may further include a cover plate on a side of which a color filter layer 15 and a color resistance layer 16 may be disposed, and the side of the cover plate provided with the color filter layer 15 and the color resistance layer 16 is bonded to the side of the encapsulation structure layer 13 facing away from the base substrate 10 through the dimming layer 14. The cover plate may be a rigid or flexible transparent material, such as glass or the like. In preparing the display panel, a first substrate and a second substrate can be respectively prepared, the first substrate includes a base substrate 10 and a driving structure layer 11, a light emitting structure layer 12, a encapsulation structure layer 13 which are sequentially stacked on the base substrate 10, and the second substrate includes a second substrate and a color resistance layer 16 and a color filter layer 15 arranged sequentially on the second substrate. Then, adhesive is coated on the first substrate and/or the second substrate to form a dimming layer 14, and the first substrate and the second substrate are aligned and fit by the dimming layer 14 to form a display panel of the embodiment of the present disclosure.

In other exemplary embodiments, the color filter layer 15 and the color resist layer 16 may be formed directly on the surface of the dimming layer 14 away from the base substrate 10. In preparing a display panel, a driving structure layer 11, a light emitting structure layer 12, a encapsulation structure layer 13, a light dimming layer 14, a color resistance layer 16, and a color filter layer 15 may be sequentially prepared on a base substrate 10, and a cover plate may be provided on a side of the color resistance layer 16 and the color filter layer 15 away from the base substrate to form a display panel of the embodiment of the present disclosure.

Although none of the display panels shown in FIGS. 8A to 8E has a structure of a display cover plate, the display panels shown in FIGS. 8A to 8E can be prepared using any of the above preparation methods.

In some exemplary embodiments, the material of the planarization layer (PLN) may include carbon (C), fluorine (F), oxygen (O), and nitrogen (N) elements.

In an exemplary embodiment, the first electrode layer may be of a single-layer structure or a multi-layer structure.

In some exemplary embodiments, the first electrode layer may include a first sub-first electrode layer 1211 and a second sub-first electrode layer 1212 disposed on a side of the first sub-first electrode layer 1211 away from the base substrate, wherein the material of the first sub-first electrode layer 1211 may include an aluminum (Al) element and the material of the second sub-first electrode layer 1212 may include ytterbium (Yb), silicon (Si) and oxygen (O) elements.

In some exemplary embodiments, the average thickness of the first sub-first electrode layer 1211 is greater than the average thickness of the second sub-first electrode layer 1212.

In some exemplary embodiments, the average thickness of the first sub-first electrode layer 1211 is between 164.8 nm and 247.2 nm. Exemplarily the average thickness of the first sub-first electrode layer 1211 may be about 206 nm.

In some exemplary embodiments, the average thickness of the second sub-first electrode layer 1212 is between 12.56 nm and 18.84 nm. Exemplarily the average thickness of the second sub-first electrode layer 1212 may be about 15.7 nm.

In some exemplary embodiments, at least one pixel unit includes a first sub-pixel emitting a first color light, a second sub-pixel emitting a second color light, a third sub-pixel emitting a third color light.

The thickness of the light emitting function layer 123 of the first sub-pixel emitting the first color light is greater than the thickness of the light emitting function layer 123 of the second sub-pixel emitting the second color light, and the thickness of the light emitting function layer 123 of the second sub-pixel emitting the second color light is greater than the thickness of the light emitting function layer 123 of the third sub-pixel emitting the third color light.

In some exemplary embodiments, the thickness of the light emitting function layer 123 of the first sub-pixel emitting a first color light (e.g. red light) may be between 120.8 nm and 181.2 nm, the thickness of the light emitting function layer 123 of the second sub-pixel emitting a second color light (e.g. green light) may be between 83.2 nm and 124.8 nm, and the thickness of the light emitting function layer 123 of the third sub-pixel emitting a third color light (e.g. blue light) may be between 46.4 nm and 69.6 nm.

In some exemplary embodiments, the thickness of the light emitting function layer 123 of a first sub-pixel emitting a first color light (e.g. red light) may be 151 nm, the thickness of the light emitting function layer 123 of a second sub-pixel emitting a second color light (e.g. green light) may be 104 nm, and the thickness of the light emitting function layer 123 of a third sub-pixel emitting a third color light (e.g. blue light) may be 58 nm.

In an exemplary embodiment, the second electrode layer may be of a single-layer structure or a multi-layer structure.

In some exemplary embodiments, the second electrode layer may include a first sub-second electrode layer 1241 and a second sub-second electrode layer 1242 disposed on a side of the first sub-second electrode layer 1241 away from the base substrate, wherein the material of the first sub-second electrode layer 1241 may include indium (In), zinc (Zn) and oxygen (O) elements, and the material of the second sub-second electrode layer 1242 may include silver (Ag) elements.

In some exemplary embodiments, the average thickness of the first sub-second electrode layer 1241 is greater than the average thickness of the second sub-second electrode layer 1242.

In some exemplary embodiments the average thickness of the first sub-second electrode layer 1241 is between 63.28 nm and 94.92 nm. Exemplarily the average thickness of the first sub-second electrode layer 1241 may be about 79.1 nm.

In some exemplary embodiments the average thickness of the second sub-second electrode layer 1242 is between 13.6 nm and 20.4 nm. Exemplarily the average thickness of the second sub-second electrode layer 1242 may be about 17 nm.

Figure 9:
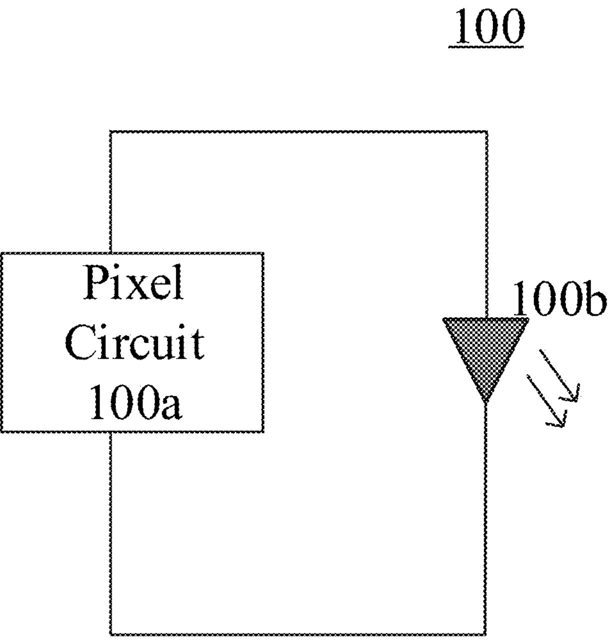
FIG. 9 is a schematic diagram of a pixel circuit in a display panel driving a light emitting element to emit light.

FIG. 9 is a schematic diagram of a pixel driving circuit in a display panel driving a light emitting element to emit light according to an embodiment of the present disclosure. As shown in FIG. 9, each sub-pixel 100 includes a pixel driving circuit **100*a* and a light emitting element 100*b*, the pixel driving circuit 100*a* is connected to the light emitting element 100*b* and the pixel driving circuit 100*a* is configured to drive the light emitting element 100*b*. For example, the pixel driving circuit is configured to drive the light emitting element to emit light. The light emitting element 100*b* includes a light emitting area. The pixel arrangement shown in FIG. 1 refers to the setting position of the light emitting region of the light emitting element 100*b* in the sub-pixel 100**.

Figure 10:
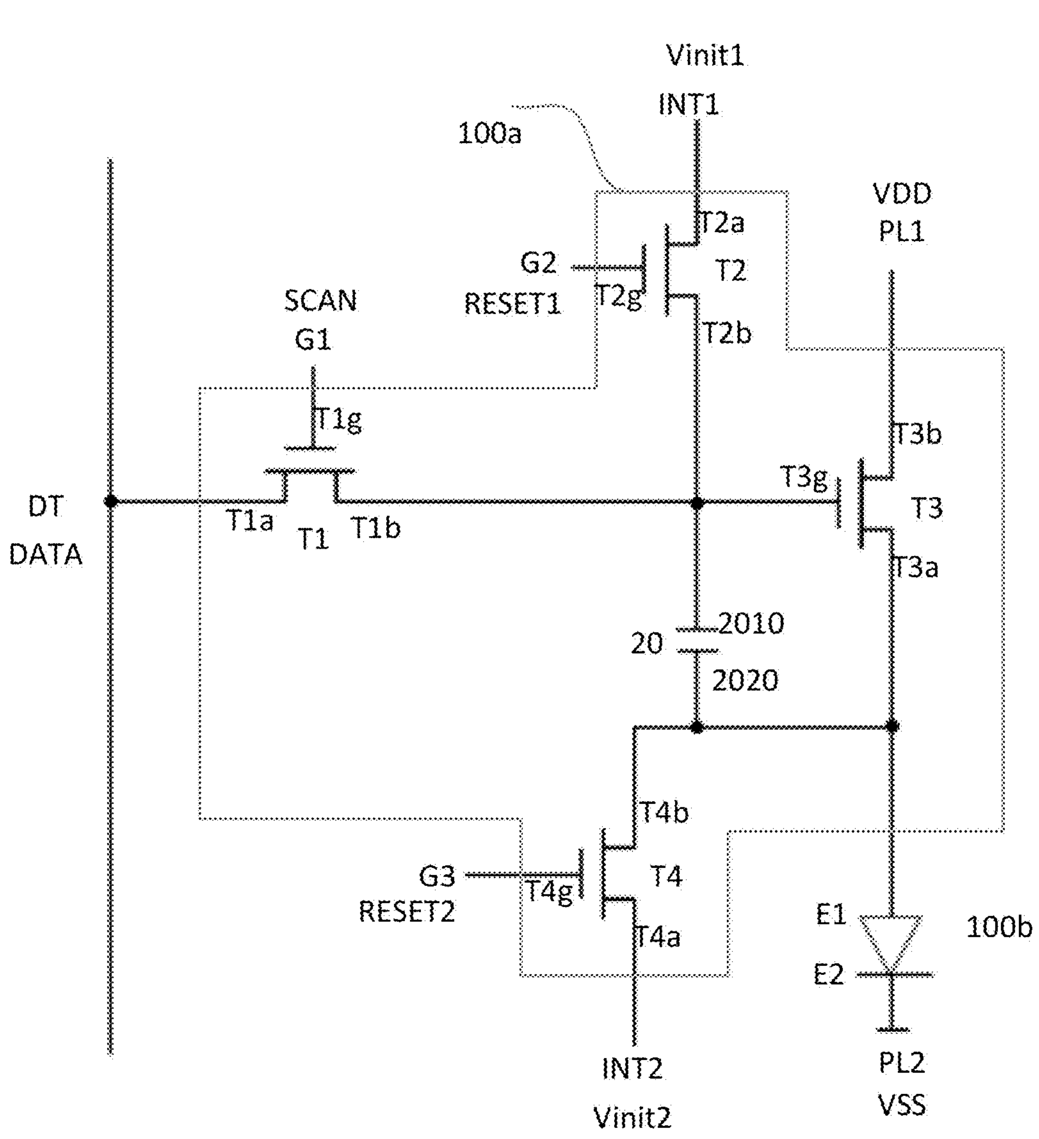
FIG. 10 is a schematic diagram of a pixel driving circuit and a light emitting element in one sub-pixel according to an exemplary embodiment of the present disclosure.
Figure 11:
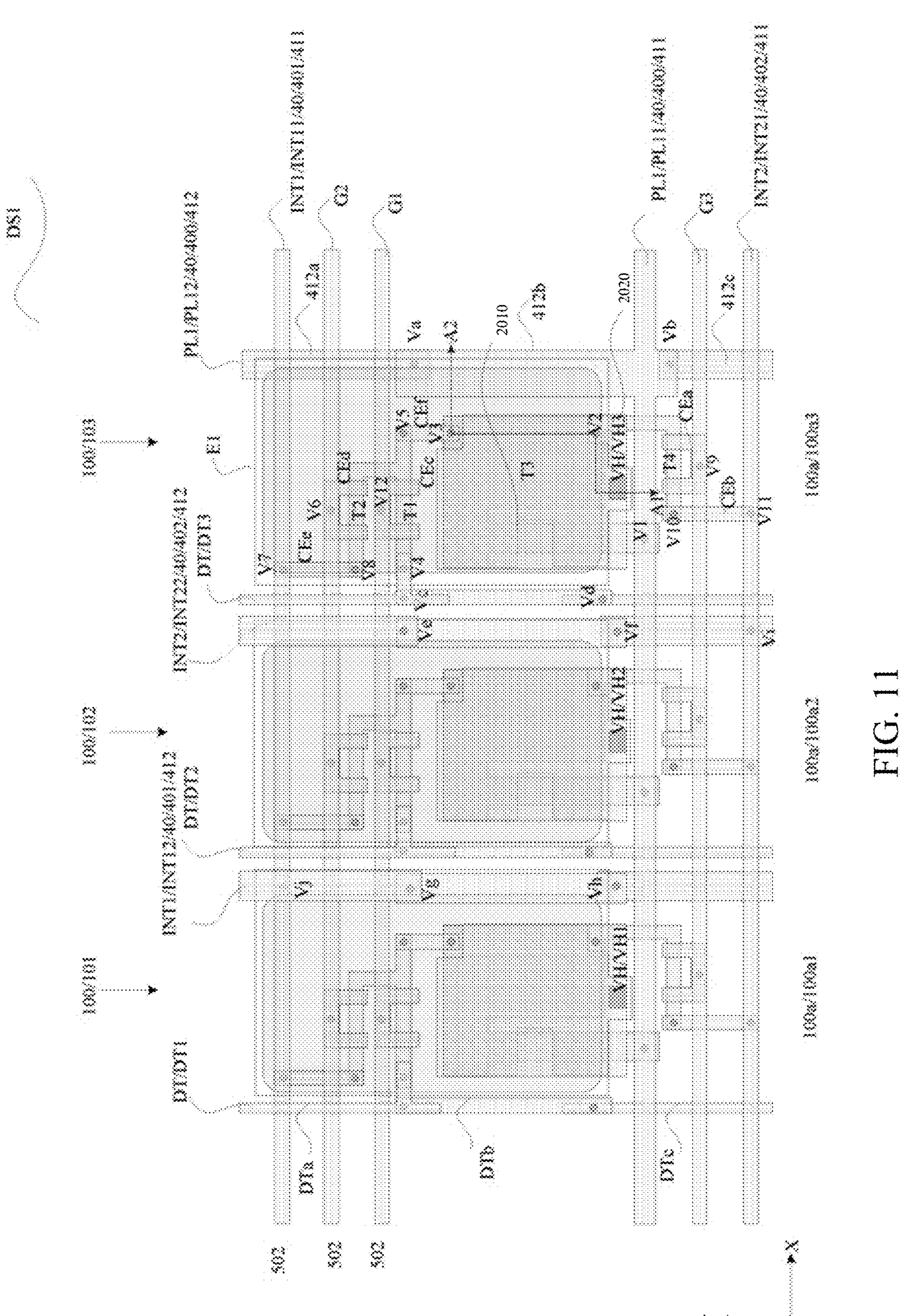
FIG. 11 is a schematic diagram of a layout of a display panel provided by some exemplary embodiments of the present disclosure.
Figure 12:
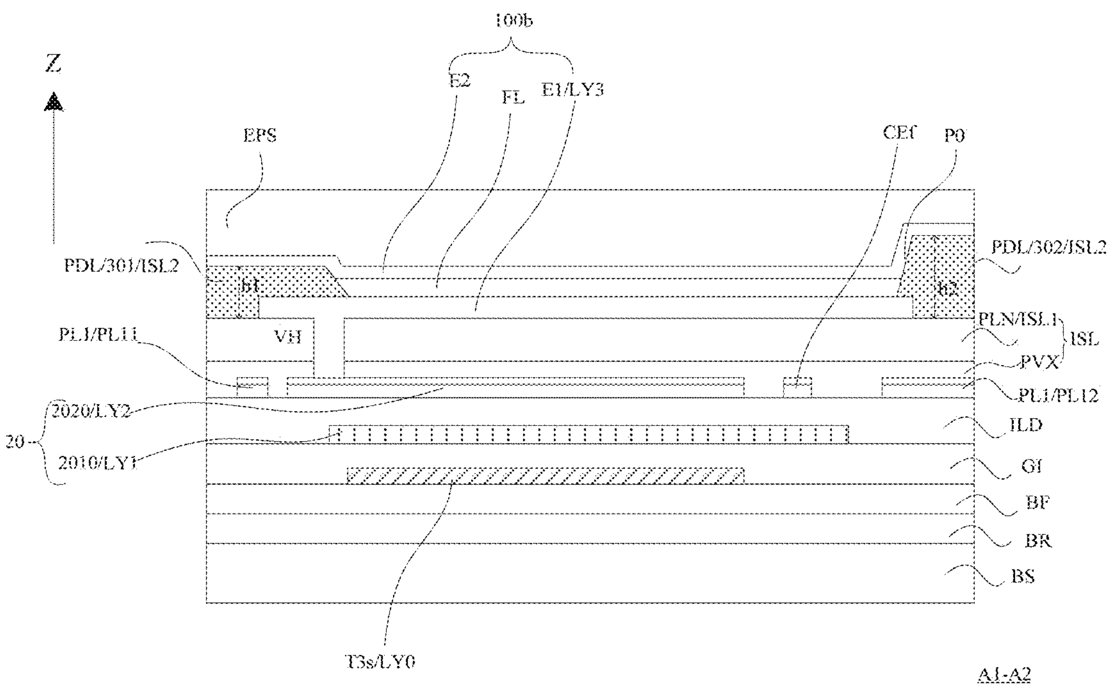
FIG. 12 is a schematic diagram of a sectional view along an A1-A2 region in FIG. 11.

FIG. 10 is a schematic diagram of a pixel driving circuit and a light emitting element in one sub-pixel according to an embodiment of the present disclosure; FIG. 11 is a schematic diagram of a layout of a display panel provided by an embodiment of the present disclosure. FIG. 11 shows a display panel DS1. FIG. 12 is a schematic diagram of a sectional view along an A1-A2 region in FIG. 11. FIGS. 13A to 13G are each a plan of a single layer of the display panel in FIG. 11. FIGS. 14A to 14D are each a plan of partial lamination of a display panel in FIG. 11.

In some exemplary embodiments, as shown in FIGS. 10 and 11, in the sub-pixel 100, the pixel driving circuit **100*a* includes a first transistor T1 (data input transistor), a second transistor T2 (reset transistor), a third transistor T3 (drive transistor), a fourth transistor T4 (reset transistor), and a storage capacitor 20, the light emitting element 100*b* is connected to the third transistor T3. The second transistor T2 is configured to reset the gate electrode T3***g* of the third transistor T3, and the fourth transistor T4 is configured to reset the first electrode E1 of the light emitting element **100*b*. As shown in FIGS. 10 and 11 the storage capacitor 20 includes at least a first electrode plate 2010 and a second electrode plate 2020. In some exemplary implementations, the first transistor T1, the second transistor T2, the third transistor T3 and the fourth transistor T4 are all N-type thin film transistors. In other exemplary embodiments, at least one transistor among the first transistor T1, the second transistor T2, the third transistor T3, and the fourth transistor T4** is a P-type transistor.

As shown in FIGS. 10 and 11, the display panel includes a first gate line G1, a second gate line G2, a third gate line G3, a data line DT, a first power line PL1, a second power line PL2, a first initial signal line INT1, a second initial signal line INT2, and the like. The second gate line G2 and the third gate line G3 may also be referred to as a reset control signal line RST. In some examples, the first power line PL1 is configured to provide a constant first voltage signal VDD to a pixel circuit, the second power line PL2 is configured to provide a constant second voltage signal VSS to a pixel circuit, and the first voltage signal VDD is greater than the second voltage signal VSS. The first gate line G1 is configured to supply the scan signal SCAN to the sub-pixel 100, the second gate line G2 is configured to supply the first reset control signal RESET1 to the sub-pixel 100, the third gate line G3 is configured to supply the second reset control signal RESET2 to the sub-pixel 100, and the data line DT is configured to supply the data signal (DATA voltage) DATA to the sub-pixel 100. The first initial signal line INT1 is configured to provide a first initial signal Vinit1 to the sub-pixel 100. The second initial signal line INT2 is configured to provide a second initial signal Vinit2 to the sub-pixel 100. For example, the first initialization signal Vinit1 and the second initialization signal Vinit2 are constant voltage signals, the magnitude of which may be, for example, between the first voltage signal VDD and the second voltage signal VSS, but is not limited thereto, for example, the first initialization signal Vinit1 and the second initialization signal Vinit2 may both be less than or equal to the second voltage signal VSS. For example, in some embodiments of the present disclosure, the first initial signal line INT1 and the second initial signal line INT2 are connected and each is configured to provide an initialization signal Vinit to the sub-pixel 100, that is, the first initial signal line INT1 and the second initial signal line INT2 are both referred to as an initialization signal line INT, and the first initialization signal Vinit1 and the second initialization signal Vinit2 are equal and both are Vinit, but are not limited thereto. In other embodiments the first initial signal line INT1 and the second initial signal line INT2 are insulated from each other to provide different initialization signals.

As shown in FIG. 10 and FIG. 11, the third transistor T3 is electrically connected to the light emitting element 100*b*, and outputs a driving current under the control of signals such as the scan signal SCAN, the data signal DATA, the first voltage signal VDD, and the second voltage signal VSS for driving the light emitting element 100*b* to emit light.

For example, the light emitting element 100*b* includes an organic light emitting diode (OLED), and the light emitting element emits red light, green light, blue light, or white light, etc. under drive of its corresponding pixel driving circuit 100*a*.

In some exemplary embodiments, as shown in FIGS. 10 and 11, a first electrode E1 of the light emitting element 100*b* is connected to a first electrode T3*a* of the third transistor T3, the second electrode E2 of the light emitting element 100*b* is connected to the second power line PL2, the second electrode T3*b* of the third transistor T3 is connected to the first power line PL1, the gate electrode T3*g* of the third transistor T3 is connected to the second electrode T1*b* of the first transistor T1, the first electrode T1*a* of the first transistor T1 is connected to the data line DT, and the gate electrode T1*g* of the first transistor T1 is connected to the first gate line G1.

In some exemplary embodiments, as shown in FIGS. 10 and 11, the gate electrode T3*g* of the third transistor T3 is connected to the first electrode plate 2010 of the storage capacitor 20, and the second electrode plate 2020 of the storage capacitor 20 is connected to the first electrode T3*a* of the third transistor T3. The first electrode plate 2010 of the storage capacitor 20 is also connected to the second electrode T1*b* of the first transistor T1.

In some exemplary embodiments, as shown in FIGS. 10 and 11, the first electrode T2*a* of the second transistor T2 is connected to the first initial signal line INT1, the second electrode T2*b* of the second transistor T2 is connected to the gate electrode T3*g* of the third transistor T3, and the gate electrode T2*g* of the second transistor T2 is connected to the second gate line G2.

In some exemplary embodiments, as shown in FIGS. 10 and 11, the first electrode T4*a* of the fourth transistor T4 is connected to the second initial signal line INT2, the second electrode T4*b* of the fourth transistor T4 is connected to the first electrode E1 of the light emitting element 100*b*, and the gate electrode T4*g* of the fourth transistor T4 is connected to the third gate line G3.

In some exemplary embodiments, as shown in FIG. 12, the display panel includes a base substrate BS, a barrier layer BR on the base substrate BS, and a buffer layer BF. As shown in FIG. 12, the buffer layer BF is provided with an active semiconductor layer LY0, a gate insulating layer GI is located on the active semiconductor layer LY0, a first conductive pattern layer LY1 is located on the gate insulating layer GI, an interlayer insulating layer ILD is located on the first conductive pattern layer LY1, a second conductive pattern layer LY2 is located on the interlayer insulating layer ILD, an insulating layer ISL is located on the second conductive pattern layer LY2, and a first electrode layer LY3 is located on the insulating layer ISL. FIG. 12 also shows the channel T3*s* of the third transistor T3 in the active semiconductor layer LY0.

As shown in FIGS. 11 and 12, the display panel further includes a pixel define layer (PDL), the sub-pixel 100 includes a plurality of pixel openings P0 configured to expose at least a part of the first electrode E1, and the pixel opening P0 is configured to define a light emitting area of the sub-pixel 100.

In some exemplary embodiments, the slope angle of the part of the pixel define layer PDL that defines the pixel opening P0 is 40-65 degrees.

In an embodiment of the present disclosure, a plan view shows a first direction X and a second direction Y, and a cross-sectional view shows a third direction Z. The first direction X and the second direction Y are both directions parallel to the main surface of the base substrate BS. The third direction Z is a direction perpendicular to the main surface of the base substrate BS. For example, the first direction X and the second direction Y intersect. Embodiments of the present disclosure are described with the first direction X and the second direction Y being perpendicular as an example. As shown in FIG. 12, the main surface of the base substrate BS is the surface of the base substrate BS on which each element is fabricated. As shown in FIG. 12, the upper surface of the base substrate BS is the main surface of the base substrate BS.

In some exemplary embodiments, as shown in FIG. 11, the plurality of sub-pixels 100 includes a first sub-pixel 101, a second sub-pixel 102, and a third sub-pixel 103, and the first sub-pixel 101, the second sub-pixel 102, and the third sub-pixel 103 are sequentially arranged in a first direction X. Of course, sub-pixels within a pixel can be arranged in other ways.

Figure 13A:
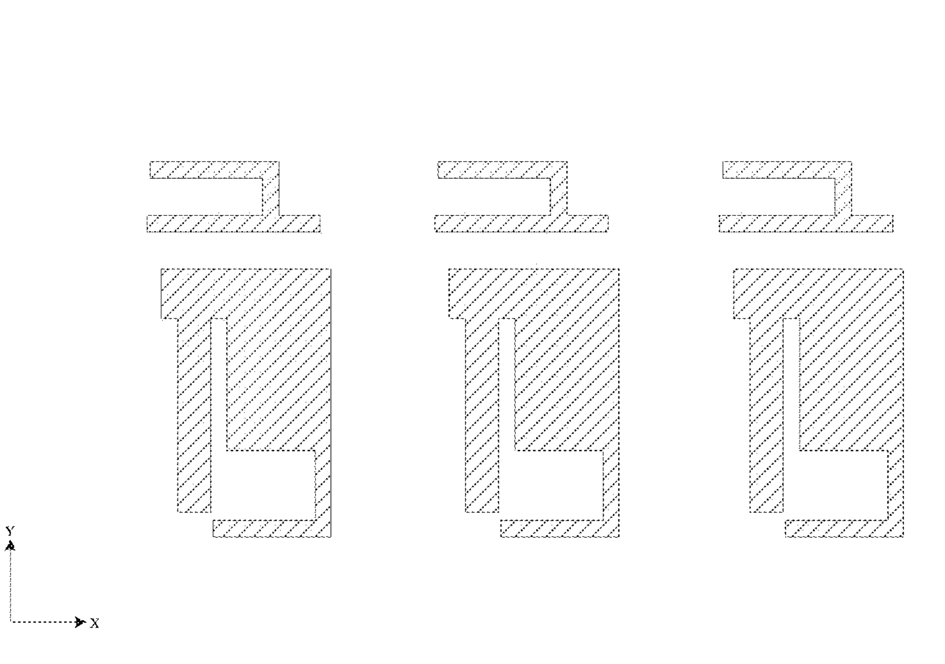
Figure 13B:
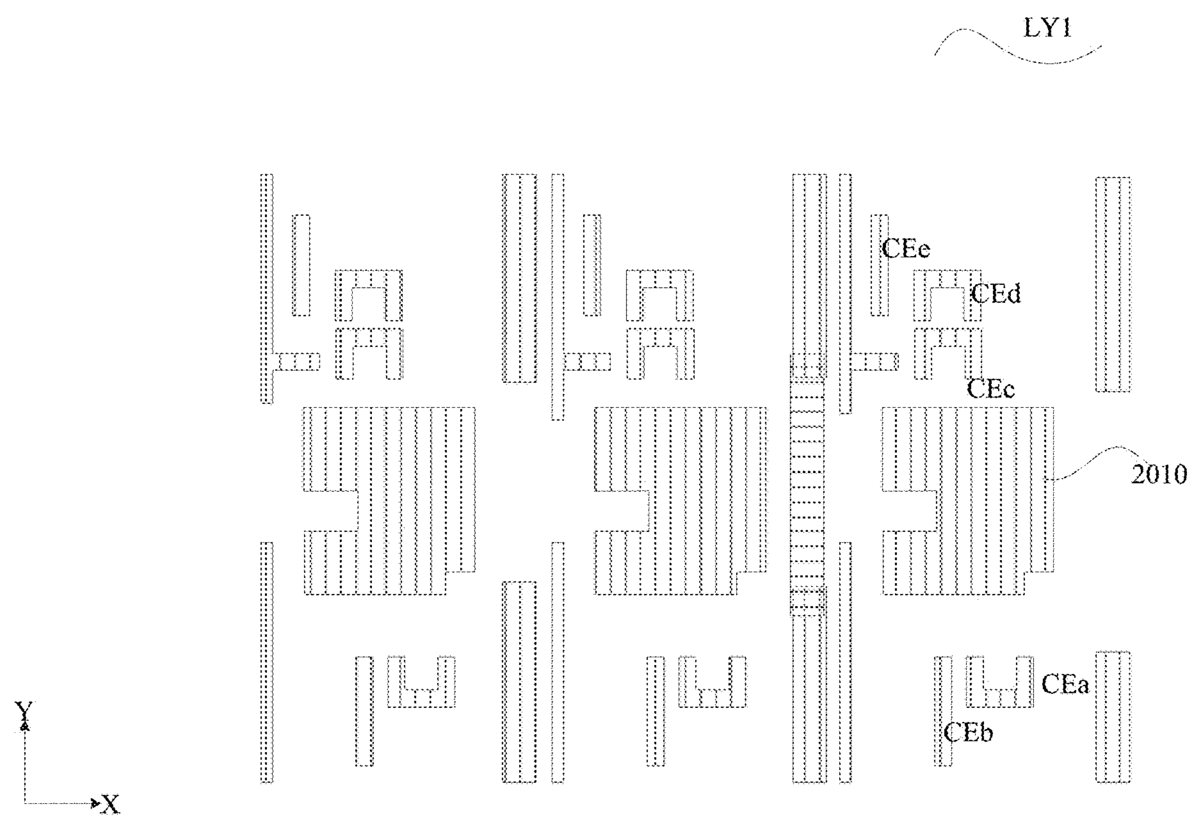
Figure 13C:
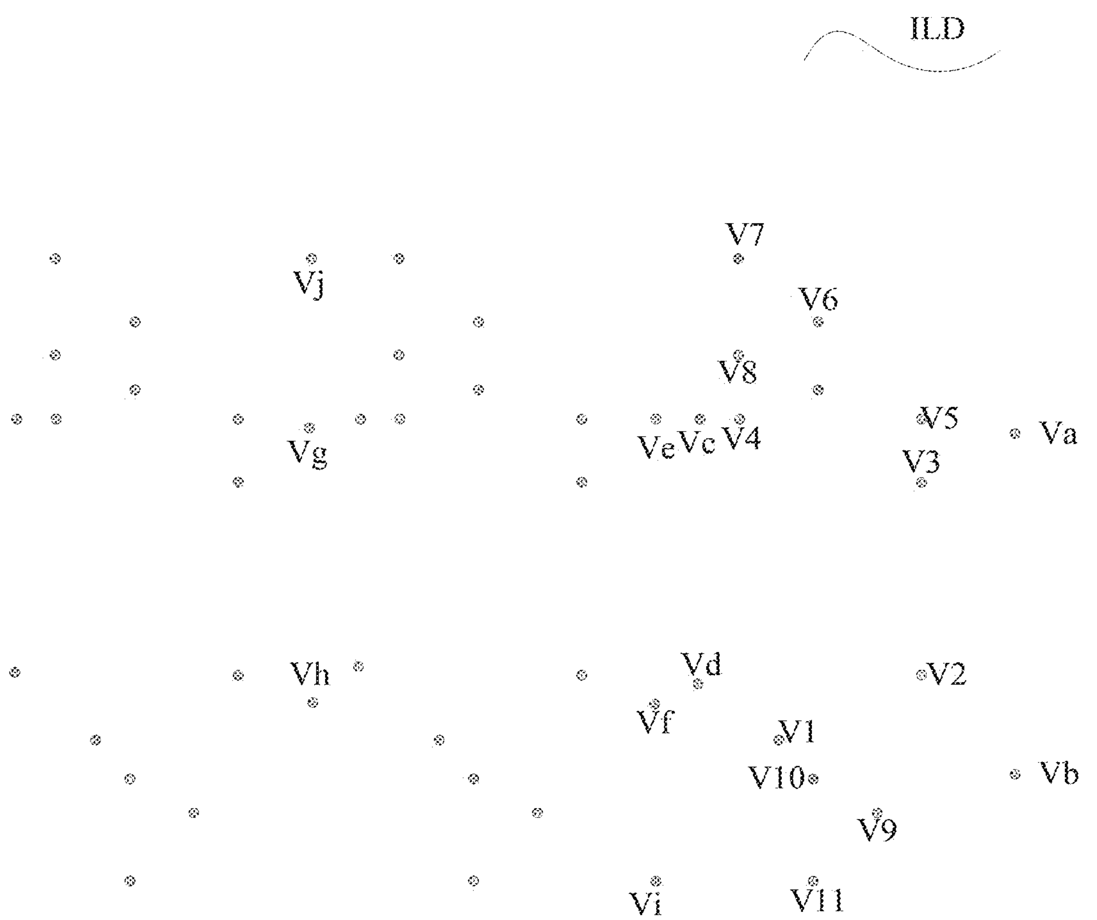
Figure 13D:
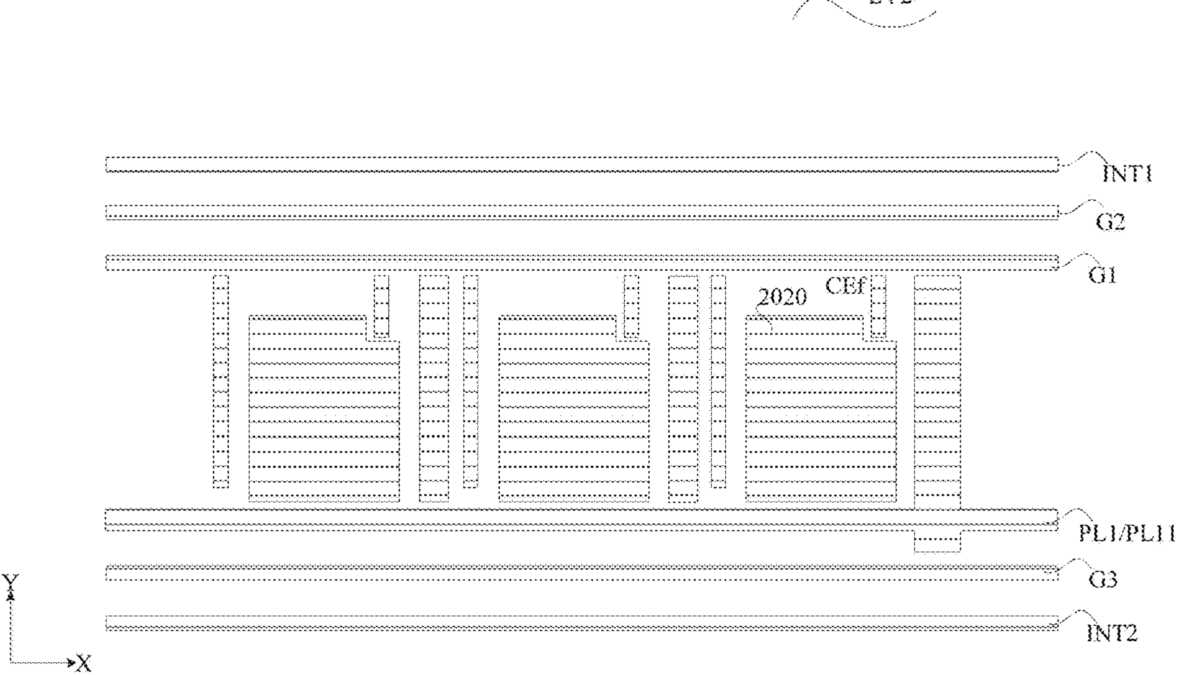
Figure 13E:
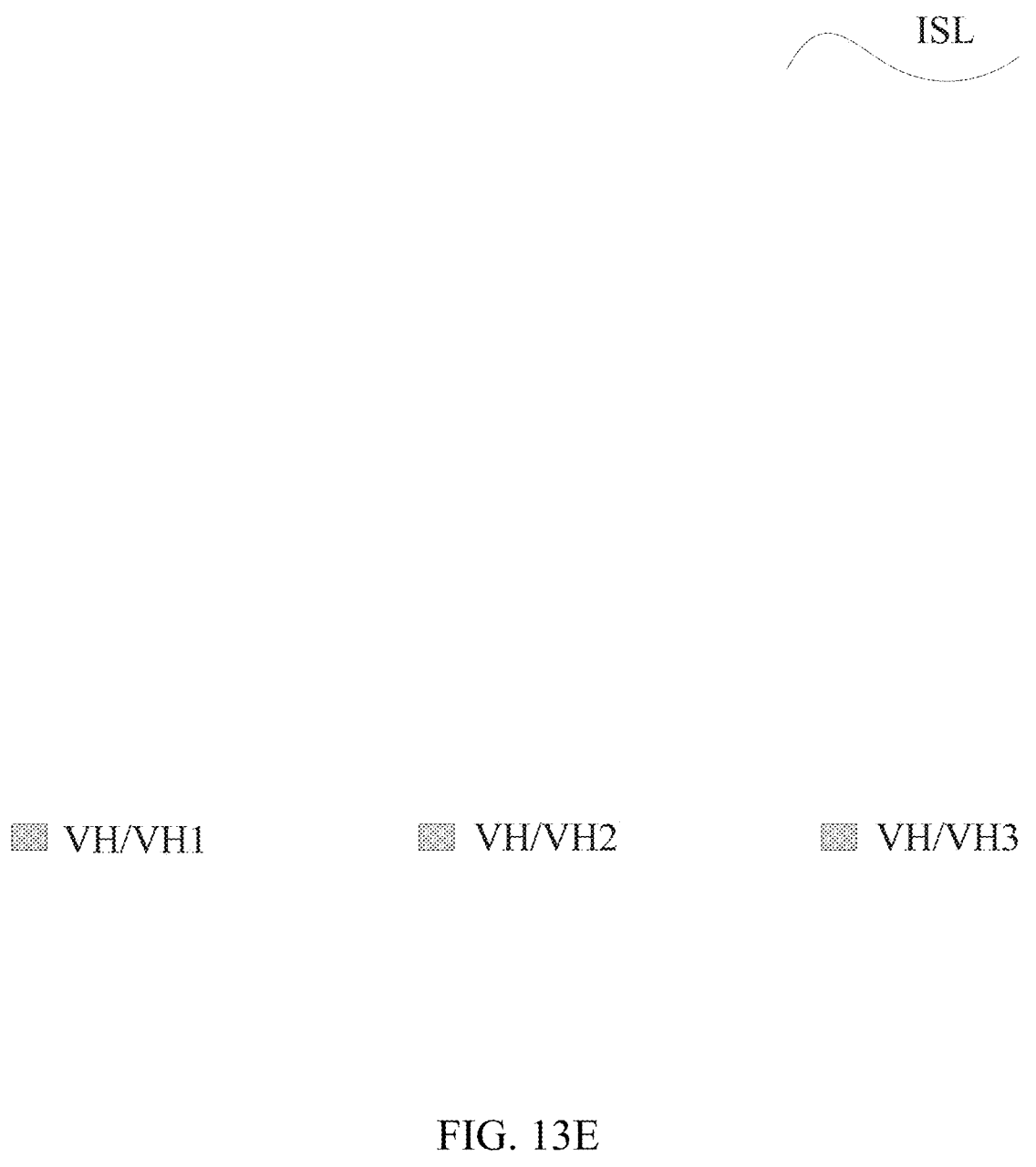
Figure 13F:
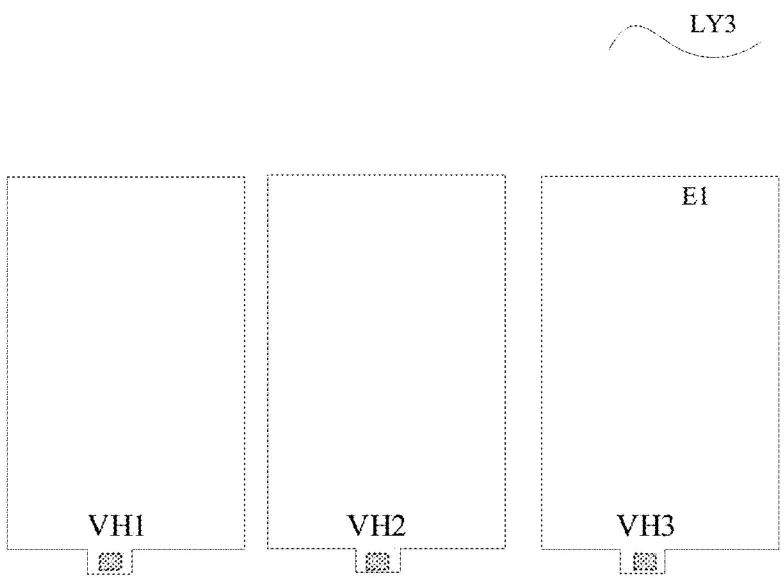
Figure 13G:
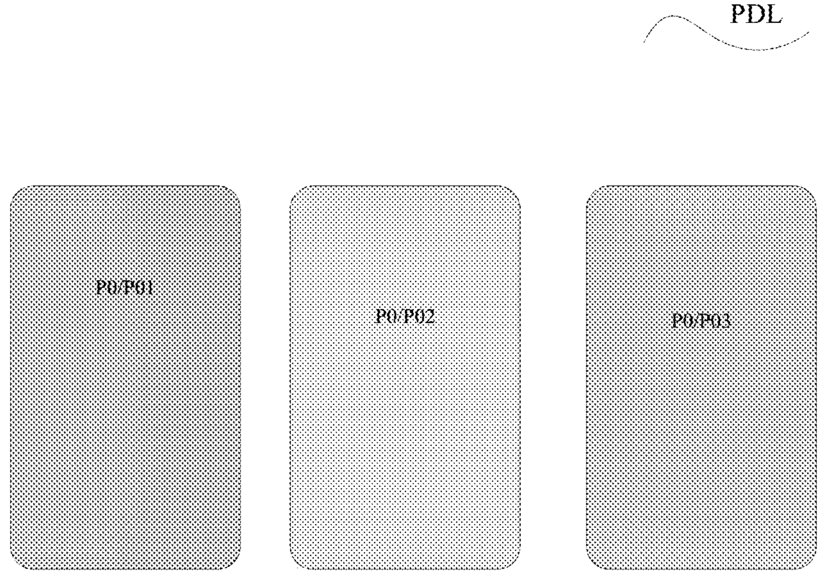

FIG. 13G shows a pixel opening P01 of a first sub-pixel 101, a pixel opening P02 of a second sub-pixel 102, and a pixel opening P03 of a third sub-pixel 103. In some exemplary embodiments, the pixel opening P01 may be referred to as the first pixel opening P01, the pixel opening P02 as the second pixel opening P02, and the pixel opening P03 as the third pixel opening P03.

FIG. 13A shows the active semiconductor layer LY0. In some exemplary embodiments the active semiconductor layer LY0 includes but is not limited to polysilicon.

FIG. 13B shows the first conductive pattern layer LY1. In some exemplary embodiments, as shown in FIG. 13B, the first conductive pattern layer LY1 includes a first electrode plate 2010, a first connection electrode CEa, a second connection electrode CEb, a third connection electrode CEc, a fourth connection electrode CEd, and a fifth connection electrode CEe.

FIG. 13C shows the interlayer insulating layer ILD, the interlayer insulating layer ILD is shown by via holes in the interlayer insulating layer ILD. FIG. 13C shows the first via hole V1 to the eleventh via hole V11 and the twelfth via hole Va to the twenty-first via hole Vj.

FIG. 13D shows the second conductive pattern layer LY2. In some exemplary embodiments as shown in FIG. 13D the second conductive pattern layer LY2 includes a second electrode plate 2020 and a sixth connection electrode CEf.

FIG. 13E shows the insulating layer ISL, the insulating layer ISL is shown by vias VH in the insulating layer ISL. In some exemplary embodiments, as shown in FIG. 13E, the Vias VH in the insulating layer ISL includes a twenty-second Via VH1, a twenty-third Via VH2, and a twenty-fourth Via VH3.

FIG. 13F shows the first electrode layer LY3 of the light emitting element. FIG. 13F shows three first electrodes E1.

FIG. 13G shows a pixel define layer PDL, which is shown with a pixel opening P0 in the pixel define layer PDL. When the display panel fabricates at least one film layer of the light emitting function layer FL by an ink jet printing process, the film layer fabricated by the ink jet printing is positioned in the pixel opening P0 of the pixel define layer PDL.

In some exemplary embodiments, as shown in FIGS. 10, 11, 13A to 13G, and 14A to 14D, the first connection electrode CEa is connected to the third gate line G3 through the ninth via V9, and the first connection electrode CEa serves as the gate electrode of the fourth transistor T4.

In some exemplary embodiments, as shown in FIGS. 10, 11, 13A to 13G, and 14A to 14D, one end of the second connection electrode CEb is connected to the second initial signal line INT2 through the eleventh via V11, and the other end of the second connection electrode CEb is connected to the first electrode T4*a* of the fourth transistor T4 through the tenth via V10.

In some exemplary embodiments, as shown in FIGS. 10, 11, 13A to 13G, and 14A to 14D, the third connection electrode CEc is connected to the first gate line G1 through the twelfth via V12, and the third connection electrode CEc serves as the gate electrode of the first transistor T1.

In some exemplary embodiments, as shown in FIGS. 10, 11, 13A to 13G, and 14A to 14D, the fourth connection electrode CEd is connected to the second gate line G2 through the sixth via V6, and the fourth connection electrode CEd serves as the gate electrode of the second transistor T2.

In some exemplary embodiments, as shown in FIGS. 10, 11, 13A to 13G, and 14A to 14D, one end of the fifth connection electrode CEe is connected to the first initial signal line INT1 through a seventh via V7, and the other end of the fifth connection electrode CEe is connected to the first electrode T2*a* of the second transistor T2 through an eighth via V8.

In some exemplary embodiments, as shown in FIGS. 10, 11, 13A to 13G, and 14A to 14D, one end of the sixth connection electrode CEf is connected to the first electrode plate 2010 through a third via V3, and the other end of the sixth connection electrode CEf is connected to the second electrode T1*b* of the first transistor T1 through a fifth via V5.

Figure 14A:
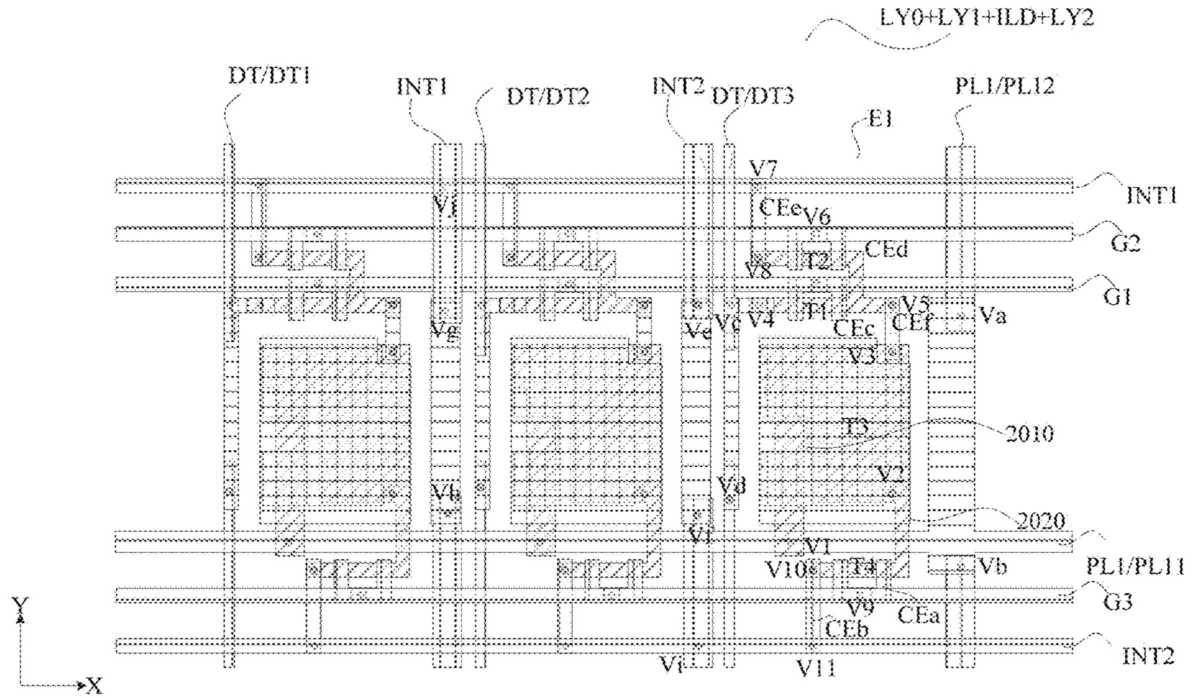
FIGS. 14A to 14D are each a schematic diagram of a plan of partial lamination of a display panel in FIG. 11.
Figure 14B:
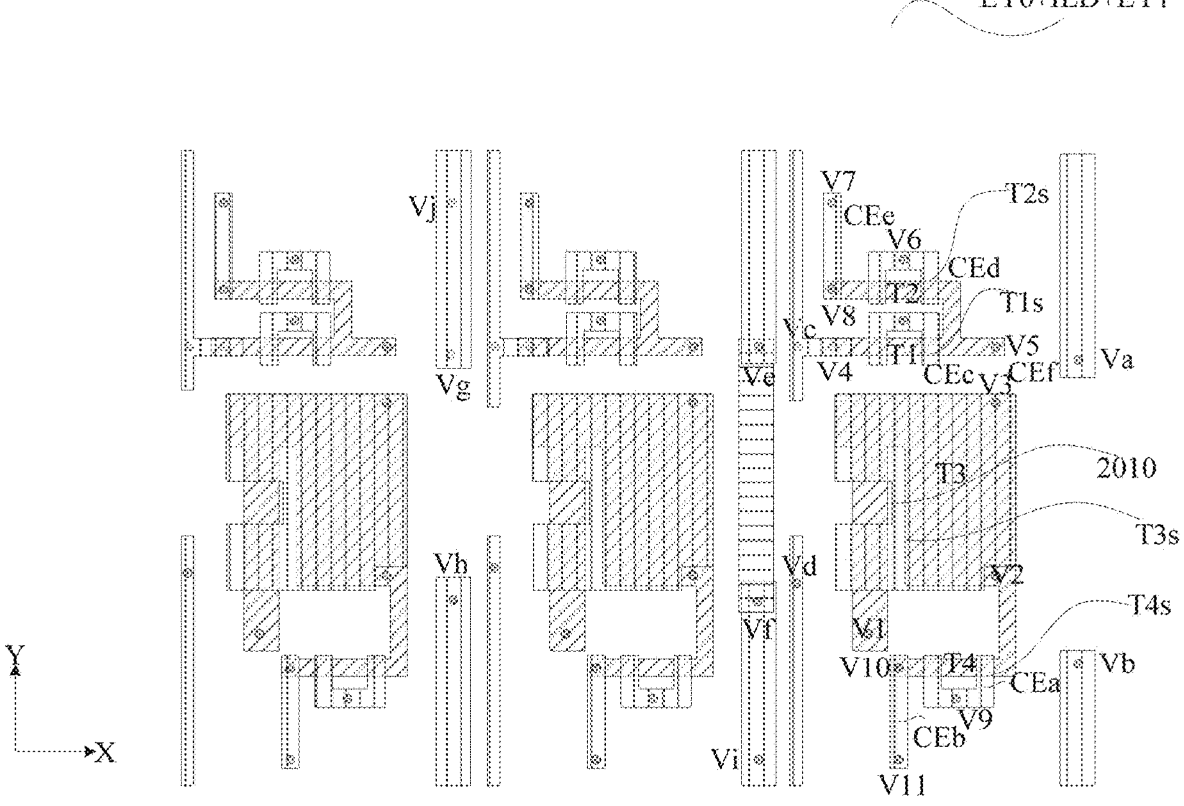
Figure 14C:
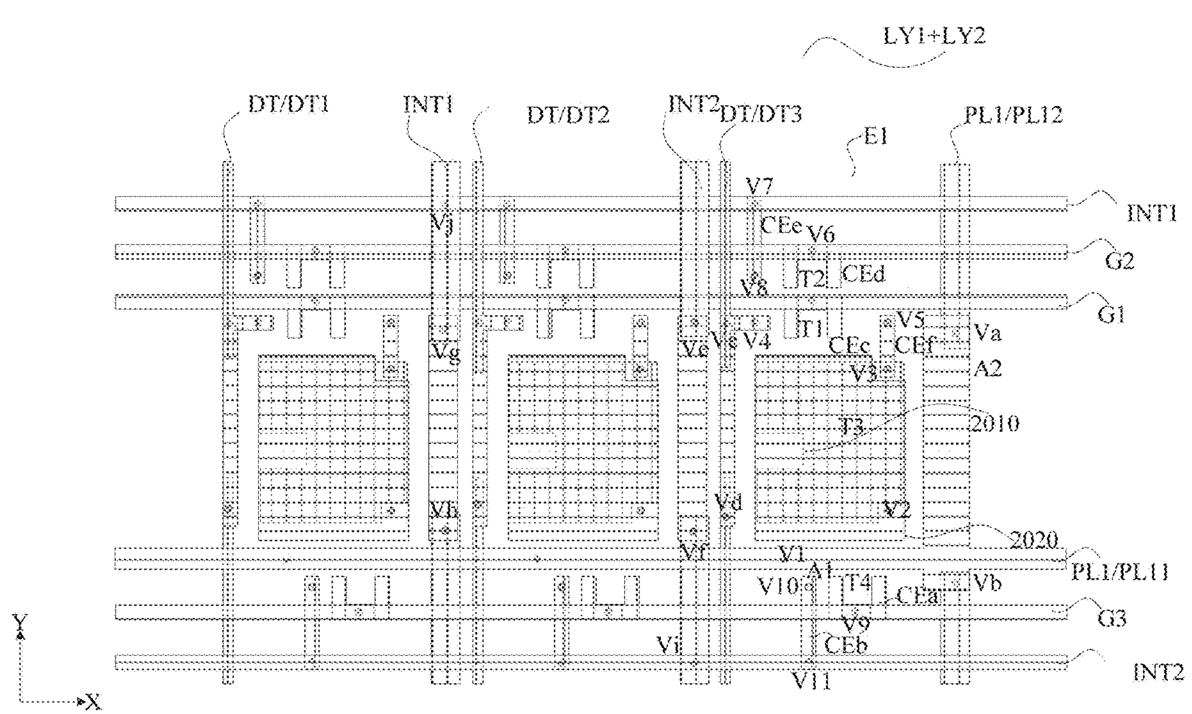
Figure 14D:
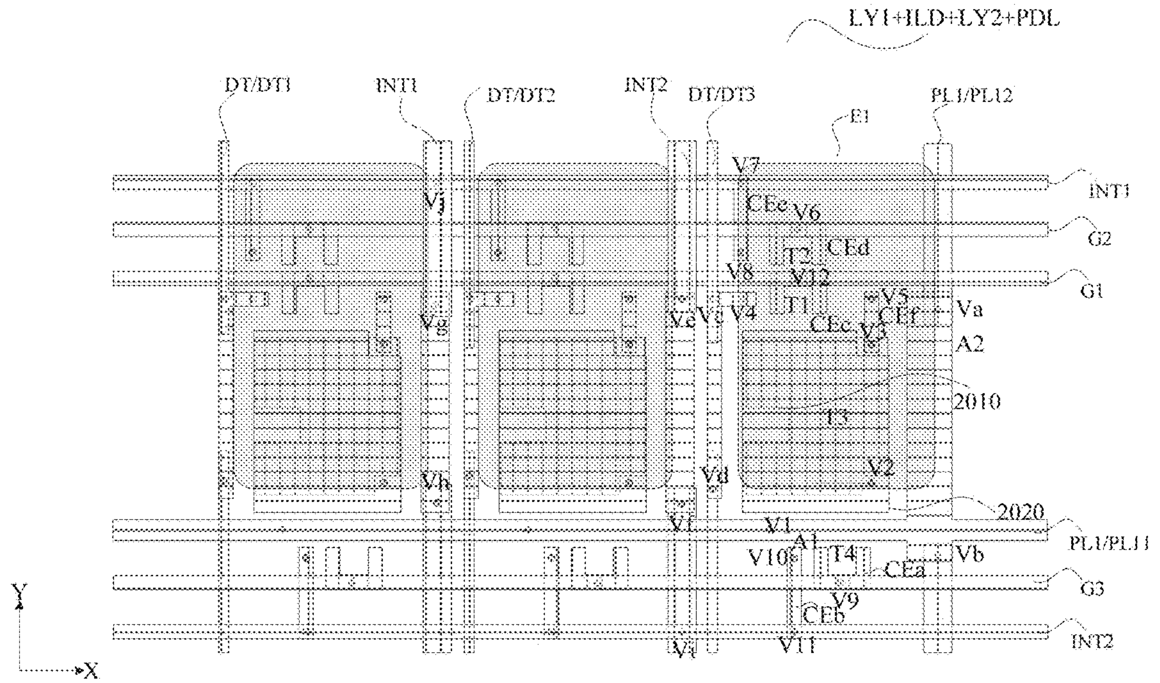

FIG. 14B shows a channel T1*s* of the first transistor T1, a channel T2*s* of the second transistor T2, a channel T3*s* of the third transistor T3, and a channel T4*s* of the fourth transistor T4.

In embodiments of the present disclosure, the elements located in the second conductive pattern layer LY2 may be connected to the elements located in the first conductive pattern layer LY1 and the elements located in the active semiconductor layer LY0 through via holes, and the elements located in the first conductive pattern layer LY1 and the elements located in the active semiconductor layer LY0 may be connected through the elements located in the second conductive pattern layer LY2.

In some exemplary embodiments the insulating layer through which the via hole penetrates may be determined depending on the insulating layer between two conductive pattern layers connected through the via hole.

In some exemplary embodiments, according to the display panel DS1 provided by some embodiments of the present disclosure, the active semiconductor layer LY0, the first conductive pattern layer LY1, and the second conductive pattern layer LY2 are employed to form the pixel driving circuit 100*a* to simplify the fabrication process and reduce the thickness of the display panel. The first initial signal line INT1, the second initial signal line INT2, and/or the first power line PL1 may be referred to as a conductive structure 40. The conductive structure 40 includes a first signal line 411 extending in a first direction X and a signal connection line 412 extending in a second direction Y, the conductive structure 40 is configured to supply a voltage signal to the sub-pixel 100, and a signal connection line 412 is electrically connected to the first signal line 411.

In some exemplary embodiments, as shown in FIG. 11, the conductive structure 40 has a mesh structure including a part extending in the second direction Y (i.e., the signal connecting line 412) and a part extending in the first direction X (i.e., the first signal line 411), respectively.

In some exemplary embodiments, as shown in FIG. 11, the conductive structure 40 includes a first conductive structure 400, a second conductive structure 401 and a third conductive structure 402. As shown in FIG. 11, the first power line PL1 may be referred to as the first conductive structure 400, the first initial signal line INT1 may be referred to as the second conductive structure 401, and the second initial signal line INT2 may be referred to as the third conductive structure 402.

In some exemplary embodiments, as shown in FIG. 11, the first power line PL1 includes a first power supply signal line PL11 extending in a first direction X and a first power supply connection line PL12 extending in a second direction Y, the first power supply signal line PL11 and the first power supply connection line PL12 are connected.

In some exemplary embodiments, as shown in FIG. 11, the first initial signal line INT1 includes a first sub-initial signal line INT11 extending in the first direction X and a first initialization connection line INT12 extending in the second direction Y, the first sub-initial signal line INT11 and the first initialization connection line INT12 are connected. As shown in FIG. 11, the first sub-initial signal line INT11 and the first initialization connection line INT12 are connected through a twenty-first via hole Vj.

In some exemplary embodiments, as shown in FIG. 11, the second initial signal line INT2 includes a second sub-initial signal line INT21 extending in the first direction X and a second initialization connection line INT22 extending in the second direction Y, the second sub-initial signal line INT21 and the second initialization connection line INT22 are connected. As shown in FIG. 11, the second sub-initial signal line INT21 and the second initialization connection line INT22 are connected through a twentieth via Vi.

In some exemplary embodiments, as shown in FIG. 11, the first power line PL1, the first initial signal line INT1, the second initial signal line INT2, and the capacitor 20 of the pixel driving circuit 100*a* are formed by employing two conductive pattern layers. Portions of the first power line PL1, the first initial signal line INT1, and the second initial signal line INT2 extending in the second direction Y are formed in sections. Portions of the first power line PL1, the first initial signal line INT1, and the second initial signal line INT2 extending in the first direction X are all located in the second conductive pattern layer LY2.

In some exemplary embodiments, as shown in FIG. 11, the signal connecting line 412 includes a first part 412*a*, a second part 412*b*, and a third part 412*c*, the third part 412*c* is connected to the first part 412*a* by the second part 412*b*, the first part 412*a* and the third part 412*c* are located at the first conductive pattern layer LY1, and the second part 412*b* is located at the second conductive pattern layer LY2. The signal connection line 412 includes at least one of a first power supply connection line PL12, a first initialization connection line INT12, and a second initialization connection line INT22.

In some exemplary embodiments, as shown in FIG. 11, the first part and second part of the first power supply connection line PL12 are connected through a twelfth via Va, and the second part and third part of the first power supply connection line PL12 are connected through a thirteenth via Vb.

In some exemplary embodiments, as shown in FIG. 11, the first part and second part of the second initialization connection line INT22 are connected through a sixteenth via Ve, and the second part and third part of the second initialization connection line INT22 are connected through a seventeenth via Vf.

In some exemplary embodiments, as shown in FIG. 11, the first part and second part of the first initialization connection line INT12 are connected through an eighteenth via Vg, and the second part and third part of the first initialization connection line INT12 are connected through a nineteenth via Vh.

In some exemplary embodiments, as shown in FIG. 11, the data line DT extends along the second direction Y, and the data line DT is formed in segments. The data line DT includes a first part DTa, a second part DTb and a third part DTc. The first part DTa and the third part DTc are connected through the second part DTb, the first part DTa and the third part DTc are located in the first conductive pattern layer LY1, and the second part DTb is located in the second conductive pattern layer LY2.

Figure 15:
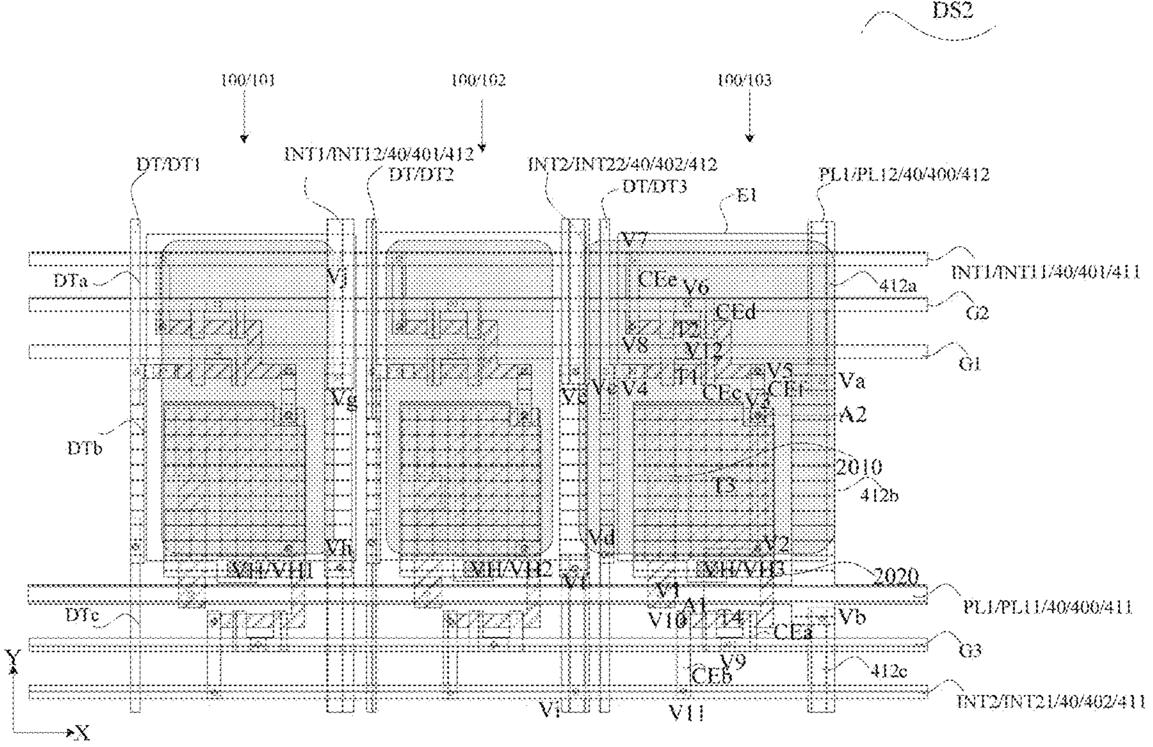
FIG. 15 is a schematic diagram of a layout of a display panel provided by some exemplary embodiments of the present disclosure.

FIG. 15 is a schematic diagram of a layout of a display panel provided by an embodiment of the present disclosure. FIG. 15 shows a display panel DS2.

The display panel DS2 shown in FIG. 15 is adjusted in size of the pixel opening P0 of the pixel define layer PDL as compared with the display panel DS1 shown in FIG. 11. As shown in FIG. 15, the size of the pixel opening P0 of the third sub-pixel 103 in the first direction X is greater than the size of the pixel opening P0 of the second sub-pixel 102 in the first direction X and greater than the size of the pixel opening P0 of the first sub-pixel 101 in the first direction X.

As shown in FIG. 15, the size of the pixel opening P0 of the third sub-pixel 103 in the first direction X is greater than the size of the pixel opening P0 of the first sub-pixel 101 in the first direction X, and the size of the pixel opening P0 of the first sub-pixel 101 in the first direction X is greater than the size of the pixel opening P0 of the second sub-pixel 102 in the first direction X.

Compared with the display panel DS1 shown in FIG. 11, in the display panel DS2 shown in FIG. 15, the size of the pixel opening P0 of the second sub-pixel 102 in the first direction X is adjusted to facilitate an increase in the size of the pixel opening P0 of the third sub-pixel 103 in the first direction X.

In some exemplary embodiments, as shown in FIG. 15, an orthographic projection of the pixel opening P0 of the second sub-pixel 102 on the base substrate does not overlap with an orthographic projection of a second part of the first initial signal line INT1 (a part of the first initialization connection line INT12 located in the second conductive pattern layer LY2) on the base substrate, and does not overlap the orthographic projection of the second part of the second initial signal line INT2 (the part of the second initial connection line INT22 located in the second conductive pattern layer LY2) on the base substrate.

Compared with the display panel DS1 shown in FIG. 11, in the display panel DS2 shown in FIG. 15, two opposite edges of the pixel opening P0 of the third sub-pixel 103 expanded to the left and right, respectively, in the first direction X. For example, in the first direction X, one of two opposite edges of the pixel opening P0 of the third sub-pixel 103 extends beyond the data line providing a data signal to the third sub-pixel 103. The other of the opposite two edges of the pixel opening P0 of the third sub-pixel 103 extends beyond or is flush with the first power supply connection line PL12 overlapping the third sub-pixel 103, of course, in other embodiments, the other of the opposite two edges of the pixel opening P0 of the third sub-pixel 103 overlaps the first power supply connection line PL12 overlapping the third sub-pixel 103. Therefore, it is beneficial to reduce the color shift of the left and right viewing angles of the display panel.

In some exemplary embodiments, as shown in FIG. 11 and FIG. 15, data line DT includes a first data line DT1, a second data line DT2, and a third data line DT3. The first data line DT1 provides a data signal for the first sub-pixel 101, the second data line DT2 provides a data signal for the second sub-pixel 102, and the third data line DT3 provides a data signal for the third sub-pixel 103.

Figure 16A:
FIG. 16A is a schematic diagram of a plane of a pixel define layer in a display panel provided by some embodiments of the present disclosure.
Figure 16A:
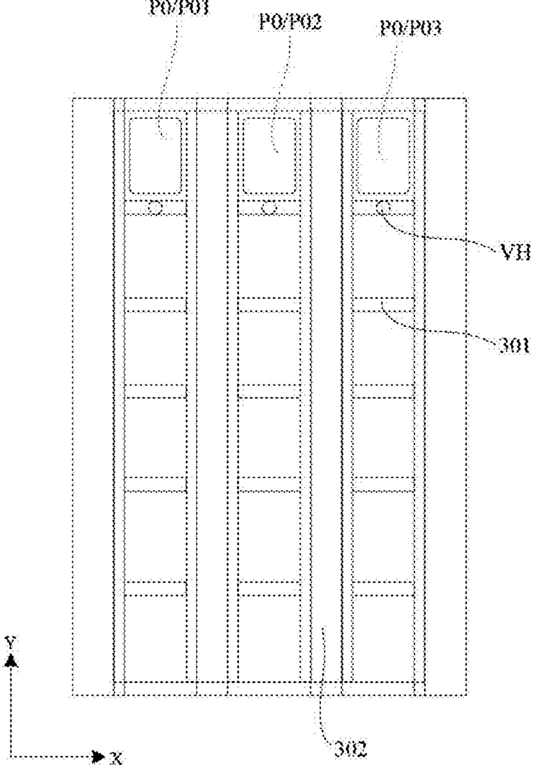
Figure 16B:
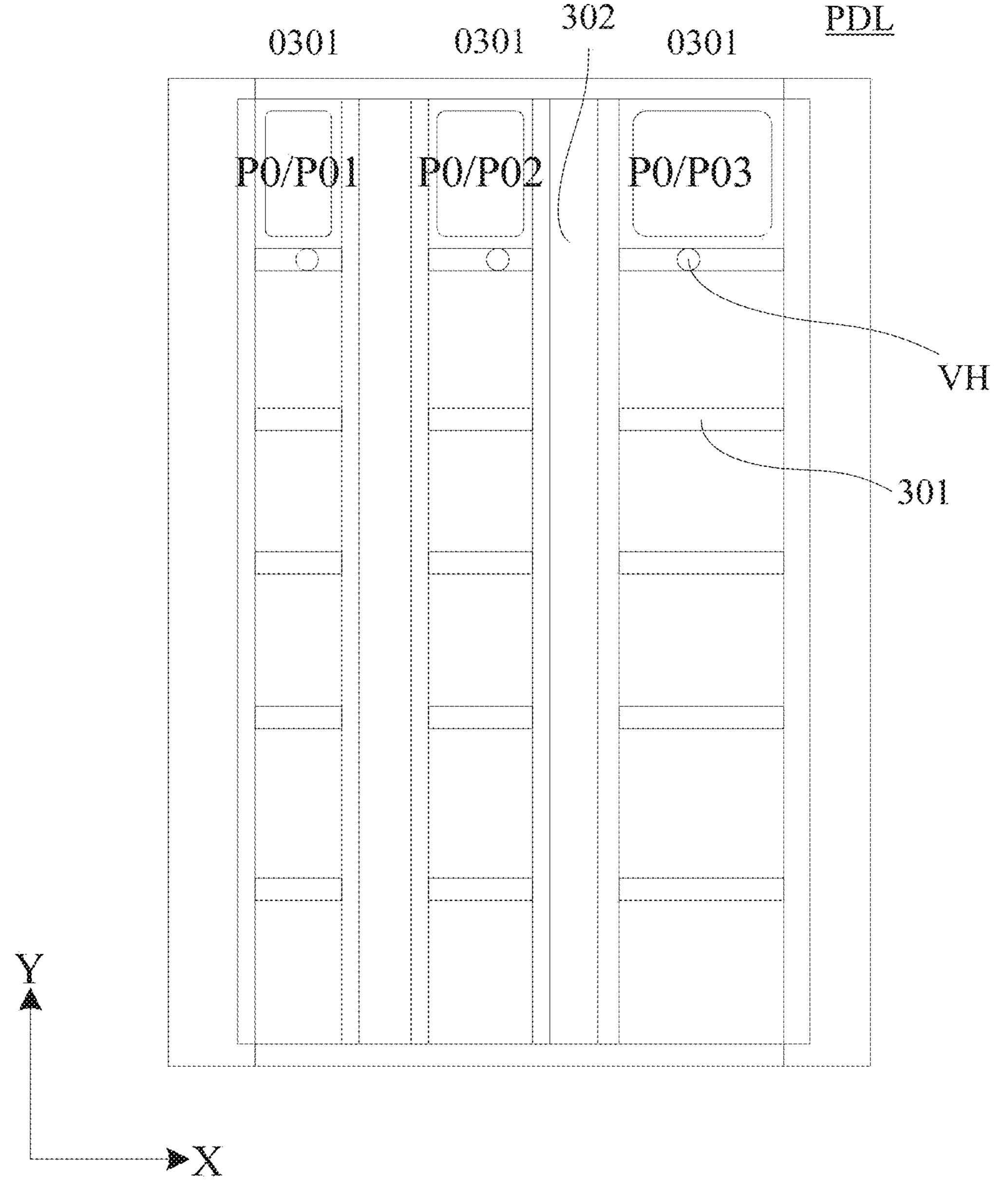
FIG. 16B is a schematic diagram of a plane of a pixel define layer in a display panel provided by some embodiments of the present disclosure.

FIG. 16A is a plan view of a pixel define layer in a display panel provided by an embodiment of the present disclosure. FIG. 16B is a plan view of a pixel define layer in a display panel provided by an embodiment of the present disclosure. In some exemplary embodiments, As shown in FIGS. 16A and 16B, the pixel define layer (PDL) includes a plurality of first dam portions 301 and a plurality of second dam portions 302, the plurality of first dam portions 301 are arranged in a first direction X, the second dam portion 302 extends in a second direction Y, a plurality of first dam portions 301 are arranged in a plurality of groups 0301, each group of first dam portions 301 is located between two adjacent second dam portions 302, the first dam portions 301 extend in a first direction X, and the first dam portions 301 in each group are arranged in a second direction Y.

In some exemplary embodiments, as shown in FIGS. 12, 16A, and 16B, the maximum height h1 of the first dam portion 301 to the planarization layer is smaller than the maximum height h2 of the second dam portion 302 to the planarization layer.

Figure 17:
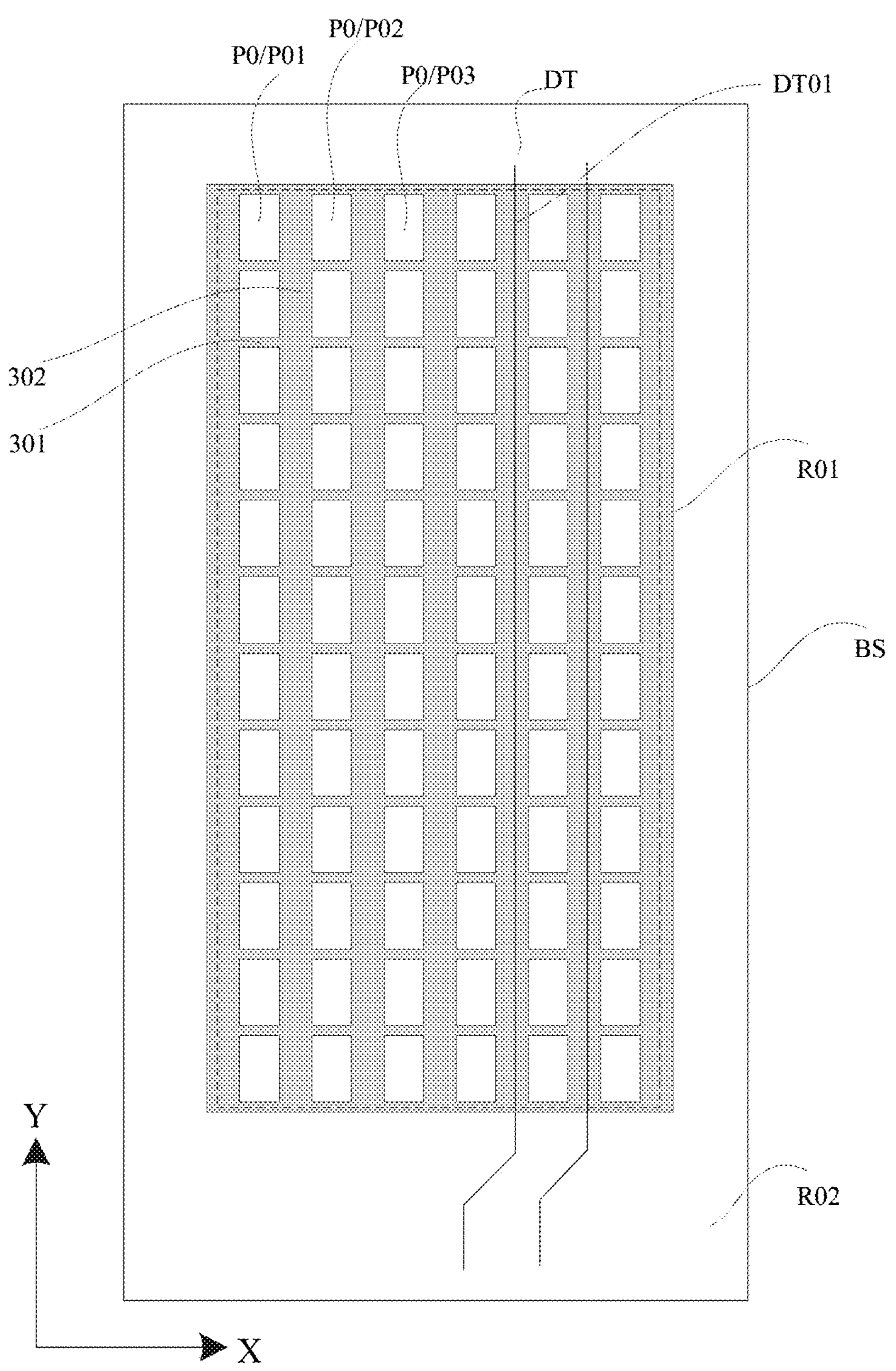
FIG. 17 is a schematic diagram of a display panel provided by some embodiments of the present disclosure.

FIG. 17 is a schematic diagram of a display panel according to an embodiment of the present disclosure. In some exemplary embodiments, as shown in FIG. 17, the base substrate BS includes a display area R01 and a peripheral area R02 located at least a side of the display area R01. As shown in FIG. 17, the orthographic projection of the part DT01 of the data line DT located in the display area R01 on the base substrate BS is within the orthographic projection of the second dam portion 302 on the base substrate BS. As shown in FIG. 17 the orthographic projection of the display area R01 on the base substrate BS overlaps the orthographic projection of the pixel define layer PDL on the base substrate BS. The orthographic projection of the pixel opening P0 of the pixel define layer PDL on the base substrate BS falls within the orthographic projection of the display area R01 on the base substrate BS.

FIG. 17 shows only two data lines DT. For example the second dam portion 302 may correspond to one data line but is not limited thereto.

In the embodiment of the present disclosure, the pixel driving circuit is not limited to that shown in FIG. 10, and other suitable pixel driving circuits may be adopted, and the layout diagram of the display panel is not limited to that shown in FIG. 11 and FIG. 15, and may be adjusted on the basis of FIG. 11 and FIG. 15, and other layout modes may be adopted. For example, the positions of the first initialization connection line INT12 of the first initial signal line INT1 and the second initialization connection line INT22 of the second initial signal line INT2 in FIG. 11 may be reversed.

As shown in FIGS. 11 and 12, embodiments according to the present disclosure provide a display panel including a base substrate BS and a plurality of sub-pixels 100 disposed on the base substrate BS.

In some exemplary embodiments, as shown in FIGS. 11 and 12, the sub-pixel 100 includes: a pixel driving circuit 100*a* including a storage capacitor 20, a first electrode plate 2010 closer to a base substrate BS than a second electrode plate 2020; and a light emitting element 100*b* including a first electrode E1, a second electrode E2, and a light emitting function layer FL located between the first electrode E1 and the second electrode E2, and a pixel driving circuit 100*a* is configured to drive the light emitting element 100*b*.

Figure 18:
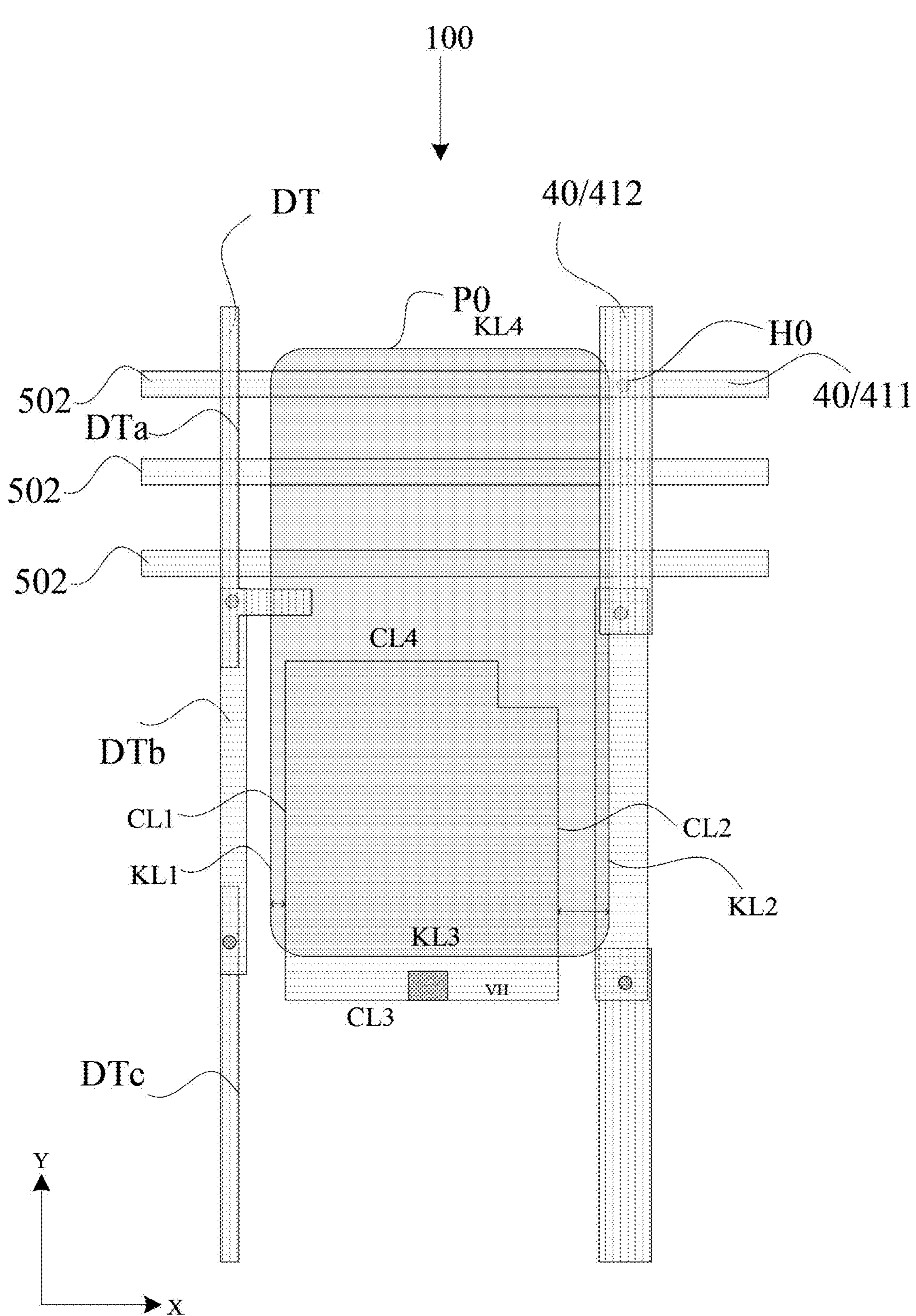
FIG. 18 is a plan view of a display panel provided by some embodiments of the present disclosure.

FIG. 18 is a plan view of a display panel provided by an embodiment of the present disclosure. In an exemplary embodiment, as shown in FIG. 18, an orthographic projection of the pixel opening P0 on the base substrate BS at least partially overlaps with an orthographic projection of the second electrode plate 2020 on the base substrate BS.

In some exemplary embodiments, as shown in FIG. 18, the second electrode plate 2020 includes a first edge CL1 extending in the second direction Y and a second edge CL2 extending in the second direction Y. The pixel opening P0 includes a first edge KL1 extending in the second direction Y and a second edge KL2 extending in the second direction Y. The first edge CL1 of the second electrode plate 2020 is closer to the first edge KL1 of the pixel opening P0 than the second edge CL2 of the second electrode plate 2020, and the second edge CL2 of the second electrode plate 2020 is closer to the second edge KL2 of the pixel opening P0 than the first edge CL1 of the second electrode plate 2020.

In some exemplary embodiments, as shown in FIG. 18, the second electrode plate 2020 further includes a third edge CL3 extending along the first direction X and a fourth edge CL4 extending along the first direction X, and the pixel opening P0 includes a third edge KL3 extending along the first direction X and a fourth edge KL4 extending along the first direction X.

In some exemplary embodiments, as shown in FIG. 18, the orthographic projection of the third edge CL3 on the base substrate is located outside the orthographic projection of the pixel opening P0 on the base substrate.

In some exemplary embodiments, as shown in FIG. 18, the orthographic projection of the fourth edge CL4 on the base substrate is within the orthographic projection of the pixel opening P0 on the base substrate.

In some exemplary embodiments, as shown in FIG. 18, the first edge CL1 and the second edge CL2 are disposed opposite to each other, and the third edge CL3 is connected to the first edge CL1 and the second edge CL2 by fillets, respectively. The third edge CL3 and the fourth edge CL4 are arranged opposite to each other, and the fourth edge CL4 is connected to the first edge CL1 and the second edge CL2 by fillets, respectively. Of course in other embodiments adjacent edges of the openings may not be connected by fillets.

In some exemplary embodiments, in the pixel driving circuit shown in FIG. 10, the first transistor T1, the second transistor T2, the third transistor T3, and the fourth transistor T4 may all be N-type transistors and may be formed using a low temperature polysilicon (LTPS) process.

Figure 19:
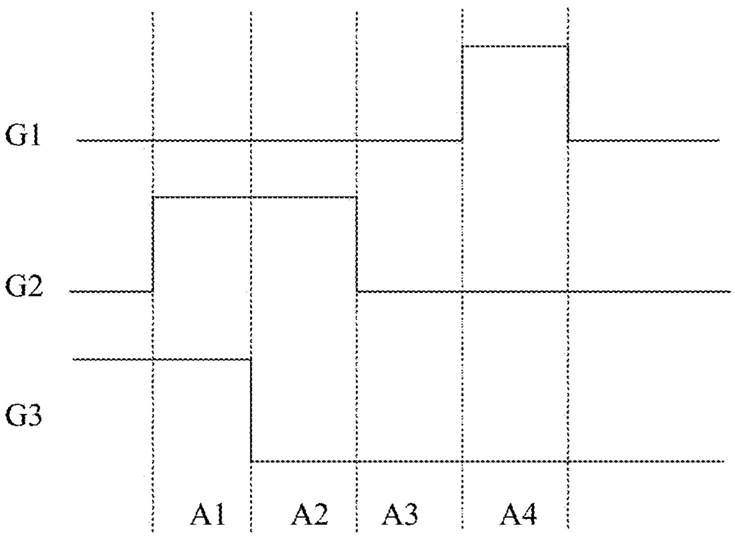
FIG. 19 is a driving timing diagram of a pixel driving circuit shown in FIG. 10.

In some exemplary embodiments, the pixel driving circuit shown in FIG. 10 may be driven using the driving timing shown in FIG. 19. As shown in FIG. 19, the first gate line G1, the second gate line G2, and the third gate line G3 are respectively connected to different gate driving circuits (GOA circuits), thereby providing different scanning signals to the pixel driving circuits. In the first stage A1, the second gate line G2 and the third gate line G3 provide a high-level signal, and the first gate line G1 provides a low-level signal. In the second stage A2, the second gate line G2 provides a high-level signal, and the first gate line G1 and the third gate line G3 provide a low-level signal. In the third stage A3, the first gate line G1, the second gate line G2, and the third gate line G3 all provide a low-level signal; In the fourth stage A4, the first gate line G1 provides a high-level signal, and both the second gate line G2 and the third gate line G3 provide a low-level signal.

In some exemplary embodiments, as shown in FIGS. 10, 11, 13A to 13G, 14A to 14D, the first gate line G1, the second gate line G2, and the third gate line G3 are located in the second conductive pattern layer LY2, a first electrode plate 2010, a first connection electrode CEa, a second connection electrode CEb, a third connection electrode CEc, a fourth connection electrode CEd, and a fifth connection electrode CEe are located in the first conductive pattern layer LY1, the third connection electrode CEc serves as a gate electrode of the first transistor T1, and the third connection electrode CEc is connected to the first gate line G1 through a twelfth via V12 on the interlayer insulating layer ILD. A fourth connection electrode CEd serves as a gate electrode of the second transistor T2, and is connected to the second gate line G2 through a sixth via V6 on the interlayer insulating layer ILD. The first connection electrode CEa serves as a gate electrode of the fourth transistor T4, and is connected to the third gate line G3 through a ninth via V9 on the interlayer insulating layer ILD.

In some exemplary embodiments, as shown in FIGS. 10, 11, 13A to 13G, 14A to 14D, the first power line PL1 includes a first power supply signal line PL11 extending in a first direction X and a first power supply connection line PL12 extending in a second direction Y, the first power supply signal line PL11 and the first power supply connection line PL12 being connected. The first power supply connection line PL12 includes a first part, a second part and a third part connected in sequence, the first power supply signal line PL11 and the second part of the first power supply connection line PL12 are located in the second conductive pattern layer LY2, and the first part and the third part of the first power supply connection line PL12 are located in the first conductive pattern layer LY1. The first power supply signal line PL11 is directly connected to a second part of the first power supply connection line PL12, the first part and second part of the first power supply connection line PL12 are connected through a twelfth via Va, and the second part and third part of the first power supply connection line PL12 are connected through a thirteenth via Vb.

In some exemplary embodiments, as shown in FIGS. 10, 11, 13A to 13G, 14A to 14D, the first initial signal line INT1 includes a first sub-initial signal line INT11 extending in the first direction X and a first initialization connection line INT12 extending in the second direction Y, the first sub-initial signal line INT11 and the first initialization connection line INT12 are connected. The first initialization connection line INT12 includes a first part, a second part and a third part connected in sequence, the first sub-initial signal line INT11 and the second part of the first initialization connection line INT12 are located in the second conductive pattern layer LY2, and the first part and the third part of the first initialization connection line INT12 are located in the first conductive pattern layer LY1. The first sub-initial signal line INT11 is connected to a first part of the first initialization connection line INT12 through a twenty-first via hole Vj, the first part and second part of the first initialization connection line INT12 are connected through an eighteenth via Vg, and the second part and third part of the first initialization connection line INT12 are connected through a nineteenth via Vh.

In some exemplary embodiments, as shown in FIGS. 10, 11, 13A to 13G, 14A to 14D, the second initial signal line INT2 includes a second sub-initial signal line INT21 extending in the first direction X and a second initialization connection line INT22 extending in the second direction Y, the second sub-initial signal line INT21 and the second initialization connection line INT22 being connected. The second initialization connection line INT22 includes a first part, a second part and a third part connected in sequence, the second sub-initial signal line INT21 and the second part of the second initialization connection line INT22 are located in the second conductive pattern layer LY2, and the first part and the third part of the second initialization connection line INT22 are located in the first conductive pattern layer LY1. The second sub-initial signal line INT21 and the third part of the second initialization connection line INT22 are connected through a twentieth via Vi, the first part and second part of the second initialization connection line INT22 are connected through a sixteenth via Ve, and the second part and third part of the second initialization connection line INT22 are connected through a seventeenth via Vf.

In the embodiment of the present disclosure, the first power line PL1, the first initial signal line INT1, and the second initial signal line INT2 are all formed in a grid shape, thus reducing the wiring resistance.

In some exemplary embodiments, the first initial signal line INT1 may extend in the second direction Y, and may be connected to the first electrode of the second transistor T2 of each row of sub-pixels through a semiconductor layer where the active layers of the transistors of a plurality of sub-pixels of the same row are located.

In some exemplary embodiments, the storage capacitor Cst may be a parallel capacitor, and the storage capacitor Cst includes the first electrode plate and the second electrode plate, and also includes a third electrode plate, the second electrode plate and the third electrode plate are respectively located on both sides of the first electrode plate in a direction perpendicular to the base substrate 10, and the second electrode plate and the third electrode plate are connected through a via hole. There is an overlapping area between orthographic projections of the second electrode plate and the first electrode plate on the base substrate, and there is an overlapping portion between orthographic projections of the third electrode plate and the first electrode plate on the base substrate. That is, the second electrode plate and the first electrode plate form a first capacitance, the third electrode plate and the first electrode plate form a second capacitance, and the storage capacitance Cst includes a first capacitance and a second capacitance in parallel, so that the capacitance value of the storage capacitance Cst can be increased. Exemplarily, the second electrode plate may be located on a side of the first electrode plate close to the base substrate 10, and the third electrode plate may be located on a side of the first electrode plate away from the base substrate 10. For example, the first electrode plate may be located at the first conductive pattern layer LY1, the second electrode plate may be located at the active semiconductor layer LY0, and the third electrode plate may be located at the second conductive pattern layer LY2, and the second electrode plate and the third electrode plate are connected through a via hole.

The embodiment of the present invention does not limit the capacitance shape, the wire incoming mode, the bridging mode, the hole arrangement position, the transistor orientation and the column line sequence of the pixel driving circuit, and can be adjusted according to the need.

Figure 20:
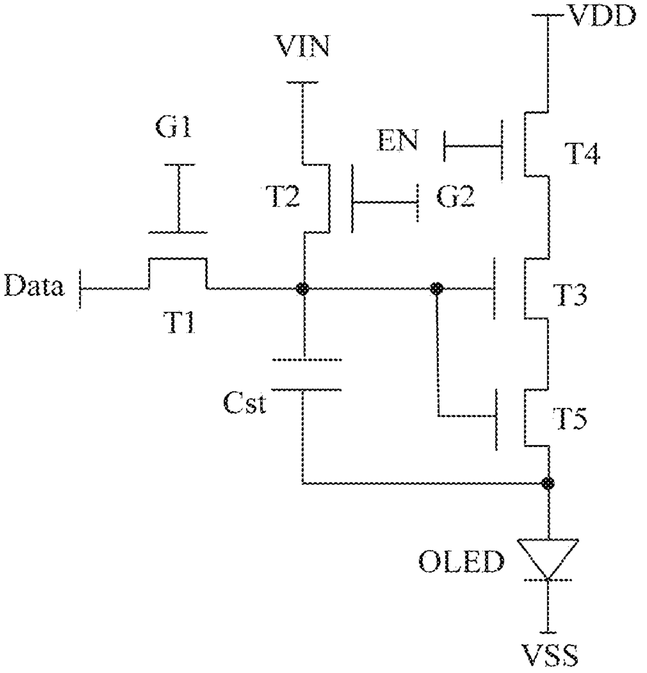
FIG. 20 is a schematic diagram of a pixel driving circuit and a light emitting element in one sub-pixel according to other exemplary embodiments of the present disclosure.

FIG. 20 is an equivalent circuit diagram of a pixel driving circuit of other exemplary embodiments of the present disclosure. In other exemplary embodiments, as shown in FIG. 20, the pixel driving circuit may be of a 5T1C configuration including a first transistor T1, a second transistor T2, a third transistor T3, a fourth transistor T4, a fifth transistor T5, and a storage capacitor Cst. The display panel includes a first gate line G1, a second gate line G2, a Data line Data, an initialization signal line VIN, a light emitting signal line EN, a first power line VDD, and a second power line VSS. The gate electrode of the first transistor T1 is connected to the first gate line G1. The first electrode of the first transistor T1 is connected to the data line Data. A second electrode of the first transistor T1 is connected to a second electrode of the second transistor T2, a gate electrode of the third transistor T3, a gate electrode of the fifth transistor T5, and a first electrode plate of the storage capacitor Cst. The gate electrode of the second transistor T2 is connected to the second gate line G2. The first electrode of the second transistor T2 is connected to the initialization signal line VIN. The gate electrode of the fourth transistor T4 is connected to the light emitting signal line EN. The first electrode of the fourth transistor T4 is connected to the first power line VDD. The second electrode of the fourth transistor T4 is connected to the first electrode of the third transistor T3, the second electrode of the third transistor T3 is connected to the first electrode of the fifth transistor T5, the second electrode of the fifth transistor T5 is connected to the second electrode plate of the storage capacitor Cst and the first electrode 121 of the OLED light emitting device, and the second electrode 124 of the OLED light emitting device is connected to the second power line VSS. The pixel driving circuit of the embodiment of the present disclosure is not limited to the 5T1C structure of the present example.

As shown in FIG. 20, each sub-pixel includes a pixel driving circuit and a light emitting device. The first gate line G1 is configured to provide a scan signal to the sub-pixels, and the second gate line G2 is configured to provide a reset control signal to the sub-pixels. The initialization signal line VIN is configured to provide an initialization signal to the sub-pixels. The data line Data is configured to supply a data voltage to the sub-pixels. The light emitting signal line EN is configured to provide a light emitting control signal to the sub-pixels. The first power line VDD is configured to provide a constant first voltage signal to the sub-pixels circuit, the second power line VSS is configured to provide a constant second voltage signal to the sub-pixels, and the first voltage signal is greater than the second voltage signal. The initialization signal is a constant voltage signal, which can be less than or equal to the second voltage signal. The second transistor T2 is configured to be turned on under a reset control signal provided by the second gate line G2, and the initialization signal line VIN resets the storage capacitor Cst, the gate electrode of the third transistor T3 and the gate electrode of the fifth transistor T5 through the turned-on second transistor T2. The first transistor T1 is configured to be turned on under a scan signal supplied by the first gate line G1, and the data line Data writes a data voltage to the storage capacitor Cst, the gate electrode of the third transistor T3 and the gate electrode of the fifth transistor T5 through the turned-on first transistor T1. The fourth transistor T4 is configured to be turned on under the light emitting control signal provided by the light emitting signal line EN. The fifth transistor T5 outputs a driving current and drives the OLED light emitting device to emit light under the control of the first gate line G1, the data line Data, the light emitting signal line EN, the first power line VDD and the second power line VSS. Exemplarily, the fourth transistor T4 may be a P-type transistor, and the first transistor T1, the second transistor T2, the third transistor T3, and the fifth transistor T5 may all be N-type transistors.

Figure 21:
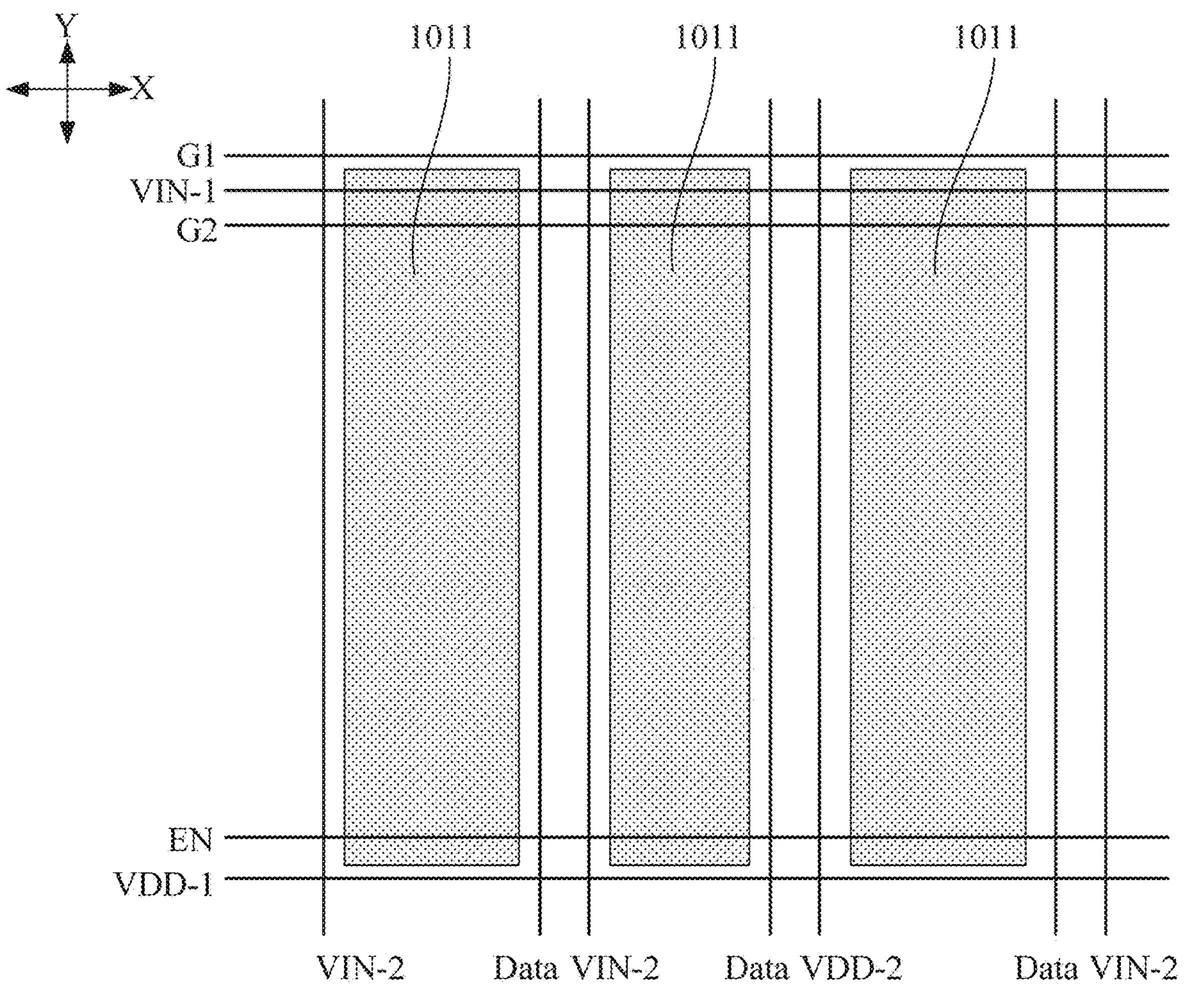
FIG. 21 is a schematic diagram of a layout of a display panel provided by other exemplary embodiments of the present disclosure.

FIG. 21 is a schematic diagram of a plan structure of a plurality of sub-pixels employing the pixel driving circuit of FIG. 20 in other exemplary embodiments. FIG. 21 illustrates three sub-pixels located in the same row. In some exemplary embodiments, as shown in FIG. 21, the first gate line G1, the second gate line G2 and the light emitting signal line EN may all extend in the first direction X, and the data line Data extends in the second direction Y. The pixel driving circuit 1011 of each sub-pixel may be located within an area defined by two adjacent first gate lines G1 (FIG. 21 shows the first gate line G1 of the sub-pixels in the current row, but not show the first gate line G1 of the sub-pixels in the next row) and two adjacent data lines Data. The pixel driving circuit 1011 of each sub-pixel is connected to the first gate line G1, the second gate line G2 and the light emitting signal line EN of the sub-pixel row where the sub-pixel is located, and is connected to the data line Data of the sub-pixel column where the sub-pixel is located. The second gate line G2 of each sub-pixel is located between two adjacent first gate lines G1, the second gate line G2 is disposed close to the first gate line G1 of the sub-pixel of the current row (nth row), and the light emitting signal line EN may be located between the second gate line G2 and the first gate line G1 of the sub-pixel of the next row (n+1 row), and disposed close to the first gate line G1 of the sub-pixel of the next row (n+1 row). The initialization signal line VIN and the first power line VDD may both have a grid-like structure so that resistance can be reduced. The initialization signal line VIN may include a first initialization signal line VIN-1 extending in a first direction X and a second initialization signal line VIN-2 extending in a second direction Y. The first initialization signal line VIN-1 and the second initialization signal line VIN-2 may be arranged in the same layer and connected, or may be arranged in different layers and connected through a via hole. The first initial signal line VIN-1 may be located between the first gate line G1 and the second gate line G2 and connected to the first electrodes of the second transistors T2 of a plurality of sub-pixels in the same row. The first power line VDD may include a third connection line VDD-1 extending in the first direction X and a fourth connection line VDD-2 extending in the second direction Y. The third connection line VDD-1 and the fourth connection line VDD-2 may be arranged and connected in the same layer or arranged in different layers and connected through a via hole. The third connecting line VDD-1 may be located on the side of the light emitting signal line EN away from the second gate line G2, and the third connecting line VDD-1 is connected to the first electrodes of the fourth transistor T4 of a plurality of sub-pixels in the same row.

Figure 22:
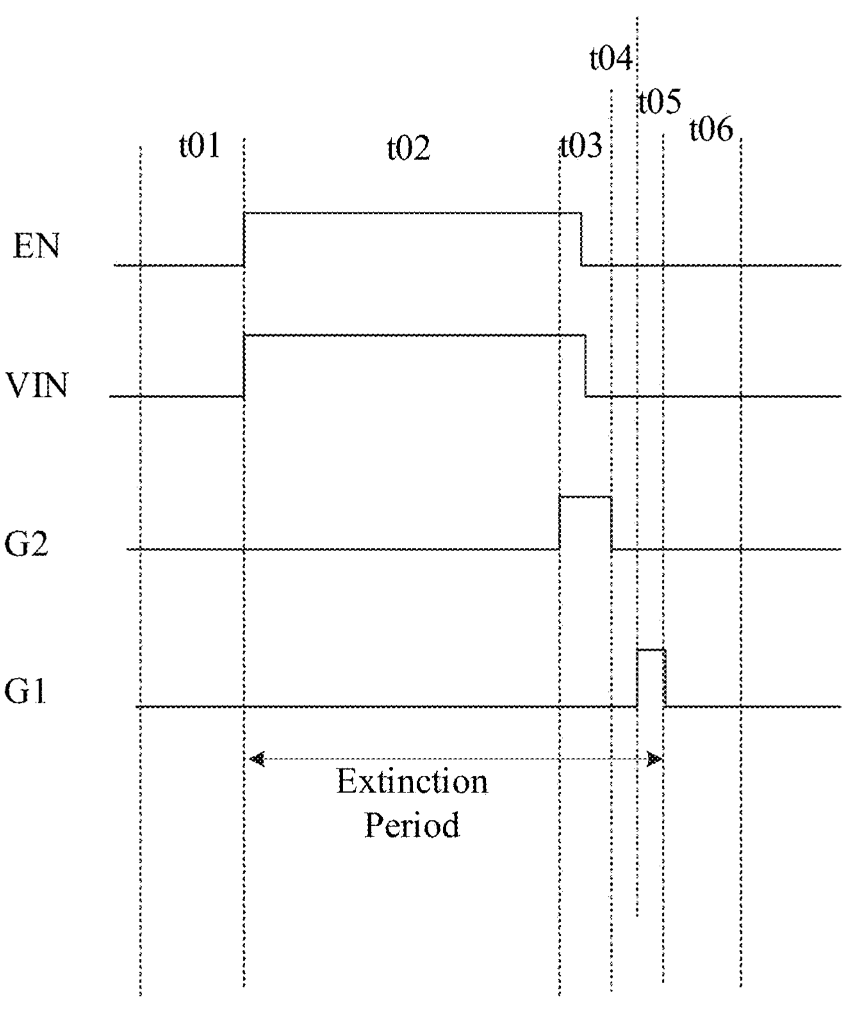
FIG. 22 is a driving timing diagram of a pixel driving circuit shown in FIG. 20.

In some exemplary embodiments, the pixel driving circuit shown in FIG. 20 may be driven using the driving timing shown in FIG. 22. As shown in FIG. 22 the first gate line G1 and the second gate line G2 are respectively connected to different gate driving circuits (GOA circuits) so that different scanning signals are supplied to the pixel driving circuits. In the first stage t01, the light emitting signal line EN, the initialization signal line VIN, the second gate line G2, and the first gate line G1 all provide a low-level signal. In the second stage t02, both the light emitting signal line EN and the initialization signal line VIN provide a high-level signal, and both the second gate line G2 and the first gate line G1 provide a low-level signal. In the third stage t03, the light emitting signal line EN and the initialization signal line VIN are changed from high-level signals to low-level signals, the first gate line G1 provides the low-level signals, and the second gate line G2 provides the high-level signals. In the fourth stage t04, the light emitting signal line EN, the initialization signal line VIN, the second gate line G2, and the first gate line G1 all provide a low-level signal. In the fifth stage t05, the light emitting signal line EN, the initialization signal line VIN and the second gate line G2 all provide a low-level signal, and the first gate line G1 provides a high-level signal. In the sixth stage t06, the light emitting signal line EN, the initialization signal line VIN, the second gate line G2, and the first gate line G1 all provide low-level signals.

In some exemplary embodiments, the non-display area 102 of the display panel may be provided with a timing controller, a data driving circuit and a scanning driving circuit. The scan driving circuit can be arranged on opposite sides of the display area 101 (for example, on both sides of the display area 101 in the first direction X), and the timing controller and data driving circuit can be arranged on one side of the display area 101 (for example, one side of the display area 101 in the second direction Y). A scan driving circuit is configured to supply a scan signal (control signal) to a plurality of rows of sub-pixels through a plurality of gate lines, and the scan driving circuit may be an integrated circuit chip or a gate driving circuit (GOA) directly fabricated on a display panel. The data drive circuit may supply data signals to a plurality of columns of sub-pixels through a plurality of data lines. The timing controller is configured to control the scan drive circuit to apply the scan signal and the data drive circuit to apply the data signal.

Exemplarily the non-display area 102 of the display panel may further be provided with a cathode ring which is annular and disposed around the display area 101. The cathode ring is connected to the second power line VSS and connected to the second electrode, and the second power line VSS provides signals to the second electrode 124 through the cathode ring. Exemplarily the cathode ring may be disposed in the same layer as the first electrode 121 and may be connected to the second electrode 124 through a via provided in the pixel define layer 122. The second power line VSS may be arranged in the same layer as the first electrodes and the second electrodes of a plurality of transistors in the pixel driving circuit and connected to the cathode ring through a via hole.

Exemplarily the non-display area 102 of the display panel may further be provided with a Cell Test (CT) unit an electrostatic discharge (ESD) unit and the like. The CT unit is configured to detect the display screen, crack conditions of the display panel, etc., and timely discover and eliminate defective products. The ESD unit is configured to release static electricity accumulated on some signal lines (such as data lines, gate lines, etc.) of the display panel and functions as a protection circuit.

An embodiment of the present disclosure further provides a display apparatus, which includes the display panel described in any one of the foregoing embodiments. The display apparatus may be any product or component with a display function, such as a mobile phone, a tablet computer, a television, a display, a laptop computer, a digital photo frame, and a navigator.

Although the embodiments disclosed in the present disclosure are as above, the described contents are only embodiments used for convenience of understanding the present disclosure and are not intended to limit the present disclosure. Any person skilled in the art to which the present disclosure pertains may make any modification and variation in implementation forms and details without departing from the spirit and scope disclosed in the present disclosure. However, the scope of patent protection of the present disclosure is still subject to the scope defined by the appended claims.

The invention claimed is:

1. A display panel, comprising:

a base substrate, and a driving structure layer, a light emitting structure layer and an encapsulation structure layer sequentially disposed on the base substrate, wherein:

the light emitting structure layer comprises a first electrode layer, a pixel define layer, a light emitting function layer and a second electrode layer, the first electrode layer comprises a first electrode and the second electrode layer comprises a second electrode; the display panel further comprises a plurality of pixel units, each of the plurality of pixel units comprises at least one sub-pixel, wherein the sub-pixel is configured with a pixel driving circuit, at least one data line, at least one power line and at least one control line, the pixel driving circuit is coupled with the first electrode and/or the second electrode; the pixel driving circuit comprises at least one transistor, the transistor comprises at least a channel area, a gate electrode, a source electrode, and a drain electrode, and the control line is configured to output a control signal to control the gate electrode to turn on and communicate with the source electrode and the drain electrode, or to control the gate electrode to turn off and disconnect the source electrode and the drain electrode;

the driving structure layer comprises a planarization layer, the planarization layer is located at a side of the pixel driving circuit away from the base substrate, the planarization layer is provided with a first via hole, and the first electrode is connected with the pixel driving circuit through the first via hole;

the pixel define layer is located on a side of the planarization layer away from the base substrate; the pixel define layer comprises at least a first dam portion and a second dam portion, the first dam portion extends in a first direction, the second dam portion extends in a second direction, the first direction is intersected with the second direction, the first dam portion and the second dam portion are formed a plurality of pixel openings, an orthographic projection of the first dam portion on the base substrate comprising an orthographic projection of the first via hole of the planarization layer on the base substrate; or the orthographic projection of the first dam portion on the base substrate partially is overlapped with the orthographic projection of the first via hole on the base substrate;

a distance between a surface of a side of the first dam portion away from the base substrate and a surface of a side of the planarization layer away from the base substrate is smaller than a distance between a surface of a side of the second dam portion away from the base substrate and a surface of a side of the planarization layer away from the base substrate; and the second dam portion comprise a first surface of a side away from the base substrate and a second surface of a side close to the base substrate, the first dam portion comprises a third surface of a side away from the base substrate and a fourth surface of a side close to the base substrate, and a distance between the first surface and the second surface is greater than a distance between the third surface and the fourth surface;

wherein the second dam portion comprises a first side surface facing the pixel openings, the first side surface of the second dam portion comprises a first functional area and a second functional area sequentially disposed in a direction away from the base substrate, and the second functional area comprises a first sub-area and a second sub-area in a direction away from the base substrate;

the first sub-area is connected with the first functional area and the second sub-area, and there is at least one cross section in a direction perpendicular to the base substrate to allow the first functional area, the first sub-area and the second sub-area to be all inclined surfaces; and a slope angle of the first sub-area is greater than a slope angle of the second sub-area; a slope angle of the second sub-area is greater than a slope angle of the first functional area.

2. The display panel according to claim 1, wherein the slope angle of the first sub-area is between 50° and 60°; the slope angle of the second sub-area is between 30° and 40°; the slope angle of the first functional area is between 10° and 20°.

3. The display panel according to claim 1, wherein:

an intersection line of the first sub-area and the second sub-area is a first intersection line, and an intersection line of the first sub-area and the first functional area is a second intersection line; an intersecting line between the second sub-area and the first surface of the second dam portion is a third intersecting line, and an intersecting line between the first functional area and a surface of the first electrode facing away from the base substrate is a fourth intersecting line;

an intersection point of the first intersection line and an reference surface is a first intersection point, an intersection point of the second intersection line and the reference surface is a second intersection point, an intersection point of the third intersecting line and the reference surface is a third intersection point, an intersection point of the fourth intersecting line and the reference surface is a fourth intersection point, and the reference surface is a cross section parallel to the first direction and perpendicular to the base substrate; and in the reference surface, a straight line passing through the second intersection point and the third intersection point is a first reference line, a straight line passing through the second intersection point and parallel to the base substrate is a second reference line, and an acute angle between the first reference line and the second reference line is between 38° and 42°.

4. The display panel according to claim 3, wherein a distance d from the first intersection point to the first reference line satisfies: $0<d\leq D<AB/S$, $0<D<\Delta/2-HL/S$; and wherein D is a real number greater than 0, and A is a length of a line segment between the first intersection point and the third intersection point; B is a length of the line segment between the first intersection point and the second intersection point; S is a length of the line segment between the second intersection point and the third intersection point; H is a length of a line segment between the third intersection point and a reference point, wherein the reference point is an intersection point between the second reference line and a third reference line, and the third reference line is a straight line passing through the third intersection point and perpendicular to the base substrate; L is a length of a line segment between the second intersection point and the reference point; A is a width of the first side surface of the second dam portion in the first direction.

5. The display panel according to claim 4, wherein in the reference surface, a distance between the first intersection point and a surface of the first electrode away from the base substrate is h1, a distance between the third intersection point and the surface of the first electrode away from the base substrate is h3; a ratio of h1 to h3 is between 0.494 and 0.742.

6. The display panel according to claim 5, further comprising a color filter layer disposed on a side of the encapsulation structure layer away from the base substrate, wherein the color filter layer comprises a plurality of filter units for transparently transmitting light of set colors, and at least two adjacent filter units for transparently transmitting light of different colors are overlapped with each other.

7. The display panel according to claim 6, further comprising a color resistance layer disposed on a side of the encapsulation structure layer away from the base substrate;

wherein the color resistance layer comprises a plurality of first color resistance portions extending along the first direction, the plurality of the first color resistance portions are sequentially arranged in the second direction, the color resistance layer further comprises a plurality of groups of second color resistance portions, each group of the second color resistance portions comprises a plurality of the second color resistance portions which are located between two adjacent first color resistance portions and are disposed at intervals along the first direction, and each of the second color resistance portions extends along the second direction.

8. The display panel according to claim 7, wherein each second color resistance portion is formed by an overlapping part of two adjacent filter units for transmitting light of different colors in the first direction; or a material of the second color resistance portion comprises at least one of: metallic chrome, chrome oxide or black resin.

9. The display panel according to claim 7, wherein an orthographic projection of a first color resistance portion on the base substrate comprises the orthographic projection of the first via hole of the planarization layer on the base substrate; or the orthographic projection of the first color resistance portion on the base substrate is partially overlapped with the orthographic projection of the first via hole on the base substrate.

10. The display panel according to claim 1, wherein the first electrode layer comprises a first sub-area and a second sub-area, the second sub-area includes at least a part of the first electrode, and an average thickness of the at least the part of the first electrode in a direction perpendicular to the base substrate is greater than an average thickness of the first electrode of the first sub-area in a direction perpendicular to the base substrate.

11. The display panel according to claim 10, wherein the second sub-area is located on a circumferential sidewall of the first via hole and covers a surface of an end of the circumferential sidewall of the first via hole close to the base substrate.

12. The display panel according to claim 10, wherein the second sub-area has an annular structure, and a ratio of a width of an orthographic projection of the first electrode of the second sub-area on the base substrate in the first direction to a width of an orthographic projection of the first electrode on the base substrate in the first direction is between ¼ and ½.

13. The display panel according to claim 1, wherein an orthographic projection of the second dam portion on the base substrate is not overlapped with the orthographic projection of the first via hole on the base substrate.

14. The display panel according to claim 1, wherein the second dam portion comprises a first side surface facing the pixel opening, the first side surface of the second dam portion comprises a first functional area and a second functional area sequentially disposed in a direction away from the base substrate, and the second functional area comprises a first sub-area and a second sub-area in a direction away from the base substrate; and the first sub-area is connected with the first functional area and the second sub-area, and there is at least one cross section in a direction perpendicular to the base substrate to allow shapes of the first functional area, the first sub-area and the second sub-area to be all continuous curved surfaces.

15. The display panel according to claim 14, wherein in the at least one cross section perpendicular to the direction of the base substrate, the first functional area is formed a concave surface toward a direction close to the base substrate, the first sub-area is formed a concave surface toward the direction close to the base substrate, and the second sub-area is formed a convex surface in a direction away from the base substrate.

16. The display panel according to claim 14, wherein:

an intersection line of the first sub-area and the second sub-area is a first intersection line, and an intersection line of the first sub-area and the first functional area is a second intersection line; an intersecting line between the second sub-area and the first surface of the second dam portion is a third intersecting line, and an intersecting line between the first functional area and a surface of the first electrode facing away from the base substrate is a fourth intersecting line;

an intersection point of the first intersection line and an reference surface is a first intersection point, an intersection point of the second intersection line and the reference surface is a second intersection point, an intersection point of the third intersecting line and the reference surface is a third intersection point, an intersection point of the fourth intersecting line and the reference surface is a fourth intersection point, and the reference surface is a cross section parallel to the first direction and perpendicular to the base substrate;

in the reference surface, an intersection line between the first functional area and the reference surface is a curve connecting line between the second intersection point and the fourth intersection point; an intersection line between the first sub-area and the reference surface is a first arc line connecting the first intersection point and the second intersection point, an intersection line between the second sub-area and the reference surface is a second arc connecting the first intersection point and the third intersection point, and a curve line formed by the first arc line and the second arc line is an S-shaped curve line.

17. The display panel according to claim 16, wherein a straight line passing through the second intersection point and the third intersection point is a first reference line, a radius of curvature of the first sub-area is equal to a radius of curvature of the second sub-area, and the first intersection point is located on the first reference line.

18. The display panel according to claim 16, wherein a straight line passing through the second intersection point and the third intersection point is a first reference line, a radius of curvature of the first sub-area is smaller than a radius of curvature of the second sub-area, and the first intersection point is located on a side of the first reference line away from the base substrate.

19. The display panel according to claim 16, wherein a straight line passing through the second intersection point and the third intersection point is a first reference line, a radius of curvature of the first sub-area is greater than a radius of curvature of the second sub-area, and the first intersection point is located on a side of the first reference line close to the base substrate.

20. The display panel according to claim 1, further comprising a dimming layer disposed on a surface of a side of the encapsulation structure layer away from the base substrate, and a color filter layer and a color resistance layer disposed on a surface of a side of the dimming layer away from the base substrate, wherein the surface of the side of the encapsulation structure layer facing away from the base substrate is provided with a flat portion and a curved portion, the curved portion comprises at least a partial region protruding toward a direction away from the base substrate.

21. The display panel according to claim 20, wherein:

the color resistance layer comprises a plurality of first color resistance portions extending along the first direction, the plurality of the first color resistance portions are sequentially arranged in the second direction, the color resistance layer further comprises a plurality of groups of second color resistance portions, each group of the second color resistance portions comprises a plurality of the second color resistance portions which are located between two adjacent first color resistance portions respectively and are disposed at intervals along the first direction, and each of the second color resistance portions extends along the second direction; there is an overlapping portion between an orthographic projection of the curved portion on the base substrate and an orthographic projection of a second color resistance portion on the base substrate; and the second dam portion comprises a first side surface facing the pixel opening, the first side surface of the second dam portion comprises a first functional area and a second functional area sequentially disposed in a direction away from the base substrate, and there is an overlapping portion between an orthographic projection of the curved portion on the base substrate and an orthographic projection of the first functional area on the base substrate.

22. The display panel according to claim 21, wherein a cross section of a partial region of the curved portion protruding toward a direction away from the base substrate cut by a plane parallel to the first direction and perpendicular to the base substrate is at least one of:

being a partial region of a first ellipse, wherein a length of a short half axis of the first ellipse is $a1$, a length of a long half axis is $b1$, $a1=H1/2$, $b1=L4/2$;

being a partial region of a second ellipse, wherein a length of a short half axis of the second ellipse is $a2$, a length of a long half axis of the second ellipse is $b2$, $a2 \geq H2/2$, $b2=L4/2$; or locating between a surface of a side of the first ellipse away from the base substrate and a surface of a side of the second ellipse away from the base substrate;

wherein $H1$ is a thickness of the encapsulation structure layer at the flat portion; $H2$ is a maximum thickness of the encapsulation structure layer in a direction perpendicular to the base substrate; $L4$ is a width of the curved portion in the first direction.

23. The display panel according to claim 22, wherein in a cross section parallel to the first direction and perpendicular to the base substrate, an area $S$ of the cross section of the curved portion comprises an area $S0$ of a partial region protruding toward a direction away from the base substrate and an area $S1$ of a partial region not protruding toward the direction away from the base substrate, the cross section area $S$ of the curved portion and the area $S0$ of the partial region of the curved portion protruding toward the direction away from the base substrate meet: $S=S0+S1$, $\pi a1b1<S<\pi a2b2$, $\pi a1b1+S0<\pi a2b2$.

24. The display panel according to claim 22, wherein the curved portion comprises a first curved portion, a transition portion and a second curved portion connected in sequence in the first direction, the first curved portion and the second curved portion each includes at least a partial region protruding from the transition portion in the direction perpendicular to the base substrate, a surface of a side of the curved portion away from the base substrate is located between a surface of a side of the first ellipse away from the base substrate and a surface of a side of the second ellipse away from the base substrate.

25. The display panel according to claim 22, wherein the curved portion comprises a first ramp portion, a first curved portion, a transition portion, a second curved portion and a second ramp portion connected in sequence in the first direction, and the first curved portion and the second curved portion each protrudes from the transition portion in the direction perpendicular to the base substrate.

26. The display panel according to claim 25, wherein there is an overlapping area between an orthographic projection of the transition portion on the base substrate and an orthographic projection of the second color resistance portion on the base substrate.

27. The display panel according to claim 21, wherein a refractive index of the color filter layer is greater than a refractive index of the dimming layer.

28. The display panel according to claim 21, wherein a refractive index of the encapsulation structure layer is greater than a refractive index of the dimming layer, and a refractive index of the second color resistance portion is greater than the refractive index of the dimming layer.

29. The display panel according to claim 21, wherein an area of a surface of the dimming layer in contact with the encapsulation structure layer is greater than an area of a surface of the dimming layer in contact with the color filter layer and the color resistance layer.

30. The display panel according to claim 21, wherein the color filter layer comprises a plurality of filter units with different colors, the second color resistance portion is formed at an overlapping part of filter units of two adjacent sub-pixels of different colors in the first direction, and a slope angle of an interface of filter units of two adjacent sub-pixels of different colors in the first direction gradually becomes larger in a direction away from the base substrate.

31. The display panel according to claim 30, wherein the slope angle of the interface of the filter units of two sub-pixels of different colors adjacent in the first direction is between 10° and 75°.

32. The display panel according to claim 30, wherein the interface of the filter units of two sub-pixels of different colors adjacent in the first direction comprises a first interface and a second interface connected in sequence in a direction away from the base substrate, a slope angle of the first interface is between 28° and 32°, a slope angle of the second interface is between 55° and 65°, and the first interface and the second interface are curved surfaces or inclined surfaces.

33. The display panel according to claim 1, wherein the pixel driving circuit comprises a first transistor, a second transistor, a third transistor, a fourth transistor, and a storage capacitor, and the sub-pixel comprises a first gate line, a second gate line, and a third gate line, wherein:

a gate electrode of the first transistor is connected with the first gate line, a first electrode of the first transistor is connected with the data line, a second electrode of the first transistor is connected with a second electrode of the second transistor, a gate electrode of the third transistor and a first electrode plate of the storage capacitor, a gate electrode of the second transistor is connected with the second gate line, a first electrode of the second transistor is connected with a second initialization signal line, a second electrode of the third transistor is connected with a first power line, a second electrode plate of the storage capacitor is connected to a first electrode of the third transistor and a second electrode of the fourth transistor, a gate electrode of the fourth transistor is connected to the third gate line, a first electrode of the fourth transistor is connected to a first initialization signal line, and the second electrode of the fourth transistor is connected to a second power line; and an orthographic projection of the second electrode plate of the storage capacitor on the base substrate partially covers the orthographic projection of the first via hole on the base substrate, and the second electrode plate of the storage capacitor is connected to the first electrode through the first via hole.

34. A display apparatus, comprising the display panel according to claim 1.

* * * * *